(12) United States Patent
Bocian et al.

(10) Patent No.: US 7,452,572 B1
(45) Date of Patent: Nov. 18, 2008

(54) PROCEDURE FOR PREPARING REDOX-ACTIVE POLYMERS ON SURFACES

(75) Inventors: David F. Bocian, Riverside, CA (US); Zhiming Liu, Riverside, CA (US); Jonathan S. Lindsey, Raleigh, NC (US)

(73) Assignees: The North Carolina State University, Raleigh, NC (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 10/800,147

(22) Filed: Mar. 11, 2004

(51) Int. Cl.
*B05D 5/12* (2006.01)
*B05D 3/10* (2006.01)

(52) U.S. Cl. .................. 427/337; 427/74; 427/407.1; 427/419.8

(58) Field of Classification Search .................. None
See application file for complete search history.

(56) References Cited

U.S. PATENT DOCUMENTS

| | | | |
|---|---|---|---|
| 5,091,502 A | 2/1992 | Narang et al. |
| 5,252,730 A | 10/1993 | Mackey |
| 5,286,877 A | 2/1994 | Behling et al. |
| 5,312,896 A | 5/1994 | Bhardwaj et al. |
| 5,327,373 A | 7/1994 | Liu et al. |
| 5,352,764 A | 10/1994 | Mackey |
| 5,360,880 A | 11/1994 | Pashley et al. |
| 5,424,974 A | 6/1995 | Liu et al. |
| 6,107,480 A | 8/2000 | Funken et al. |
| 6,114,099 A | 9/2000 | Liu et al. |
| 6,208,553 B1 | 3/2001 | Gryko et al. |
| 6,212,093 B1 | 4/2001 | Lindsey |
| 6,235,895 B1 | 5/2001 | McEwan et al. |
| 6,272,038 B1 | 8/2001 | Clausen et al. |
| 6,324,091 B1 | 11/2001 | Gryko et al. |
| 6,381,169 B1 | 4/2002 | Bocian et al. |
| 6,407,330 B1 | 6/2002 | Lindsey et al. |
| 6,420,648 B1 | 7/2002 | Lindsey |

(Continued)

FOREIGN PATENT DOCUMENTS

WO    WO 01/03126 A2    1/2001

(Continued)

OTHER PUBLICATIONS

Cleland et al. (1995) *J. Chem. Soc. Faraday Trans.* 91: 4001-4003.

(Continued)

*Primary Examiner*—William P Fletcher, III
(74) *Attorney, Agent, or Firm*—Weaver Austin Villeneuve & Sampson LLP; Tom Hunter

(57) ABSTRACT

This invention provides novel methods for the formation of redox-active polymers attached to surfaces. In certain embodiments, the methods involve providing redox-active molecules bearing at least a first reactive site or group and a second reactive site or group; and contacting the surface with the redox-active molecules where the contacting is under conditions that result in attachment of said redox-active molecules to said surface via the first reactive site or group and attachment of redox-active molecules via the second reactive site or group, to the redox-active molecules attached to the surface thereby forming a polymer attached to said surface where the polymers comprise at least two of said redox-active molecules.

46 Claims, 31 Drawing Sheets

U.S. PATENT DOCUMENTS

| | | | |
|---|---|---|---|
| 6,429,310 | B2 | 8/2002 | Kobuke et al. |
| 6,451,942 | B1 | 9/2002 | Li et al. |
| 6,602,998 | B2 | 8/2003 | Kobuke et al. |
| 6,653,415 | B1 | 11/2003 | Böttcher |
| 6,657,884 | B2 | 12/2003 | Bocian et al. |
| 6,674,121 | B2 | 1/2004 | Misra et al. |
| 6,728,129 | B2 | 4/2004 | Lindsey et al. |
| 6,777,516 | B2 | 8/2004 | Li et al. |
| 7,005,237 | B2 * | 2/2006 | Lindsey ............ 430/311 |
| 7,166,327 | B2 * | 1/2007 | Afzali-Ardakani et al. .. 427/301 |
| 2002/0001973 | A1 | 1/2002 | Wu et al. |
| 2002/0105897 | A1 | 8/2002 | McCreery |
| 2004/0087177 | A1 | 5/2004 | Colburn |
| 2004/0244831 | A1 | 12/2004 | Lindsey |
| 2004/0253756 | A1 | 12/2004 | Cok et al. |
| 2005/0054215 | A1 | 3/2005 | Buriak et al. |
| 2007/0123618 | A1 | 5/2007 | Bocain et al. |

FOREIGN PATENT DOCUMENTS

| | | |
|---|---|---|
| WO | WO 2002/077633 | 10/2002 |
| WO | WO 2003/038886 | 5/2003 |
| WO | WO 2003/052835 | 6/2003 |
| WO | WO 2005/086826 | 9/2005 |
| WO | WO 2007/025114 | 3/2007 |

OTHER PUBLICATIONS

Buriak (1999) *Chem. Commun.* 1051-1060.
Linford et al. (1995) *J. Chem. Soc.* 117: 3145-315.
Hamers et al. (2000) *Acc. Chem. Res.* 33: 617-624.
Haber et al. (2000) *J. Phys. Chem. B*, 104: 9947-9950.
Roth et al. (2000) *J. Sci. Technol. B*, 18: 2359-2364.
Roth et al. (2003) *J. Chem. Soc.* 125: 505-517.
International Search Report and Written Opinion dated Nov. 10, 2005 issued in PCT/2005/07639 (WO2005086826).
Preliminary Examination dated May 30, 2006 issued in PCT/2005/07639 (WO2005086826).
Preliminary Examination and Written Opinion dated May 11, 2007 issued in PCT/2006/033195 (WO2007025114).
International Search Report and Written Opinion dated May 11, 2007 issued in PCT/2006/033195 (WO2007025114).
Balakumar et al. (2004), Diverse Redoc-Active Molecules Bearing O-, S-, or Se- Terminated Tethers for Attachment to Silicon in Studies of Molecules Information Storage, *J. Org. Chem.* 69:1435-1443.
Battioni et al. (1991), Preparation of Functionalized Polyhalogenated Tetraaryl-porphyrins by Selective Substitution of the p-Fluorine of mesoTetra-(pentafluorophenyl) porphyrins, *Tetrahedron Lett.* 32:2893-2896.
Carcel et al. (2004), Porphyrin Architectures Tailored for Studies of Molecules Information Storage, *J, Org. Chem.* 69:6739-6750.
Clausen et al, (2000), Synthesis of Thiol-Derivatized Porphyrin Dimers and Trimers for Studies of Architectural Effects on Multibit Information Storage, *J. Org. Chem.* 65:7363-7370.
Fan et al. (2005), 1,9-Bis (N,N-dimethylaminomethyl) dipyrromethanes in the synthesis of porphyrins bearing one or two *meso* substituents, *Tetrahedron* 61:10291-10302.
Geier et al. (2001), A survey of acid catalysts in dipyrromethanecarbinol condensations leading to *meso* -substituted porphyrins, *J. Porphyrins Phthalocyanines* 5:810-823.
Kuhr et al. (2004), Molecular Memories Based on a CMOS Platform, *Mater.Res. Soc. Bull.*, pp. 838-842.
Littler et al. (1999), Investigation of Conditions Giving Minimal Scramlbling in the Synthesis of trans-Porphyrins from Dipyrromethanes and Aldehydes, *J. Org. Chem.* 64:2864-2872.
Liu et al. (2004), Synthesis of Porphyrins Bearing hydrocarbon Tethers and Facile Colvalent Attachment to Si(100), *J. Org. Chem.* 69:5568-5577.
Loewe et al. (2004), Porphyrins Bearing Mono or Tripodal Benzylphosphonic Acid Tethers for Attachment to Oxide Surfaces, *J. Org. Chem.* 69:1453-1460.
Lysenko et al. (2005), Multistate molecular information storage using S-acetylthio-derivatized dyads of triple-decker sandwich coordination compounds, *J. Porphyrins Phthalocyanines* 9:491-508.
Muthukumaran et al. (2004), Porphyrins Bearing Arylphosphonic Acid Tethers for Attachment to Oxide Surfaces, *J. Org. Chem.* 69:1444-1452.
Padmaja et al. (2005), A Compact All-Carbon Tripodal Tether Affords High Coverage of Porphyrins on Silicon Surfaces, *J. Org. Chem.* 70:7972-7978.
Rao et al. (2000), Rational Syntheses of Porphyrins Bearing up to Four Different Meso Substituents, *J. Org. Chem.* 65:7323-7344.
Thamyongkit et al. (2006), *J. Org. Chem.* 71:903-910.
Wei et al. (2004), Alkylthio Unit as an α-Pyrrole Protecting Group for Use in Dipyrromethane Synthesis, *J. Org. Chem.* 69:1361-1469.
Wei et al. (2005), Structural and Electron-Transfer Characteristics of Carbon-Tethered Porphyrin Monolayers in Si(100), *J. Phys. Chem. B* 109:6323-6330.

* cited by examiner

184

192

196

197

199

200

201

202

204

205

206

207

209

216

217

218

219

US 7,452,572 B1

PROCEDURE FOR PREPARING REDOX-ACTIVE POLYMERS ON SURFACES

STATEMENT AS TO RIGHTS TO INVENTIONS MADE UNDER FEDERALLY SPONSORED RESEARCH AND DEVELOPMENT

This invention was made with Government support under Grant No: MDA972-01-C-072, awarded by the Army. The Government of the United States of America has certain rights in this invention.

CROSS-REFERENCE TO RELATED APPLICATIONS

[Not Applicable]

FIELD OF THE INVENTION

This invention pertains to the field of molecular electronics. In particular, this invention pertains to improved methods to attach and polymerize redox-active molecules on surfaces.

BACKGROUND OF THE INVENTION

There has been considerable interest in the development of hybrid electronics devices and chips that utilize one or more organic molecules to store or manipulate information in discrete oxidation states of the molecule(s) (see, e.g., U.S. Pat. Nos. 6,208,553, 6,212,093, 6,272,038, 6,324,091, 6,381,169, and 6,451,942, and PCT Publication WO 01/03126, etc.).

In certain embodiments, an electroactive (redox-active) molecule such as a porphyrin and/or metallocene is covalently attached (directly or through a linker) to a conductive surface such as gold or silicon. The electroactive molecule(s) can be oxidized, e.g., to a cationic state upon application of an applied potential. When the potential is removed, the molecules store charge for extended periods. This forms the basis of the memory storage device.

General challenges in fabricating a hybrid chip containing molecular materials for information storage include, but are not limited to the efficient and effective attachment (electrical coupling) of the charge-storage molecule to an electroactive surface, controlling placement of the charge storage molecule(s) and/or associated electrolyte(s), and controlled deposition/location nof counterelectrodes. Particularly pressing problems are that often the methods for attachment of molecules to surfaces often require very high concentrations, high temperature, and/or the use of reactive intermediates (see, e.g. Cleland et al. (1995) *J. Chem. Soc. Faraday Trans.* 91: 4001-4003; Buriak (1999) *Chem. Commun.* 1051-1060; Linford et al. (1995) *J. Am. Chem. Soc.* 117: 3145-3155; Hamers et al. (2000) *Acc. Chem. Res.* 33: 617-624; Haber et al. (2000) *J. Phys. Chem. B,* 104: 9947-9950). Such conditions are readily applicable to small robust molecules but become less satisfactory and often fail altogether as the molecules become larger and/or more elaborate.

Another problem is associated with increased miniaturization of the electroactive memory elements. As the feature size of a memory cell shrinks to nanoscale dimensions, fewer and fewer molecules occupy the cell feature. Consequently, it becomes increasingly difficult to detect the stored charge.

SUMMARY OF THE INVENTION

This invention pertains to the discovery that one solution to this problem of small feature size in molecular memory and related applications, is to stack information storage molecules (e.g. redox-active molecules) in the Z-dimension (the direction perpendicular to the substrate surface. We have found that porphyrinic macrocycles and other redox-active molecules can be made to polymerize under the conditions that we typically employ for forming monolayers on silicon, and other, surfaces. Moreover it was a surprising discovery that the redox-active polymers are electrochemically robust (capable of many read/write cycles) and exhibit charge-retention times that are comparable (or longer) than those of monolayers of the same molecules.

Thus, in one embodiment, this invention provides methods of patterning redox-active polymers on a surface to form surface-bound redox-active polymers. The method typically involves providing redox-active molecules bearing at least a first reactive site or group and a second reactive site or group; and contacting the surface with the redox-active molecules where the contacting is under conditions that result in attachment of the redox-active molecules to the surface via the first reactive site or group and attachment of redox-active molecules via the second reactive site or group, to each other thereby forming polymers attached to the surface where the polymers comprise at least two, preferably at least three or four, more preferably at least five or six, and most preferably at least eight, ten, or twelve, of the redox-active molecules. The first reactive site or group and the second reactive site or group can be the same species or they can be different species. In certain embodiments, the first reactive site or group and/or the second reactive site or group is an ethynyl group (e.g., ethynyl, 4-ethynylphenyl, 3-ethynylphenyl, 4-ethynylbiphenyl, 3-ethynylphenyl, 4-ethynylterphenyl, and 3-ethynylterphenyl, and the like). Suitable redox-active molecules include, but are not limited to a porphyrinic macrocycle, a porphyrin, a sandwich coordination compound of porphyrinic macrocycles, and a metallocene. In certain embodiments, the redox-active molecule is selected from the group consisting of a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. In certain embodiments, the redox-active molecule is a porphyrin comprising a substituent selected from the group consisting of: aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl, more preferably a substituent selected from the group consisting of: 4-methylphenyl, 4-t-butylphenyl, 4-trifluoromethylphenyl, pentyl, and H (no substituent). In certain embodiments, the redox-active molecule is a phthalocyanine comprising a substituent selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl, more preferably a substituent selected from the group consisting of methyl, t-butyl, butoxy, fluoro, and H (no substituent). In certain embodiments, the redox-active molecule is a molecule found in FIG. 4 or FIGS. 8A-8Q.

In certain embodiments, the contacting involves contacting the surface with a linker having the formula $Y^1-L^1-Z^1$, where $Z^1$ is a surface attachment group; $L^1$ is a covalent bond or a linker; and $Y^1$ is a protected or unprotected reactive site or group; whereby the linker attaches to the surface; and contacting the attached linker with the redox-active molecules whereby the redox-active molecules couple to each other via the first and/or the second reactive site or group and the redox-active molecules couple to the linker through $Y^1$ and the first and/or the second reactive site or group thereby forming a polymer attached to the linker where the polymer comprises at least two of the redox-active molecules. In various $Z^1$ is a protected or unprotected reactive site or group selected from the group consisting of a carboxylic acid, an alcohol, a thiol, a selenol, a tellurol, a phosphonic acid, a phosphonothioate, an amine, a nitrile, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl, bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, and 2-bromoethyl. In various embodiments —$L^1$—$Z^1$— is selected from the group consisting of 4-carboxyphenyl, carboxymethyl, 2-carboxyethyl, 3-carboxypropyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl)phenyl; 4-hydroxyphenyl, hydroxymethyl, 2-hydroxyethyl, 3-hydroxypropyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl; 4-mercaptophenyl, mercaptomethyl, 2-mercaptoethyl, 3-mercaptopropyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl; 4-selenylphenyl, selenylmethyl, 2-selenylethyl, 3-selenylpropyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl)phenyl; 4-tellurylphenyl, tellurylmethyl, 2-tellurylethyl, 3-tellurylpropyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl; 4-(dihydroxyphosphoryl)phenyl, (dihydroxyphosphoryl)methyl, 2-(dihydroxyphosphoryl)ethyl, 3-(dihydroxyphosphoryl)propyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, (hydroxy(mercapto)phosphoryl)methyl, 2-(hydroxy(mercapto)phosphoryl)ethyl, 3-(hydroxy(mercapto)phosphoryl)propyl, 2-[4-(hydroxy(mercapto)phosphoryl)phenyl]ethynyl, 4-[2-[4-(hydroxy(mercapto)phosphoryl)phenyl]ethynyl]phenyl, 4-[(hydroxy(mercapto)phosphoryl)methyl]phenyl, 4-[2-(hydroxy(mercapto)phosphoryl)ethyl]phenyl, 4-[2-[4-(hydroxy(mercapto)phosphoryl)methylphenyl]ethynyl]phenyl; 4-cyanophenyl, cyanomethyl, 2-cyanoethyl, 3-cyanopropyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl]phenyl; 4-cyanobiphenyl, 4-aminophenyl, aminomethyl, 2-aminoethyl, 3-aminopropyl, 2-(4-aminophenyl)ethynyl, 4-[2-(4-aminophenyl)ethynyl]phenyl, and 4-aminobiphenyl. In various embodiments $L^1$ is selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4"-terphenyl. In certain embodiments, the method further comprises attaching a counterelectrode to the polymer(s) (e.g., directly or through a linker). In certain embodiments, the redox-active molecules can further comprise redox-active molecules having only one available reactive group or site which can therefore act as a capping reagent. The redox-active molecules having only one available reactive group or site can have just a single available reactive group or site and/or they can have a second reactive group or site that is blocked. In certain embodiments, the surface comprises a material selected from the group consisting of a Group III element, a Group IV element, a Group V element, a doped Group III element, a doped Group IV element, a doped Group V element, a transition metal, a transition metal oxide, and/or a transition metal nitride. The surface can comprise a hydrogen passivated surface.

In another embodiment, this invention provides a method of patterning redox-active polymers on a surface to form surface-bound redox-active polymers. The method typically involves providing a surface having attached thereto a linker bearing a reactive site or group and/or a redox-active molecule bearing a reactive site or group; providing redox-active molecules bearing at least a first reactive site or group and a second reactive site or group; and contacting the surface with the redox-active molecules where the contacting is under conditions that result in the attachment of the redox-active molecules to the linker and/or to the redox-active molecule attached to the surface and the polymerization of the redox-active molecules thereby forming polymers attached to the surface where the polymers comprise at least two, preferably at least three or four, more preferably at least five or six, and most preferably at least eight, ten, or twelve, of the redox-active molecules. The first reactive site or group and the second reactive site or group can be the same species or they can be different species. In certain embodiments, the first reactive site or group and/or the second reactive site or group is an ethynyl group (e.g., ethynyl, 4-ethynylphenyl, 3-ethynylphenyl, 4-ethynylbiphenyl, 3-ethynylphenyl, 4-ethynylterphenyl, and 3-ethynylterphenyl, and the like). Suitable redox-active molecules, include, but are not limited to the redox-active molecules described above and listed in FIG. 4 and/or FIGS. 8A-8Q. In certain embodiments, the providing comprises providing a surface having attached thereto a linker whereby the surface and linker have the formula S—$Z^1$—$L^1$—$Y^1$, where S is the surface; $Z^1$ is a surface attachment group; $L^1$ is a covalent bond or a linker; and $Y^1$ is a protected or unprotected reactive site or group. In certain embodiments, $Y^1$ is a protected reactive site our group and the method further comprises deprotecting $Y^1$. In various embodiments $Z^1$, before coupling to the surface and/or $Z^1$—$L^1$, and/or $L^1$ include, but are not limited to the $Z^1$ and/or the $Z^1$—$L^1$, and/or the $L^1$ described above. In certain embodiments, the method further comprises attaching a counterelectrode to the polymer(s) (e.g., directly or through a linker). In certain embodiments, the redox-active molecules can further comprise redox-active molecules having only one available reactive group or site which can therefore act as a capping reagent. The redox-active molecules having only one available reactive group or site can have just a single available reactive group or site and/or they can have a second reactive group or site that is blocked. In certain embodiments, the surface comprises a material selected from the group of surface materials identified above. The surface can comprise a hydrogen passivated surface.

In another embodiment, this invention provides an electroactive substrate comprising a first zone wherein the first zone comprises a surface with an attached redox-active moiety according to the formula: $M_n$—L—Z—S, where S is a substrate; Z is a surface attachment group; L is a linker or covalent bond; M is a redox-active molecule; and n is at least 3, preferably at least 4, 5, or 6, more preferably 7, 8, or 9, and most preferably at least 10, 12, 15, 20, or 30. In certain embodiments, the redox-active molecules are attached to each other through an ethynyl group (e.g., ethynyl, 4-ethynylphenyl, 3-ethynylphenyl, 4-ethynylbiphenyl, 3-ethynylphenyl, 4-ethynylterphenyl, 3-ethynylterphenyl, etc.). Suitable redox-active molecules, include, but are not limited to the redox-active molecules described above and listed in FIG. 4 and/or FIGS. 8A-8Q. In certain embodiments, the substrate comprises a surface with an attached redox-active moiety according to the formula: S—Z—L—$M_n$—Y—E, where Y is a linker or a reactive site or group; and E is a counterelectrode. In various embodiments Z, Z-L, and L include, but are not limited to the moieties identified above for $Z^1$, $Z^1$—$L^1$, and/or $L^1$. In certain embodiments, the electroactive substrate further comprises a second zone wherein the second zone comprises a surface with an attached redox-active moiety wherein the redox-active moiety is different than M. In certain embodiments, the first zone is a redox-active storage cell.

This invention also provides a redox-active storage cell comprising a surface with an attached redox-active moiety according to the formula: E—Y—$M_n$—L—Z—S where S is a substrate; Z is a surface attachment group; L is a linker linkers or covalent bond; M is a redox-active molecule; Y is a reactive site or group or a linker; E is a counter-electrode; and n is at least three or four, more preferably at least five or six, and most preferably at least eight, ten, or twelve. In certain embodiments, the redox-active molecules are attached to each other through an ethynyl group (e.g., ethynyl, 4-ethynylphenyl, 3-ethynylphenyl, 4-ethynylbiphenyl, 3-ethynylphenyl, 4-ethynylterphenyl, 3-ethynylterphenyl, etc.). Suitable redox-active molecules, include, but are not limited to the redox-active molecules described above and listed in FIG. 4 and/or FIGS. 8A-8Q. In various embodiments Z, Z—L, and L include, but are not limited to the moieties identified above for $Z^1$, $Z^1$—$L^1$, and/or $L^1$. In certain embodiments, a conductive material and/or a semiconductive material. The storage cell can, optionally be encapsulated.

Also provided is a method of storing data. The method typically involves providing an apparatus comprising one or more storage cells, e.g. as described above, and applying a voltage to the counter-electrode at sufficient current to set an oxidation state of $M_n$. In various embodiments the voltage ranges up to about 2 volts. The voltage can optionally be output of an integrated circuit (e.g., a logic gate). In certain embodiments, the method can further involve detecting the oxidation state of $M_n$ and thereby reading out the data stored therein. The detecting can, optionally, involve refreshing the oxidation state of $M_n$. In certain embodiments, the detecting comprises analyzing a readout signal in the time domain and/or frequency domain (e.g. by performing a Fourier transform on the readout signal). In certain embodiments, the detecting utilizes a voltammetric method (e.g., impedance spectroscopy, cyclic voltammetry, etc.). In certain embodiments, the detecting comprises exposing the storage medium to an electric field to produce an electric field oscillation having characteristic frequency and detecting the characteristic frequency. In certain embodiments, $M_n$ has at least eight different and distinguishable oxidation states.

Also provided is a computer system comprising a memory device where the memory device comprises a storage cell as described herein.

In certain embodiments, this invention provides a computer system comprising a central processing unit, a display, a selector device, and a memory device, where the memory device comprises a storage cell as described herein.

In certain embodiments, the redox-active polymers formed by the methods of this invention are not "sandwich coordination compounds".

DEFINITIONS

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}(aq) \rightarrow Fe^{3+}(aq)+e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The terms "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g., 0° C. to about 40° C.).

The term "tightly coupled" when used in reference to a subunit of a multi-subunit (e.g., polymeric) storage molecule of this invention refers to positioning of the subunits relative to each other such that oxidation of one subunit alters the oxidation potential(s) of the other subunit. In a preferred embodiment the alteration is sufficient such that the (non-neutral) oxidation state(s) of the second subunit are different and distinguishable from the non-neutral oxidation states of the first subunit. In a preferred embodiment the tight coupling is achieved by a covalent bond (e.g., single, double, triple, etc.). However, in certain embodiments, the tight coupling can be through a linker, via an ionic interaction, via a hydrophobic interaction, through coordination of a metal, or by simple mechanical juxtaposition. It is understood that the subunits could be so tightly coupled that the redox processes are those of a single supermolecule.

The term "electrode" refers to any medium capable of transporting charge (e.g., electrons) to and/or from a storage molecule. Preferred electrodes are metals or conductive organic molecules. The electrodes can be manufactured to virtually any 2-dimensional or 3-dimensional shape (e.g., discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g., a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g., a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g., via a linker), direct or indirect ionic bonding between the storage medium/molecule and the electrode, or other bonding (e.g., hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The terms "redox-active unit" or "redox-active subunit" refer to a molecule or component of a molecule that is capable of being oxidized or reduced by the application of a suitable voltage.

The term "redox-active" molecule refers to a molecule or component of a molecule that is capable of being oxidized or reduced by the application of a suitable voltage.

The term "subunit", as used herein, refers to a redox-active component of a molecule.

The term "electrochemical cell" typically refers to a reference electrode, a working electrode, a redox-active molecule (e.g., a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g., a working electrode and a reference electrode). The storage cells can be individually addressed (e.g., a unique electrode is associated with each memory element) or, particularly where the oxidation states of different memory elements are distinguishable, multiple memory elements can be addressed by a single electrode. The memory element can optionally include a dielectric (e.g., a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

"Addressing" a particular element refers to associating (e.g., electrically coupling) that memory element with an electrode such that the electrode can be used to specifically determine the oxidation state(s) of that memory element.

The terms "read" or "interrogate" refer to the determination of the oxidation state(s) of one or more molecules (e.g., molecules comprising a storage medium).

The phrase "output of an integrated circuit" refers to a voltage or signal produced by a one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential field ("voltage").

A "potentiometric device" is a device capable of measuring the potential across an interface that results from a difference in the equilibrium concentrations of redox molecules in an electrochemical cell.

A "coulometric device" is a device capable of the net charge produced during the application of a potential field ("voltage") to an electrochemical cell.

An "impedance spectrometer" is a device capable of determining the overall impedance of an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g., phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

The terms "sandwich coordination compound" or "sandwich coordination complex" refer to a compound of the formula $L^nM^{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442). Sandwich coordination complexes include, but are not limited to "double-decker sandwich coordination compound" and "triple-decker sandwich coordination compounds". The synthesis and use of sandwich coordination compounds is described in detail in U.S. Pat. No. 6,212,093B1.

The term "double-decker sandwich coordination compound" refers to a sandwich coordination compound as described above where n is 2, thus having the formula $L^1$—$M^1$—$L^1$, wherein each of $L^1$ and L may be the same or different (see, e.g., Jiang et al. (1999) J. Porphyrins Phthalocyanines 3: 322-328).

The term "triple-decker sandwich coordination compound" refers to a sandwich coordination compound as described above where n is 3, thus having the formula $L^1$—$M^1$—$L^2$—$M^2$—$L^3$, wherein each of $L^1$, $L^2$ and $L^3$ may be the same or different, and $M^1$ and $M^2$ may be the same or different (see, e.g., Arnold et al. (1999) Chemistry Letters 483-484).

A "linker" is a molecule used to couple two different molecules, two subunits of a molecule, or a molecule to a substrate.

A "substrate" is a, preferably solid, material suitable for the attachment of one or more molecules. Substrates can be formed of materials including, but not limited to glass, plastic, silicon, germanium, minerals (e.g., quartz), semiconducting materials (e.g., doped silicon, doped germanium, etc.), ceramics, metals, etc.

In preferred embodiments, when a metal is designated by "M" or "$M^n$", where n is an integer, it is recognized that the metal may be associated with a counterion.

A "group II, III, IV, V, or VI element or material" includes the pure element, a doped variant of the group II, III, IV, V, or VI element and/or an oxidized variant of the group II, III, IV, V or VI element.

The term "heat-resistant organic molecule" or "heat-stable organic molecule" refers to organic molecules (e.g., porphyrins) that are stable (e.g., show no decomposition, or substantially no decomposition) at temperatures of 200° C. to 400° C., preferably at 400° C. for at least 30 seconds, preferably for at least one minute, more preferably for at least 2 to 5 minutes.

A "group III, IV, or V substrate" is a material comprising a Group III, IV, or V element.

The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, and/or oxides, and/or nitrides, and/or alloys, and/or mixtures thereof.

A "solution comprising a heat-resistant organic molecule" or a "solution comprising a redox-active molecule) is not limited to a true solution, but also includes suspensions, dispersions, and emulsions thereof. In addition, the solution contemplates pastes, gels, aerogels, and essentially any medium suitable for "containing" the heat-resistant organic molecule(s).

A "molecule bearing an attachment group" includes molecules where the attachment group is an intrinsic component of the molecule, molecules derivatized to add an attachment group, and molecules derivatized so they bear a linker comprising an attachment group.

BRIEF DESCRIPTION OF THE DRAWINGS

FIG. 7B illustrates the memory devices of this invention integrated into a standard computer architecture or computer system 200.

DETAILED DESCRIPTION

Figure 1:
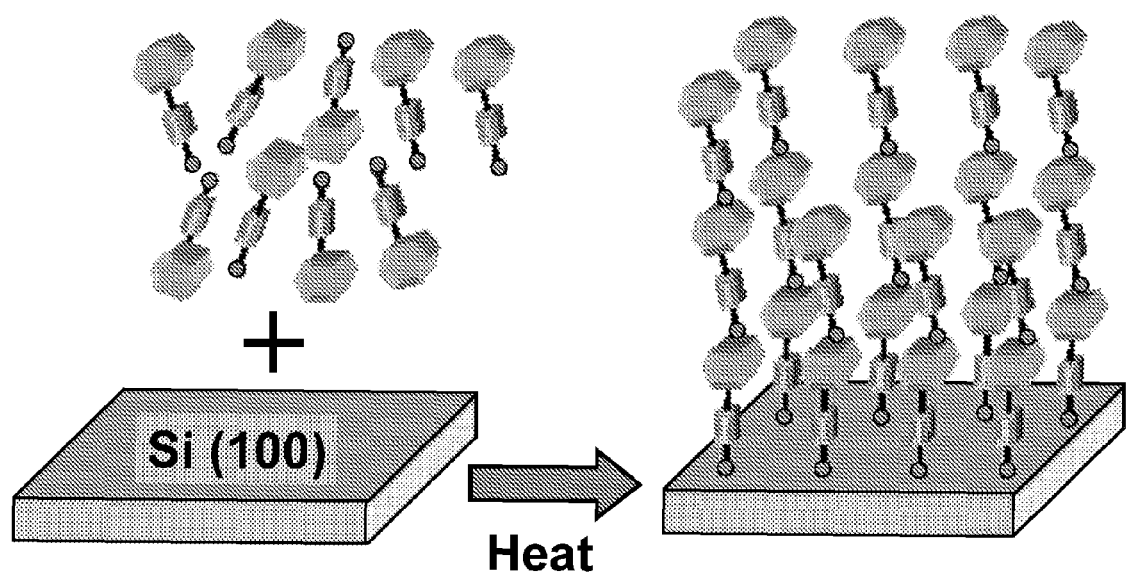
FIG. 1 schematically illustrates the attachment and polymerization of redox-active molecules to form redox-active polymers attached to a substrate.

As the size of features comprising, e.g. integrated circuits, memory cells, and the like, shrink to nanoscale dimensions, fewer and fewer molecules will be available to form elements of those features. Consequently, as molecular electronics devices are miniaturized, fewer molecules are available to store charge (e.g. bit states) and it becomes increasingly difficult to detect the stored charge.

This invention pertains to the discovery that one solution to this problem is to stack information storage molecules (e.g., redox-active molecules) in the Z-dimension (the direction perpendicular to the substrate surface). We have found that porphyrinic macrocycles and other redox-active molecules can be made to polymerize under the conditions that we typically employ for forming monolayers on silicon, and other surfaces (see, e.g., copending application U.S. Ser. No. 10/742,596, filed on Dec. 19, 2003). Moreover it was a surprising discovery that the redox-active polymers are electrochemically robust (capable of many read/write cycles) and exhibit charge-retention times that are comparable (or longer) than those of monolayers of the same molecules.

I. Formation of Redox-Active Polymers on Surfaces.

A) "One-Step" Polymerization and Attachment.

In certain embodiments, the polymerization of redox-active molecules to form polymers and their attachment to a surface is performed in a "single step" polymerization. In this approach, redox-active molecules are provided that bear two available reactive sites or groups (the same or different). The molecules (provided dry or in a solvent) are contacted to each other and to the substrate surface at an elevated temperature (e.g. at least about 200° C., preferably at least about 300° C., and more preferably at least about 400° C.) whereby the reactive sites or groups react with each other and/or the substrate or a site or reactive group on the substrate resulting in attachment of the molecules to each other (thereby forming polymers) and to the substrate (see, e.g., FIG. 1).

In various embodiments, the redox-active molecules are preferably heat-resistant molecules and can be provided as a single molecular species or as mixtures of different species of molecules.

In various embodiments, the molecules can be heated and contacted to the surface, and/or the surface can be heated, and/or both the molecule(s) and the surface can be heated. In addition the surface and/or the molecule(s) can be heated prior to contacting each other and/or while they are in contact.

In certain embodiments, the redox-active molecules are dissolved in an organic solvent (e.g., THF, mesitylene, durene, o-dichlorobenzene, 1,2,4-trichlorobenzene, 1-chloronaphthalene, 2-chloronaphthalene, N,N-dimethylformamide, N,N-dimethylacetamide, N,N-dimethylpropionamide, benzonitrile, anisole, and the like). The solvent containing the molecule can then be applied to the surface. Heating can be accomplished by any of a variety of conventional methods. For example, the solvent can be heated before application to the surface. In certain embodiments, both the solvent and the surface can be heated before the solvent is applied to the surface. In certain preferred embodiments, the surface is heated after application of the solvent. This is conveniently accomplished by baking the surface (e.g., in an oven). In certain preferred embodiments, the surface is heated (e.g., baked) under an inert atmosphere (e.g., argon or other inert gas(es)).

In certain embodiments, particularly where large size wafers (e.g. over 12 inches in diameter) are used for manufacture, solvent-free methods of the present invention can be utilized. In the solvent-free methods, layers of redox-active polymers (e.g., porphyrin polymers, phthalocyanine polymers, etc.) are formed on desired surface (e.g., silicon, silicon dioxide, metals, metal oxides metal nitrides, etc.) without the use of any solvents. In other words, the attachment can be performed in a completely dry environment. In various embodiments, this process converts the solid phase molecules to the gas phase by heating them at appropriate temperatures and then transporting the gas phase molecules to the desired surface. This process also enables separate control of the molecule and substrate temperature which can assist in achieving maximum attachment density. This process can be easily applied in production since similar techniques (e.g. CVD and MBE) are already in use for depositing materials in the semiconductor industry.

In one approach, the redox-active molecules are deposited in a chamber containing the substrate (e.g. a Group III, IV, or V element, a transition metal, a transition metal oxide or nitride, etc.). The solvent is evaporated away leaving only the redox-active molecules. The chamber is then heated volatilizing the molecules which then contact and couple to the substrate surface and to each other thereby forming attached polymers.

In another approach the redox-active molecules are placed in the chamber as a dry powder. Again the chamber is heated volatilizing the molecules which then contact and couple to the substrate surface and to each other.

In certain embodiments, the molecules to be coupled to the surface are deposited directly on the surface (e.g. in a dry form or in a solvent which is then evaporated away). The molecule and/or surface is then heated (e.g. to 200° C. or more) and the molecules couple to the surface (e.g. via an ionic, more preferably via a covalent bond) and also form covalent bonds with each other thereby forming a polymer.

Various parameters can be optimized for the polymerization and attachment of any particular organic molecule. These include (1) the concentration of the molecule(s), (2) the baking time, and (3) the baking temperature; and 4) the reactive sites or groups. After the molecules of interest are polymerized and attached to the surface, cyclic voltammetry can be performed to evaluate the resulting attached polymers. The characteristic features of the voltammograms can indicate the efficacy of attachment and the electrochemical behavior of the polymers (see, e.g., Li et al. (2002 $Appl.$ $Phys.$ $Lett.$ 81: 1494-1496; Roth et al. (2003) $J.$ $Am.$ $Chem.$ $Soc.$ 125: 505-517).

In addition, it was a surprising discovery that baking times as short as a few minutes (e.g., typically from about 1 sec to about 1 hr, preferably from about 10 sec to about 30 min, more preferably from about 1 minute to about 5, 10, or 15 minutes, and most preferably from about 30 sec to about 1 or 2 minutes) afford high surface coverage. In addition, short times minimize the amount of energy that is used in the processing step.

It was also a surprising discovery that baking temperatures as high as 400° C. can be used with no degradation of the molecules. This result is of importance in that many processing steps in fabricating CMOS devices entail high temperature processing. In certain embodiments, preferred baking temperatures range from about 125° C. to about 400° C., preferably from about 200° C. to about 400° C., more preferably from about 250° C. to about 400° C., and most preferably from about 300° C. to about 400° C.

A wide variety of reactive sites or groups can be used to polymerize the redox-active molecules and to achieve surface attachments. Such groups include, but are not limited to ethynyl, ethyl, iodo plus ethynyl, bromo plus ethynyl, amine plus aldehyde, amine plus isocyanate, amine plus isothiocyanate, aldehyde plus acetyl, and the like. In certain preferred embodiments, the reactive site or group is an ethynyl (e.g., ethynyl, 4-ethynylphenyl, 3-ethynylphenyl, 4-ethynylbiphenyl, 3-ethynylphenyl, 4-ethynylterphenyl, 3-ethynylterphenyl, etc.).

It will be noted that in certain embodiments, a substrate can be provided derivatized with a reactive site or group or with a linker bearing a reactive site or group that is different than the reactive site or group(s) available on the redox-active molecules. In such instances the substrate attachment chemistry will differ from the polymerization chemistry.

In this context it is noted that diverse functional groups are suitable for use in attachment to silicon or other substrates (e.g. Group III, IV, or V elements, transition metals, transition metal oxides or nitrides, transition metal alloys, etc.). Such groups include, but are not limited to, alcohol, thiol, S-acetylthiol, bromomethyl, allyl, iodoaryl, carboxaldehyde, ethyne, vinyl, hydroxymethyl. It is also noted that such groups such as ethyl, methyl, or arene afforded essentially no attachment as demonstrated by the failure to achieve substantial attachment with the zinc chelates of octaethylporphyrin, meso-tetraphenylporphyrin, meso-tetra-p-tolylporphyrin, and meso-tetramesitylporphyrin.

The successful attachment via S-acetylthiol, bromomethyl, iodoaryl, and ethyne is unprecedented. The successful attachment via the iodoaryl group is extraordinarily valuable in affording a direct aryl-Si attachment. The resulting information-storage molecules can be positioned vertically from the surface, which facilitates subsequent patterning. The ability to attach via such diverse functional groups provides great versatility.

While in certain embodiments, heating is accomplished by placing the substrate in an oven, essentially any convenient heating method can be utilized, and appropriate heating and contacting methods can be optimized for particular (e.g., industrial) production contexts. Thus, for example, in certain embodiments, heating can be accomplished by dipping the surface in a hot solution containing the redox-active molecules that are to be attached and polymerized. Local heating/patterning can be accomplished using for example a hot contact printer, or a laser. Heating can also be accomplished using forced air, a convection oven, radiant heating, and the like. The foregoing embodiments are intended to be illustrative rather than limiting.

B) "Multi-Step" Polymerization and Attachment.

In certain embodiments, this invention contemplates the use of "multi-step" attachment and polymerization methods whereby the attachment to the surface and/or the polymerization of the redox-active molecules is achieved in a "stepwise" manner. One such approach, proceeds as outlined in FIG. 1. One such approach proceeds is illustrated in FIG. 2. First, a linker $L^1$ bearing a surface attachment group $Z^1$ and reactive functional site or group $Y^1$ is exposed under appropriate conditions to the surface (e.g., electrode), whereupon binding occurs. The linker can be a linear structure with a single binding site or a multi-legged linker with multiple binding sites for attachment to the surface. In certain embodiments, the linker can itself constitute a charge-storage molecule. Then, a redox-active molecule (e.g., charge-storage molecule) (M) bearing a functional group $X^1$ complementary to that of $Y^1$ (but not to $Y^2$) is added and polymerization is performed, giving binding of $X^1$ and $Y^1$ and yielding a polymeric array of charge-storage molecules. A counterelectrode can then, optionally, be attached to the polymeric array. One advantage of this approach is that the linker can be attached to a surface to which the reactive groups for polymerization might not attach.

Figure 3:
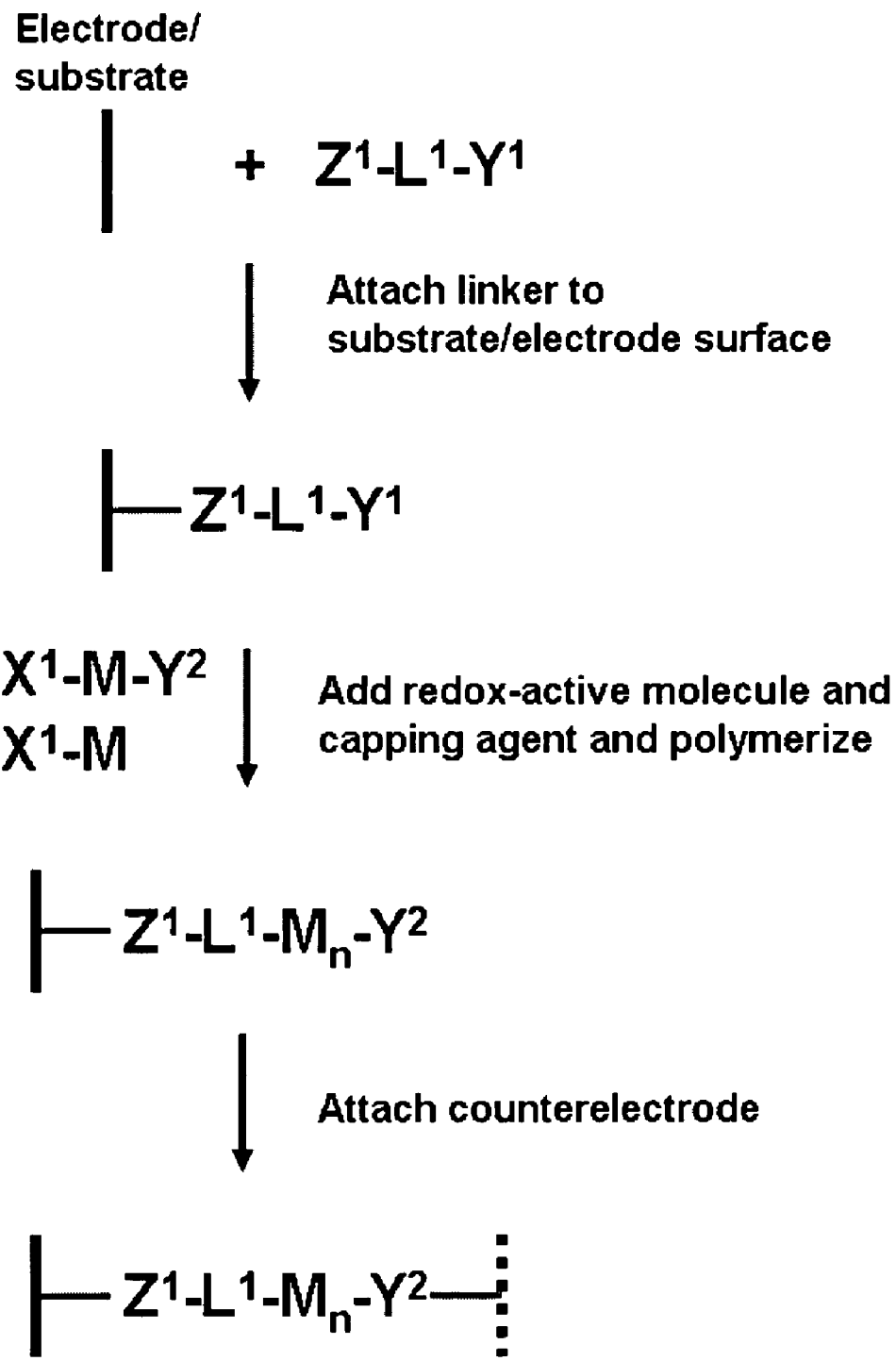
FIG. 3 illustrates a "multi-step" method of polymerization and attachment of redox-active molecules to a substrate utilizing a capping agent.

Another variant of this approach is shown in FIG. 3. In this approach, the polymerization is done in the presence of a redox-active molecule having only one available reactive site or group. This can be accomplished by providing a mono-derivatized redox-active molecule and/or by providing a redox-active molecule having multiple reactive sites or groups all except one of which are blocked, and/or by providing a redox-active molecule having multiple reactive sites or groups all of which are blocked and selectively deblocking a single reactive site or group. The redox-active molecule having one available reactive site or group functions as a capping agent, causing termination of the polymerization process. Additional examples of this approach include use of capping agents that also have functional groups onto which electrode deposition can be performed.

In certain embodiments, such stepwise methods can also be performed by providing a substrate (e.g. a chip comprising one or more electrodes) already derivatized with a reactive site or group and/or derivatized with a linker bearing a reactive site or group and then simply performing the polymerization reaction, e.g., as described above.

These embodiments, are intended to be illustrative and not limiting. Using the teaching provided herein, other attachment/polymerization schemes can be devised.

C) Varying Polymer Formation and Design.

Variations in the molecular design of the attached polymers can be achieved by a number of methods. Such methods include, for example altering the pattern of substituents about the porphryinic macrocycle. Two ethynes can be located in a cis configuration (e.g., molecule No. 192), a trans configuration (e.g., molecule No. 197), at meta positions of one meso-aryl ring (e.g., molecule No. 207), or other configurations such as at the β-positions of the porphyrinic macrocycle. Combinations of such substitutions are possible. Admixtures of ethynyl porphyrins also can be employed.

In addition, the porosity of the cross-linked film can be controlled in at least two ways: (1) by altering the facial encumbrance of the groups appended to the porphyrin, as shown for the series of molecules No. 197, 200, and 201; and the set 192 and 217; and (2) by extending the length of the linker between the porphyrin and the ethyne group, as shown for molecules No. 217 and 219. Thus, for example, In certain embodiments, longer linkers can be employed.

II. The Substrate.

In the methods of this invention, the redox-active (information storage) molecules are typically ultimately coupled to a surface. The surface can be an inert and/or non-conductive surface. More typically, however, the surface will be the surface of an electrode and/or a counterelectrode.

The electrode and/or counter electrodes are typically fabricated of materials capable of conducting electrons. The electrodes and/or counterelectrodes can comprise conductors, semiconductors, superconductors, and the like. In certain embodiments, the electrodes and/or counterelectrodes have a resistivity of less than about $10^{-2}$ ohm-meters, preferably less than about $10^{-3}$ ohm-meters, more preferably less than about $10^{-4}$ ohm-meters, and most preferably less than about $10^{-5}$ or $10^{-6}$ ohm-meters.

The methods of this invention are suitable for forming polymers of redox-active molecules covalently attached to essentially any or all Group II, III, IV, V, or VI materials (e.g., Group II, III, IV, V, or VI elements, semiconductors, and/or oxides thereof) and/or to transition metals, transition metal oxides, transition metal nitrides, alloys or composites comprising transition metals, and the like. In certain preferred embodiments, the substrates comprise all Group III, IV, or V materials (e.g., carbon, silicon, germanium, tin, lead), doped Group II, III, IV, V, and VI elements, or oxides of pure or doped Group II, III, IV, V, or VI elements or transition metals, transition metal oxides or transition metal nitrides. In certain preferred embodiments the surface is Group III, IV, or V material, more preferably a Group IV material (oxide, and/or doped variant), still more preferably a silicon or germanium surface or a doped and/or oxidized silicon or germanium surface.

It will be understood from the teachings herein that in certain embodiments, the materials that can be used for a substrate include, but are not limited to Si, Ge, SiC, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, and their oxides and nitrides.

The group II, III, IV, V, or VI element, transition metal, transition metal oxide or nitride can be essentially pure, or it can be doped (e.g., p- or n-doped) and/or alloyed. P- and n-dopants for use with Group II-VI elements, in particular for use with Groups III, IV, and V elements, more particularly for use with Group IV elements (e.g., silicon, germanium, etc.) are well known to those of skill in the art. Such dopants include, but are not limited to phosphorous compounds, boron compounds, arsenic compounds, aluminum compounds, and the like. Many doped Group II, III, IV, V, or VI elements are semiconductors and include, but are not limited to ZnS, ZnSe, ZnTe, CdS, CdSe, CdTe, MgS, MgSe, MgTe, CaS, CaSe, CaTe, SrS, SrSe, SrTe, BaS, BaSe, BaTe, GaN, GaP, GaAs, GaSb, InP, InAs, InSb, AlS, AlP, AlSb, PbS, PbSe, Ge and Si and ternary and quaternary mixtures thereof.

The surface can take essentially any form. For example, it can be provided as a planar substrate, an etched substrate, a deposited domain on another substrate, a deposited or etched well, and the like. Particularly preferred forms include those forms of common use in solid state electronics fabrication processes.

Although not necessarily required, in certain embodiments the surface is cleaned before use, e.g., using standard methods known to those of skill in the art. Thus, for example, in one preferred embodiment, the surface can be cleaned by sonication in a series of solvents (e.g., acetone, toluene, ethanol, and water) and then exposed to a standard wafer-cleaning solution (e.g., Piranha (sulfuric acid: 30% hydrogen peroxide, 2:1)) at an elevated temperature (e.g., 100° C.).

In certain embodiments, oxides can be removed from the substrate surface and the surface can be hydrogen passivated. A number of approaches to hydrogen passivation are well known to those of skill in the art. For example, in one approach, a flow of molecular hydrogen is passed through dense microwave plasma across a magnetic field. The magnetic field serves to protect the sample surface from being bombarded by charged particles. Hence the crossed beam (CB) method makes it possible to avoid plasma etching and heavy ion bombardment that are so detrimental for many semiconductor devices (see, e.g., Balmashnov, et al. (1990) *Semiconductor Science and Technology*, 5: 242). In one particularly preferred embodiment, passivation is achieved by contacting the surface to be passivated with an ammonium fluoride solution (preferably sparged of oxygen).

Other methods of cleaning and passivating surfaces are known to those of skill in the art (see, e.g., Choudhury (1997) *The Handbook of Microlithography, Micromachining, and Microfabrication*, Soc. Photo-Optical Instru. Engineer, Bard & Faulkner (1997) *Fundamentals of Microfabrication*, and the like).

III. The Redox-Active Molecules.

It was a surprising discovery that a large number of redox-active organic molecules are sufficiently heat-resistant to be amenable and even quite effective in the methods of this invention. Suitable heat-resistant organic molecules typically include, but are not limited to metallocenes (e.g., ferrocene), porphyrins, expanded porphyrins, contracted porphyrins, linear porphyrin polymers, porphyrin sandwich coordination complexes, porphyrin arrays, and phthalocyanines.

Certain preferred heat-resistant organic molecules include, but are not limited to 5-[4-(S-acetylthiomethyl)phenyl]-10,15,20-trimesitylporphinatozinc(II), 5-[4-(mercaptomethyl)phenyl]-10,15,20-trimesitylporphinatozinc(II), 5-[4-(hydroxymethyl)phenyl]-10,15,20-trimesitylporphinatozinc(II), 5-[4-(hydroxymethyl)phenyl]-10,15,20-tri-p-tolylporphinatozinc(II), 5-(4-allylphenyl)-10,15,20-trimesitylporphinatozinc(II), 5-(4-formylphenyl)-15-phenyl-10,20-di-p-tolylporphinatozinc(II), 5-(4-bromomethylphenyl)-10,15,20-trimesitylporphinatozinc(II), 5-(4-ethynylphenyl)-10,15,20-trimesitylporphinatozinc(II), 5-(4-iodophenyl)-10,15,20-trimesitylporphinatozinc(II), 5-(4-bromophenyl)-10,15,20-tri-p-tolylporphinatozinc(II), 5-(4-hydroxyphenyl)-10,15,20-trimesitylporphinatozinc(II), 5,10-bis(4-ethynylphenyl)-15,20-dimesitylporphinatozinc (II), 5-[4-(4,4,5,5-tetramethyl-1,3,2-dioxaborolan-2-yl)phenyl]-10,20-bis(3,5-di-tert-butylphenyl)-15-mesitylporphinatozinc(II), 5-iodo-10,20-bis(3,5-di-tert-butylphenyl)-15-mesitylporphinatozinc(II), 5,10-bis(4-iodophenyl)-15,20-dimesitylporphinatozinc(II), 5-[4-(2-(trimethylsilyl)ethynyl)phenyl]-10,15,20-trimesitylporphinatozinc(II), 5,15-bis(4-ethynylphenyl)-10,20-dimesitylporphinatozinc(II), 5,15-bis(4-iodophenyl)-10,20-dimesitylporphinatozinc(II), 5,10,15-tris(4-ethynylphenyl)-20-mesitylporphinatozinc(II), 5,15-bis(4-ethynylphenyl)-10,20-bis(4-tert-butylphenyl) porphinatozinc(II), 5,15-bis(4-ethynylphenyl) porphinatozinc(II), 5,15-bis(3-ethynylphenyl)-10,20-dimesitylporphinatozinc(II), 5,10,15,20-tetrakis(4-ethynylphenyl)porphinatozinc(II), 5,10-bis[4-(2-(trimethylsilyl)ethynyl)phenyl]-15,20-dimesitylporphinatozinc(II), 5-(3,5-diethynylphenyl)-10,15,20-trimesitylporphinatozinc(II), 3,7-dibromo-10,20-bis(3,5-di-tert-butylphenyl)-15-mesitylporphinatozinc(II), 5-[4-(2-(trimethylsilyl)ethynyl)phenyl]-10,15,20-tri-p-tolylporphinatozinc(II), 5-[4-(Se-acetylselenomethyl)phenyl]-10,15,20-trimesitylporphinatozinc(II), 5-(4-iodophenyl)-10,20-bis(3,5-di-tert-butylphenyl)-15-mesitylporphinatozinc(II), 5,10-bis(4-ethynylphenyl)-15,20-bis(4-tert-butylphenyl)porphinatozinc(II), 5,10-bis(4-ethynylbiphen-4'-yl)-15,20-bis(4-tert-butylphenyl) porphinatozinc(II), 5-(4-vinylphenyl)-10,15,20-trimesitylporphinatozinc(II), 5-(4-vinylphenyl)-10,15,20-tri-p-tolylporphinatozinc(II), 5-(hydroxymethyl)-10,15,20-trimesitylporphinatozinc(II), 5-(4-allylphenyl)-10,15,20-tri-p-tolylporphinatozinc(II), 5-(4-allylphenyl)-10,15,20-tri-p-tolylporphinatocopper(II), type c triple decker [(tert-butyl)$_4$phthalocyaninato]Eu[(tert-butyl)$_4$phthalocyaninato]Eu[5,15-bis(4-ethynylphenyl)-10,20-bis(4-tert-butylphenyl)porphyrin], type c triple decker [(tert-butyl)$_4$phthalocyaninato]Eu[(tert-butyl)$_4$phthalocyaninato]Eu[5-[4-[2-(4-(hydroxymethyl)phenyl)ethynyl]phenyl]-10,15,20-tri-p-tolylporphyrin], 5,10-bis[4-(2-(triisopropylsilyl)ethynyl)biphen-4'-yl]-15,20-bis(4-tert-butylphenyl)porphinatozinc (II), 5,10-bis[4-(2-(triisopropylsilyl)ethynyl)phenyl]-15,20-bis(4-tert-butylphenyl)porphinatozinc(II), and the like.

In certain embodiments, the redox-active molecules are porphyrins. Suitable substituents on the non-linking positions of the porphyrins include, but are not limited to aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred substituents include, but are not limited to 4-methylphenyl, 4-t-butylphenyl, 4-trifluoromethylphenyl, pentyl, and H (no substituent).

In certain embodiments, the redox-active molecules are phthalocyanines. Suitable substituents on the non-linking positions of the phthalocyanines include, but are not limited to aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred substituents include, but are not limited to methyl, t-butyl, butoxy, fluoro, and H (no substituent).

Figure 4:
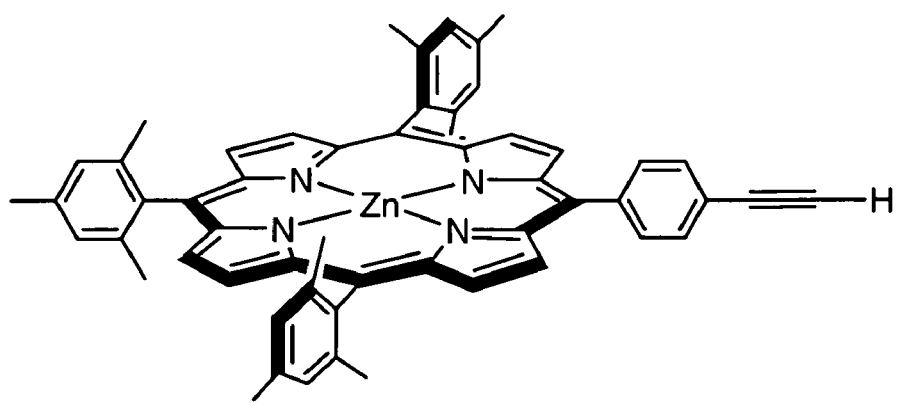
FIG. 4 shows some illustrative redox-active molecules containing ethynyl groups.
Figure 4:
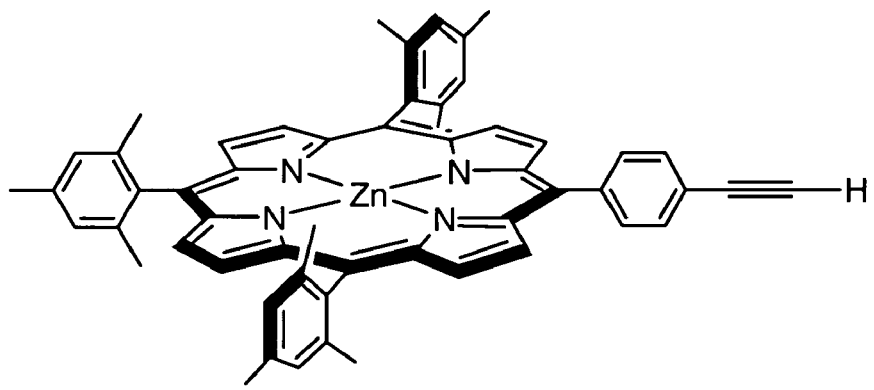
Figure 4:
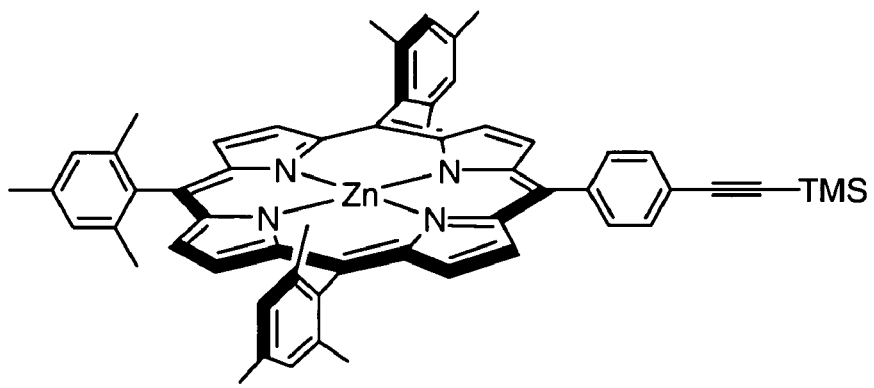
Figure 4:
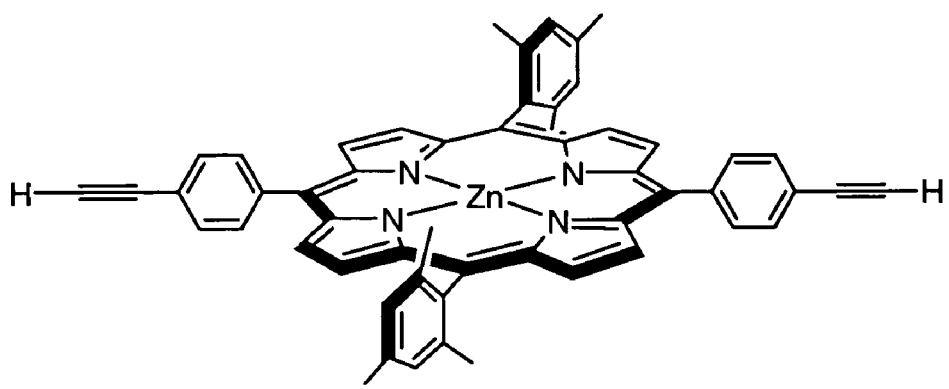
Figure 4:
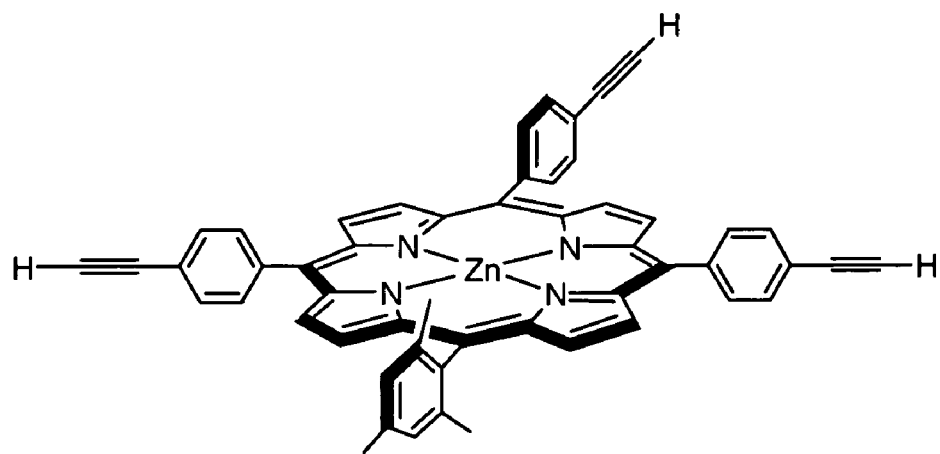
Figure 4:
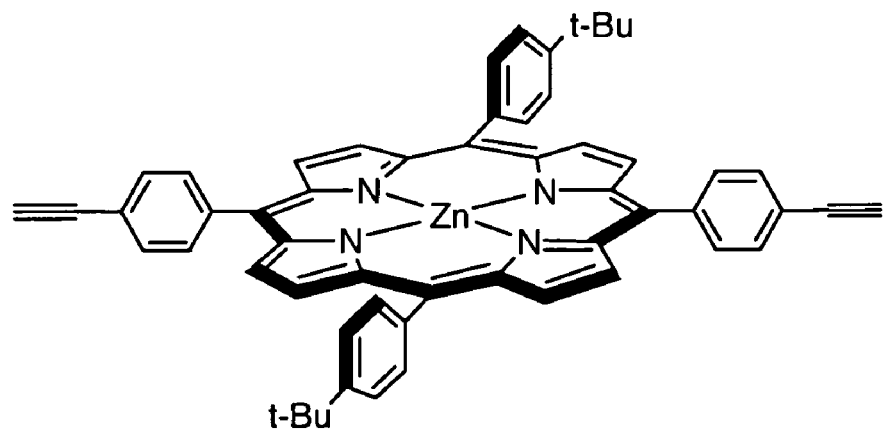
Figure 4:
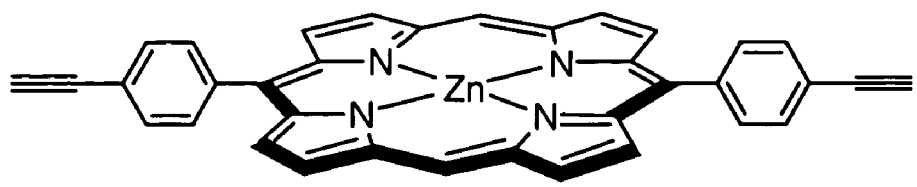
Figure 4:
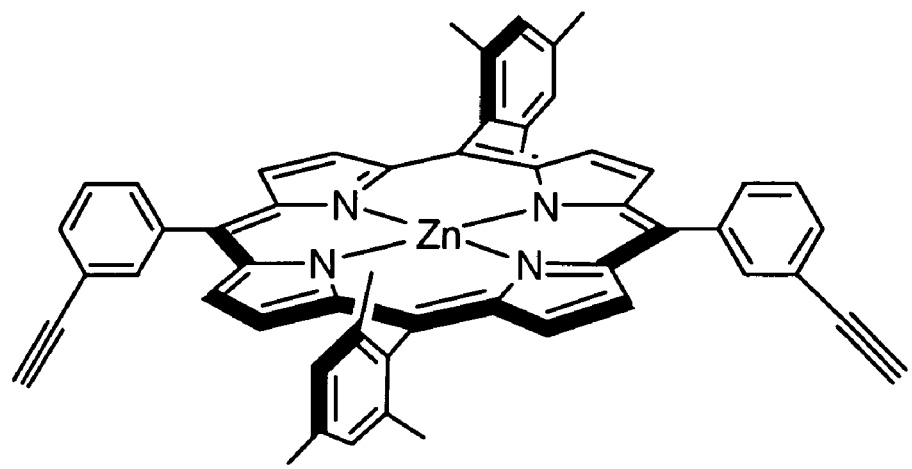
Figure 4:
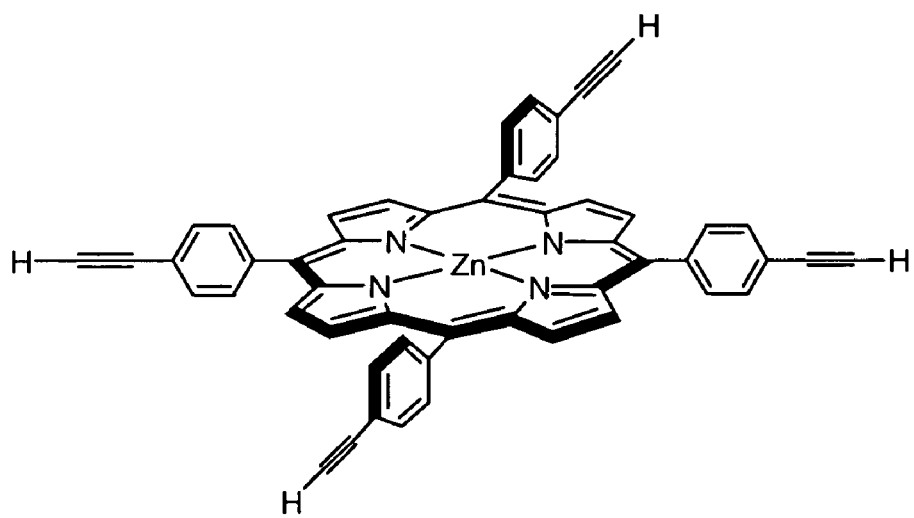
Figure 4:
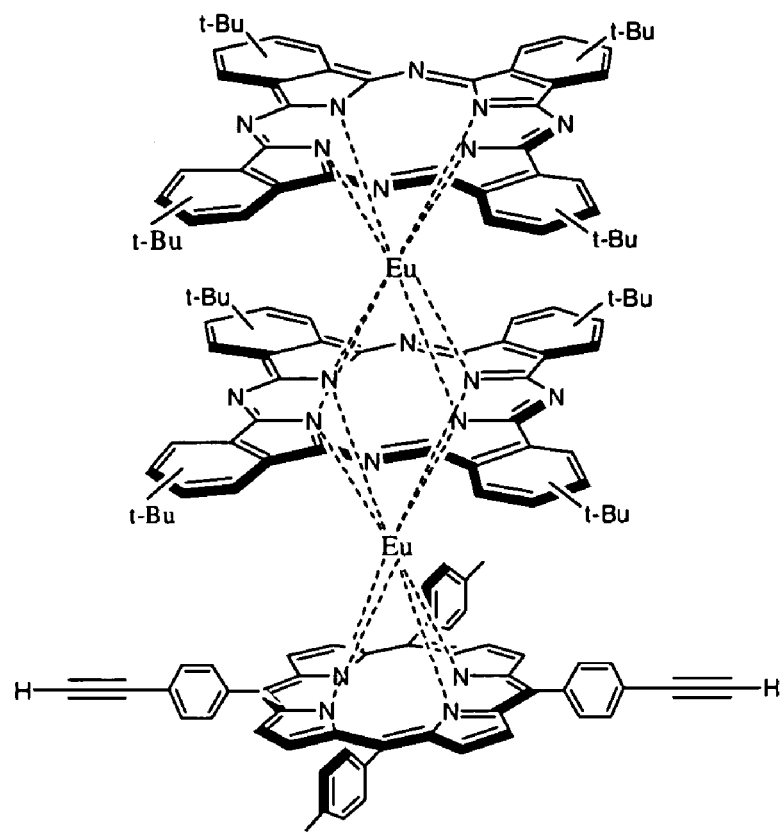
Figure 4:
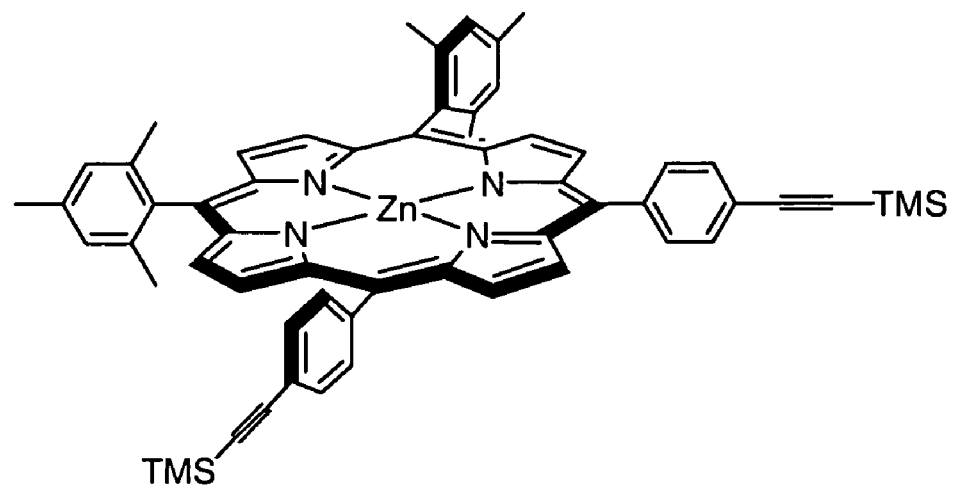
Figure 4:
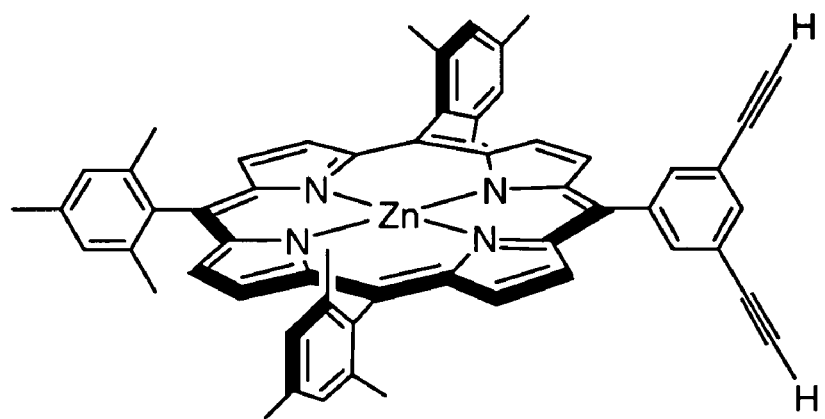
Figure 4:
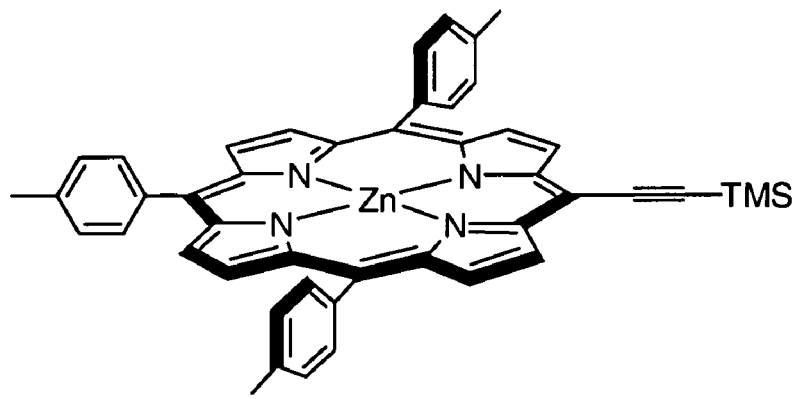
Figure 4:
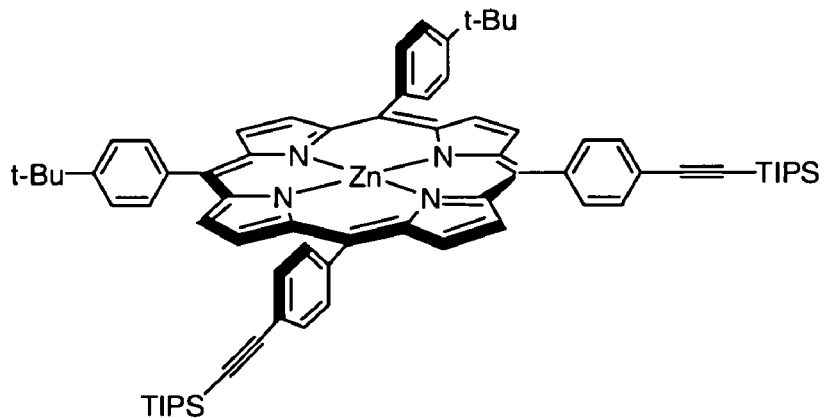
Figure 4:
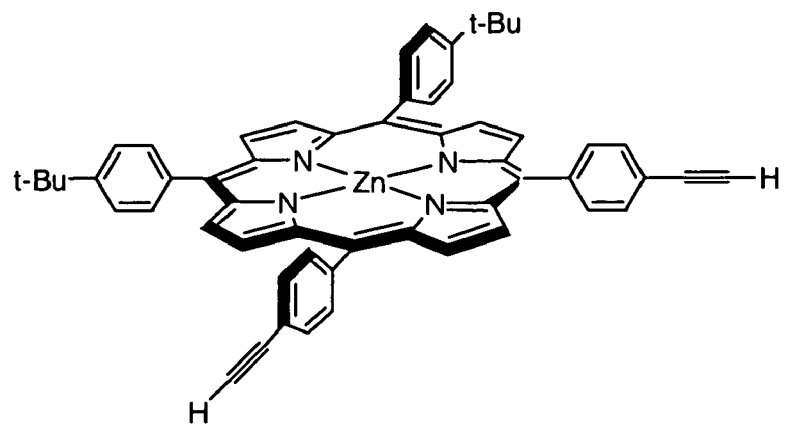
Figure 4:
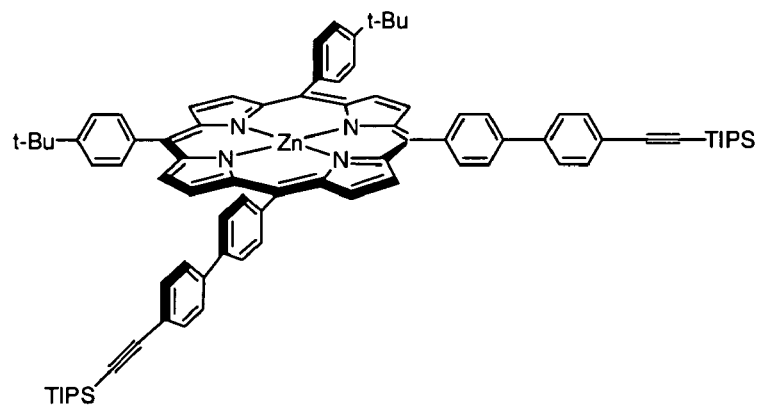
Figure 4:
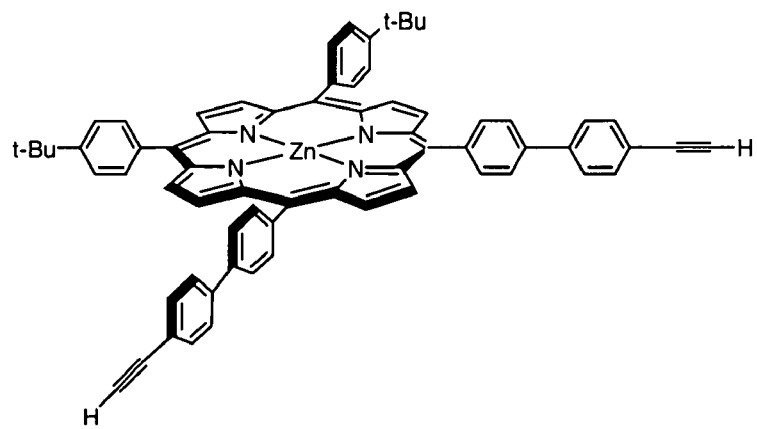
Figure 8A:
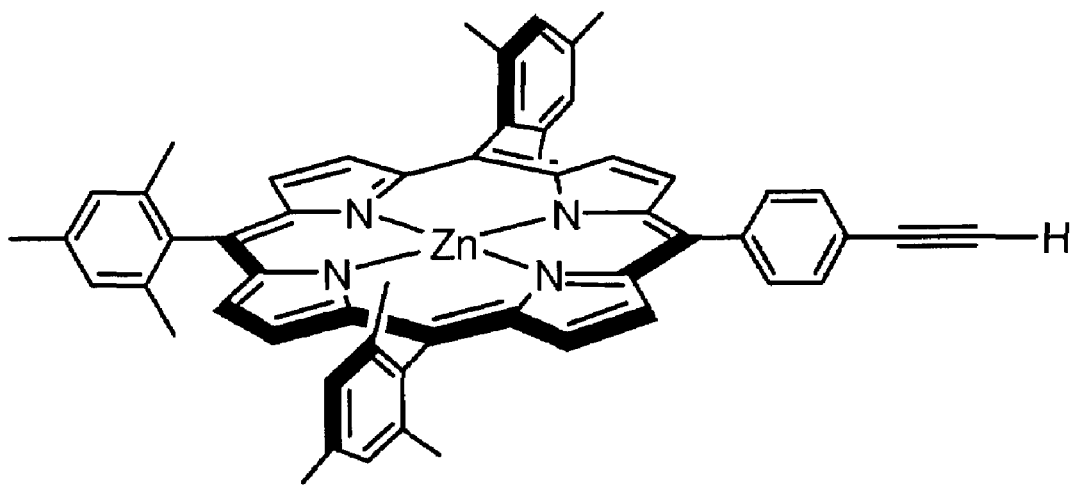
FIGS. 8A-8Q show formulas, cyclic voltammetry, and coverage summary of illustrative redox-active molecules containing ethynyl groups.
Figure 8A:
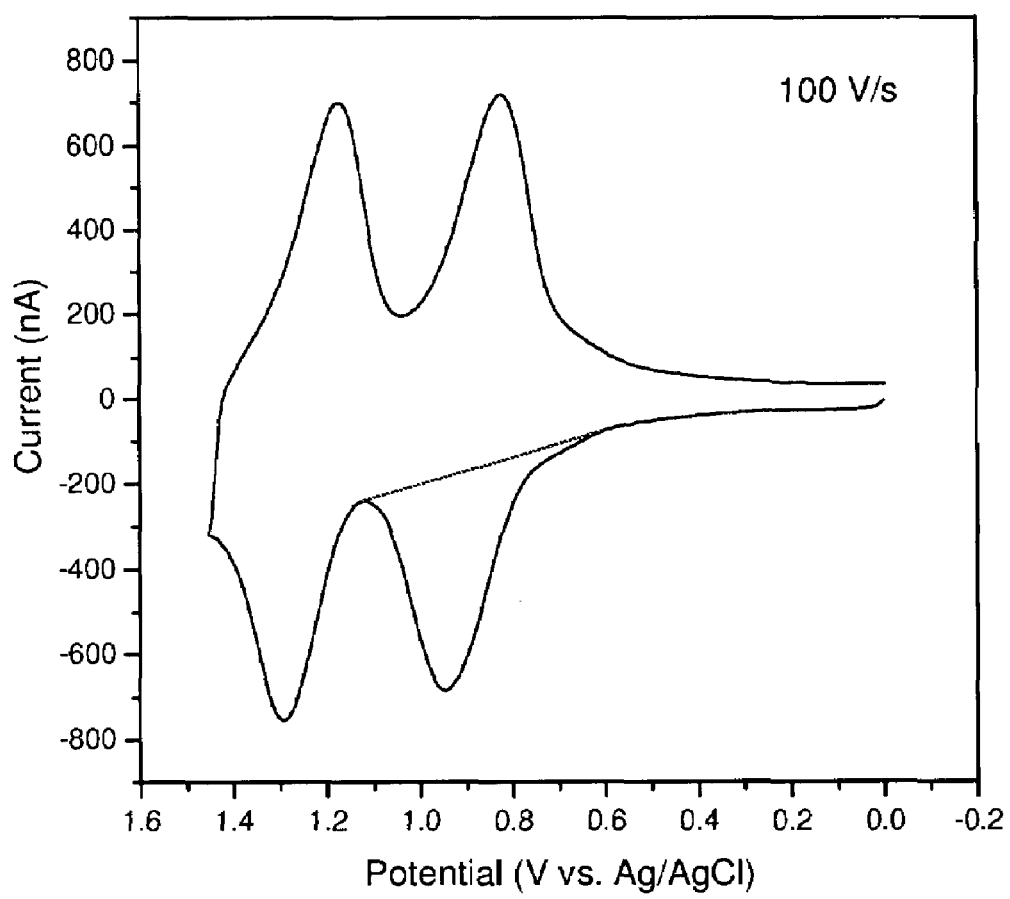
Figure 8B:
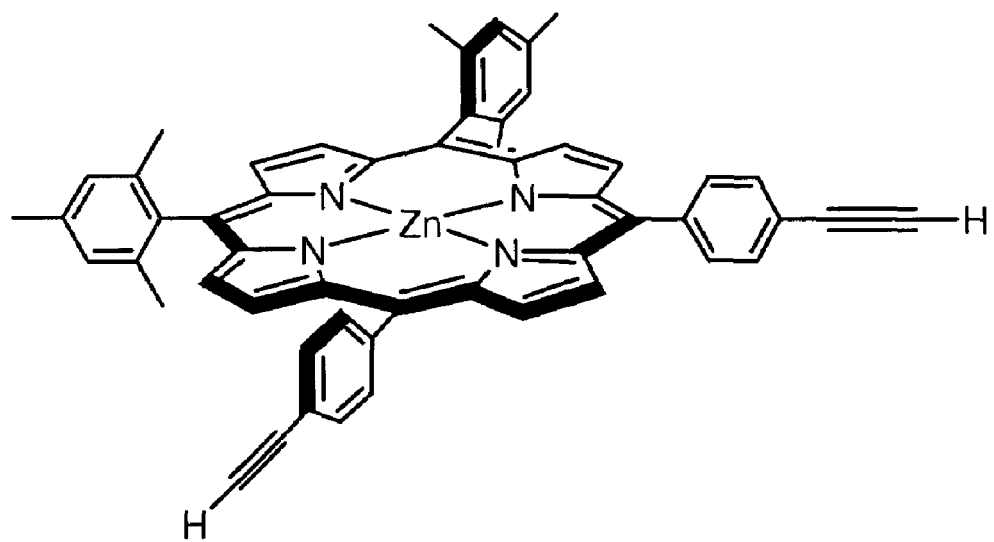
Figure 8B:
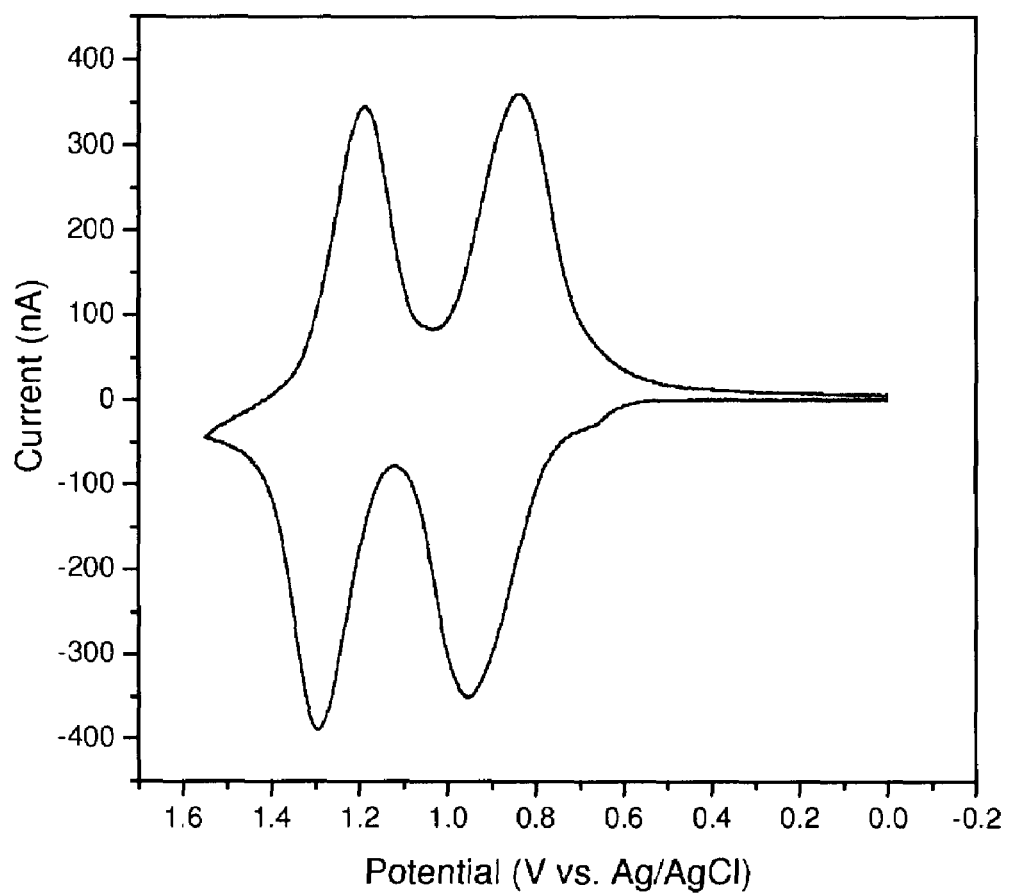
Figure 8C:
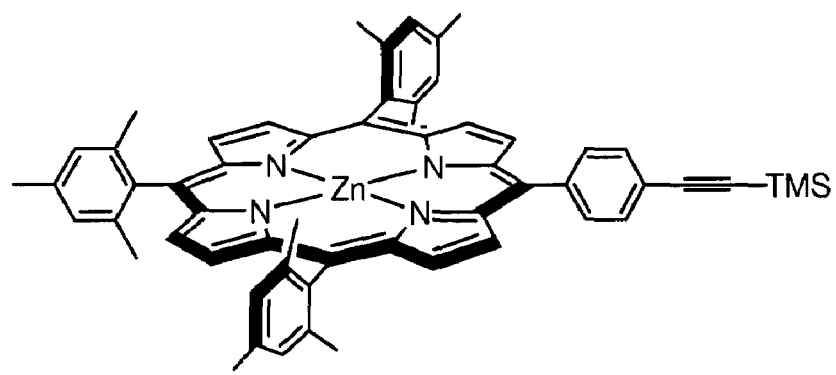
Figure 8C:
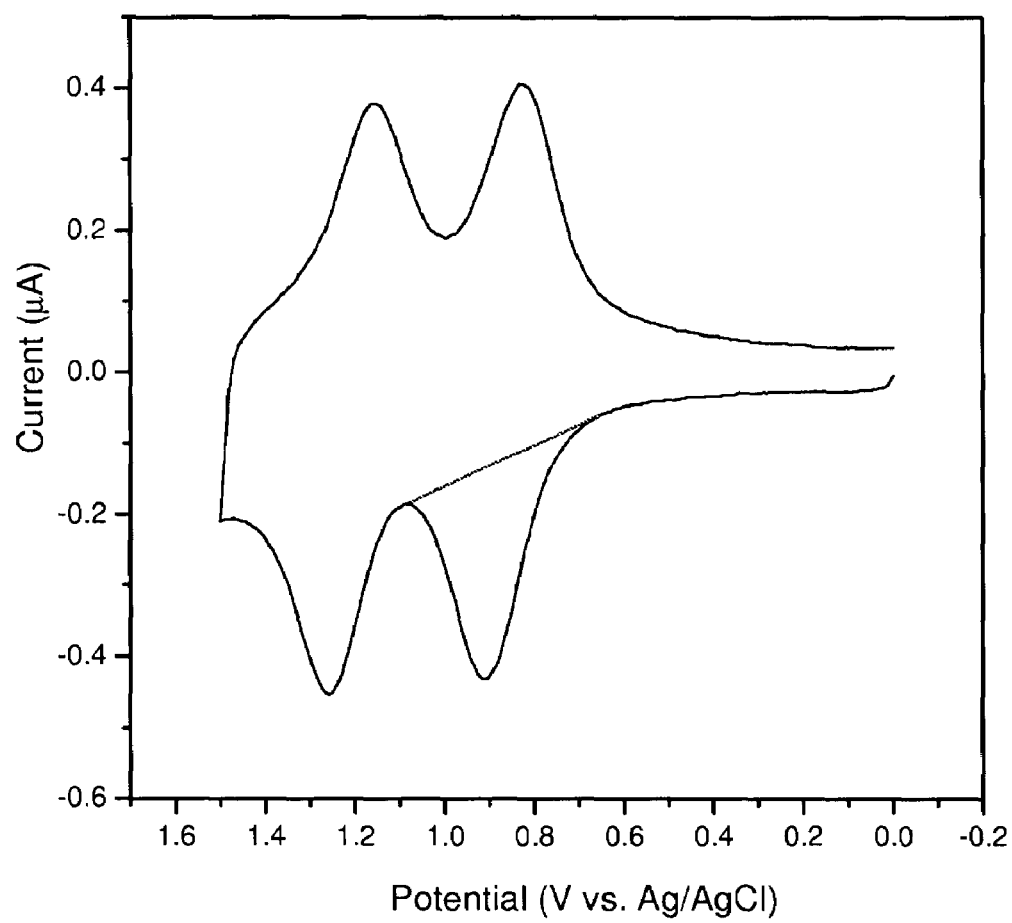
Figure 8D:
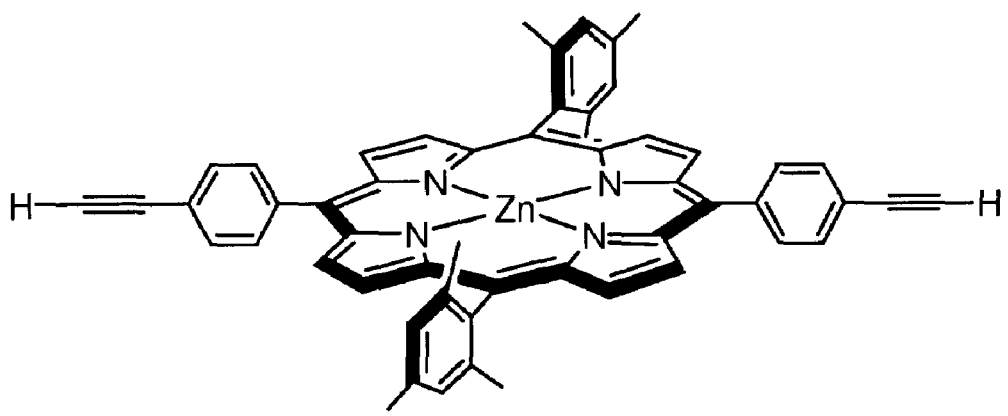
Figure 8D:
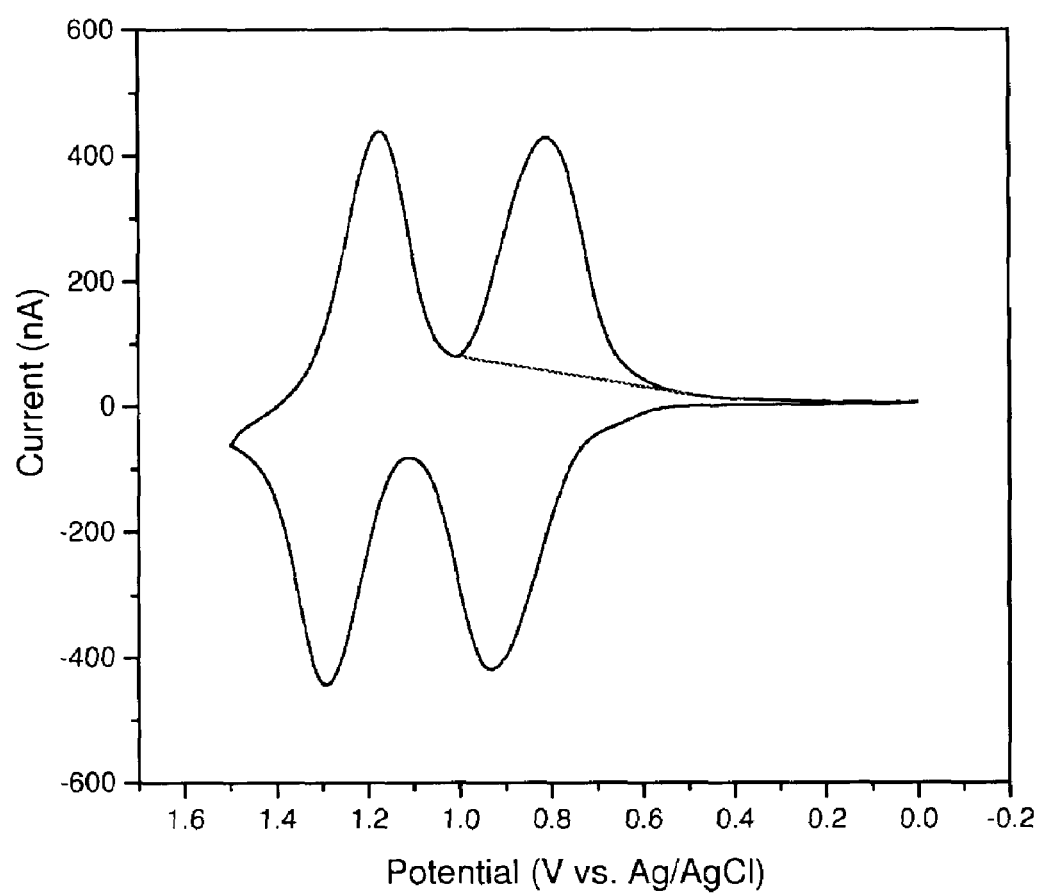
Figure 8E:
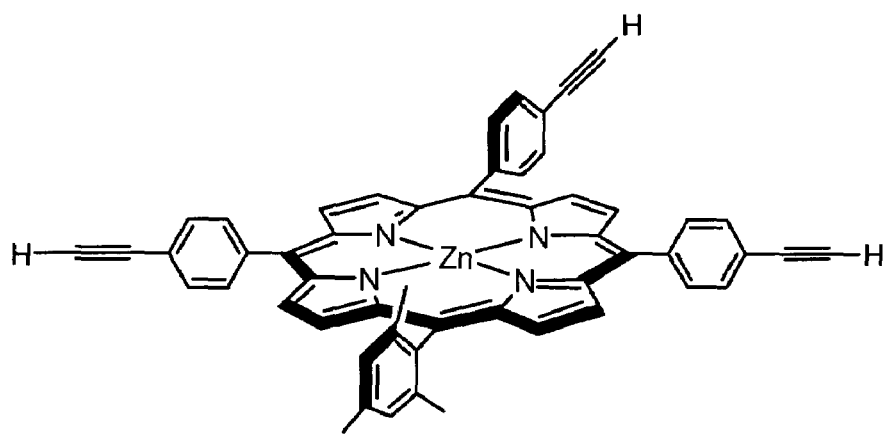
Figure 8E:
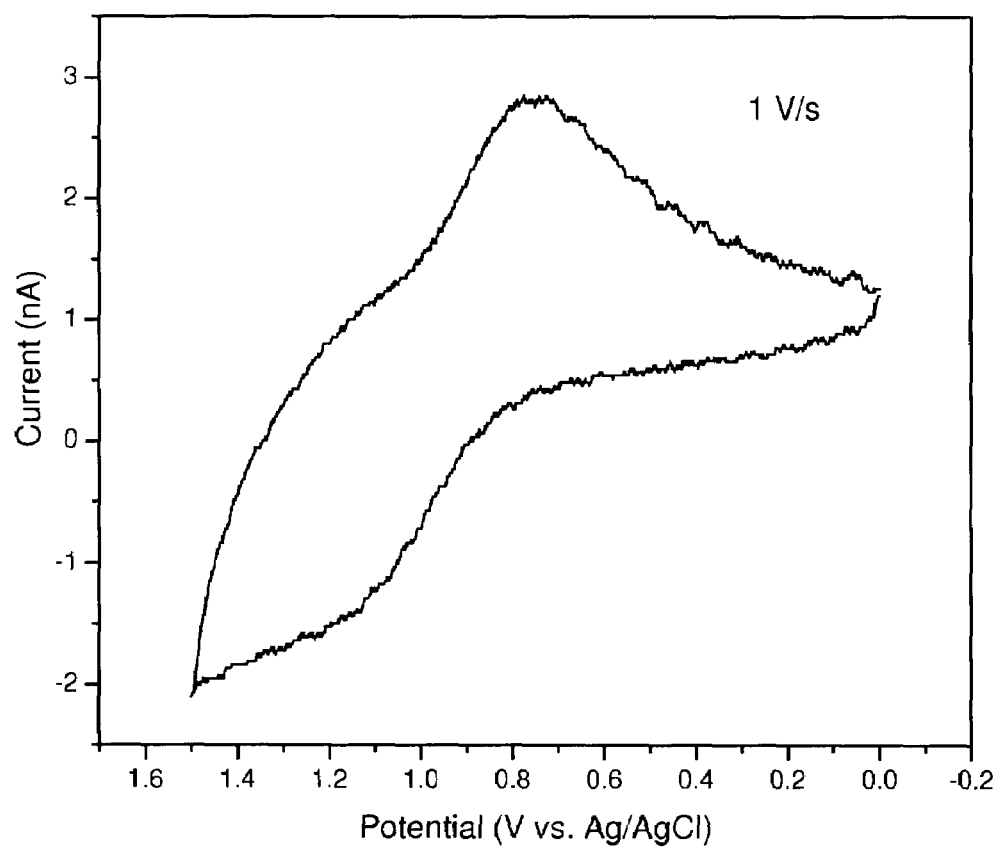
Figure 8F:
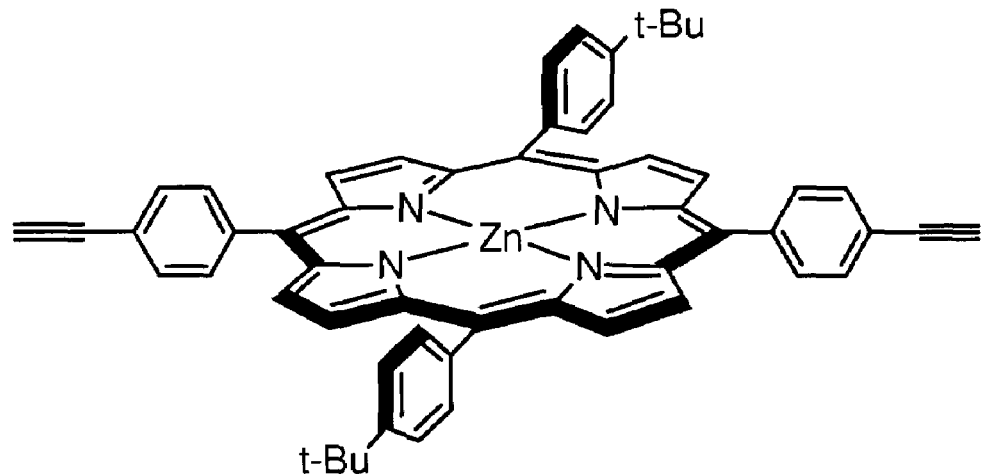
Figure 8F:
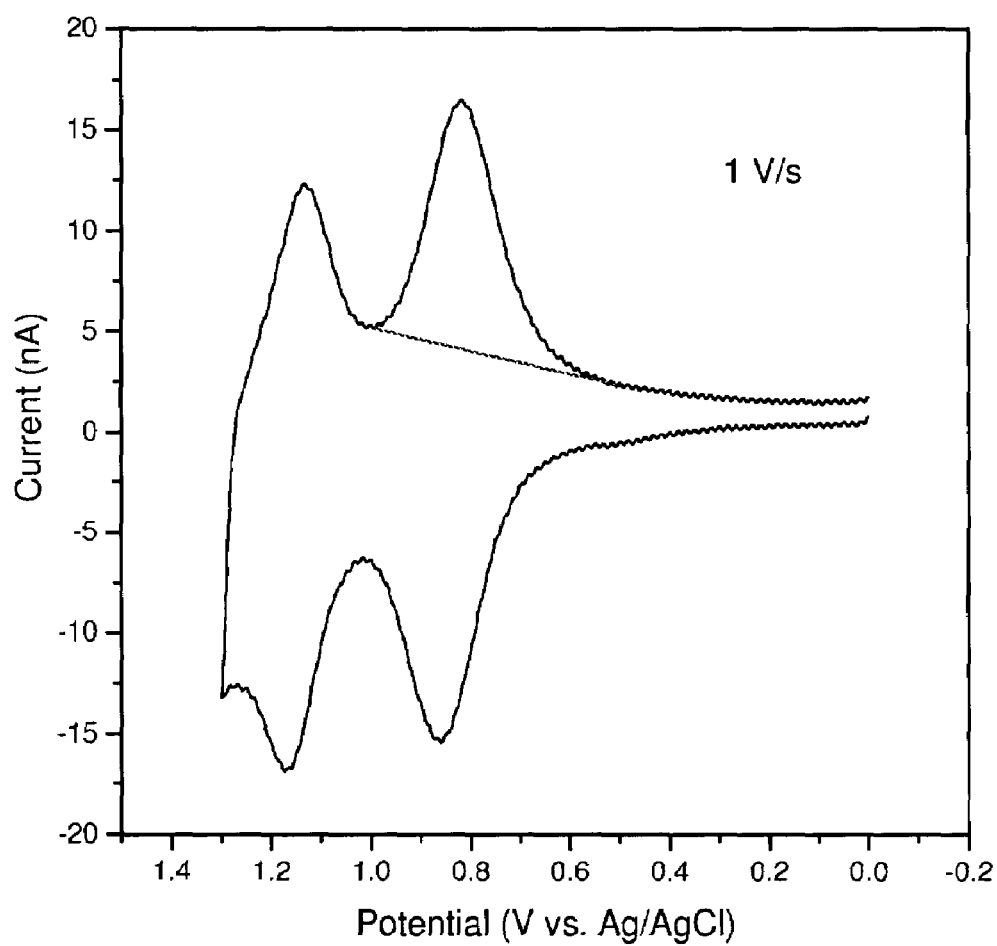
Figure 8G:
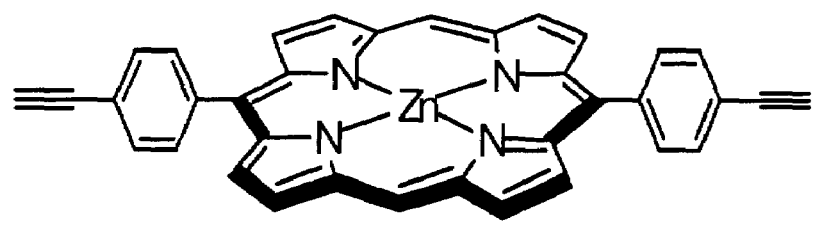
Figure 8G:
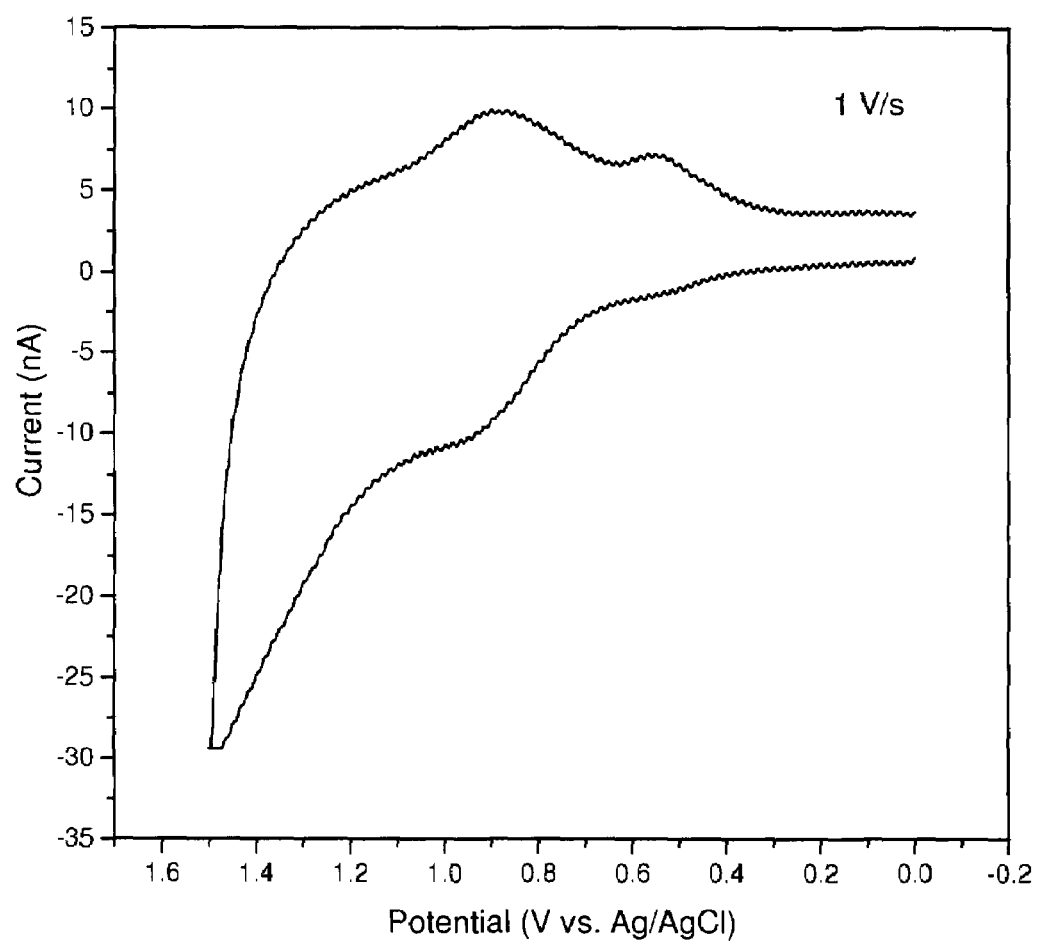
Figure 8H:
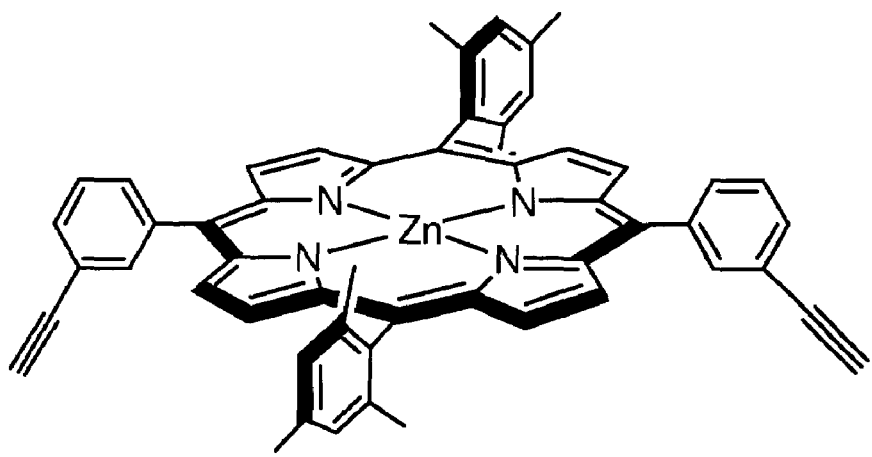
Figure 8H:
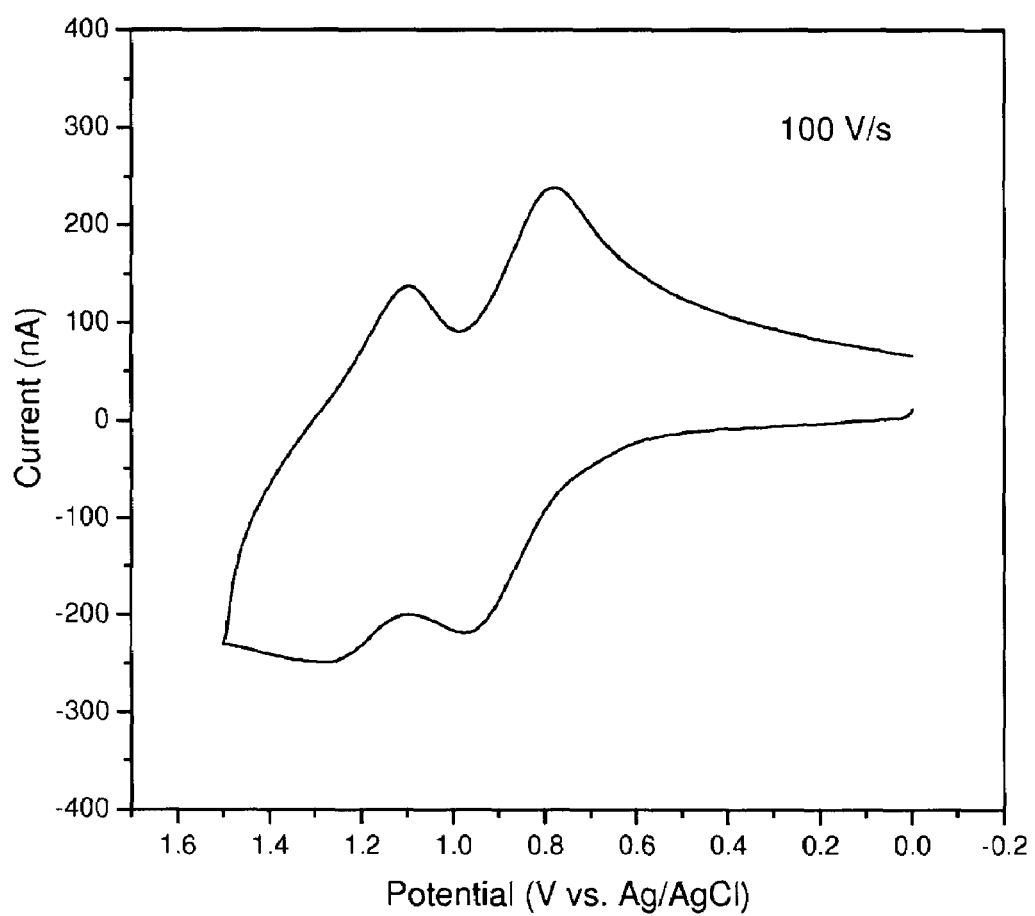
Figure 8I:
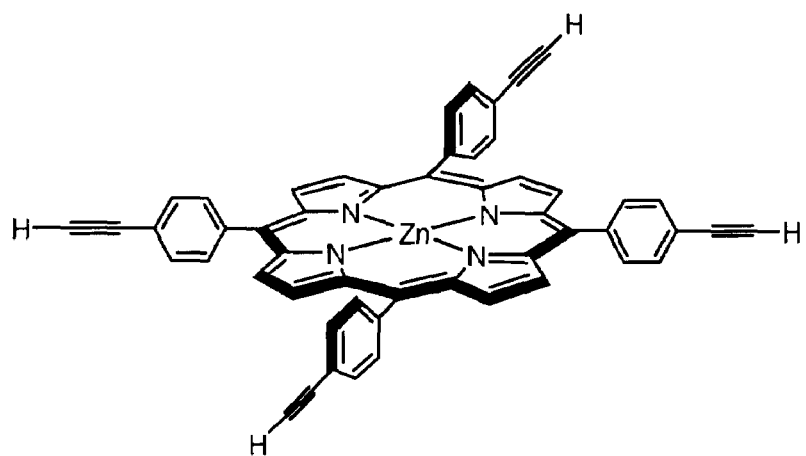
Figure 8I:
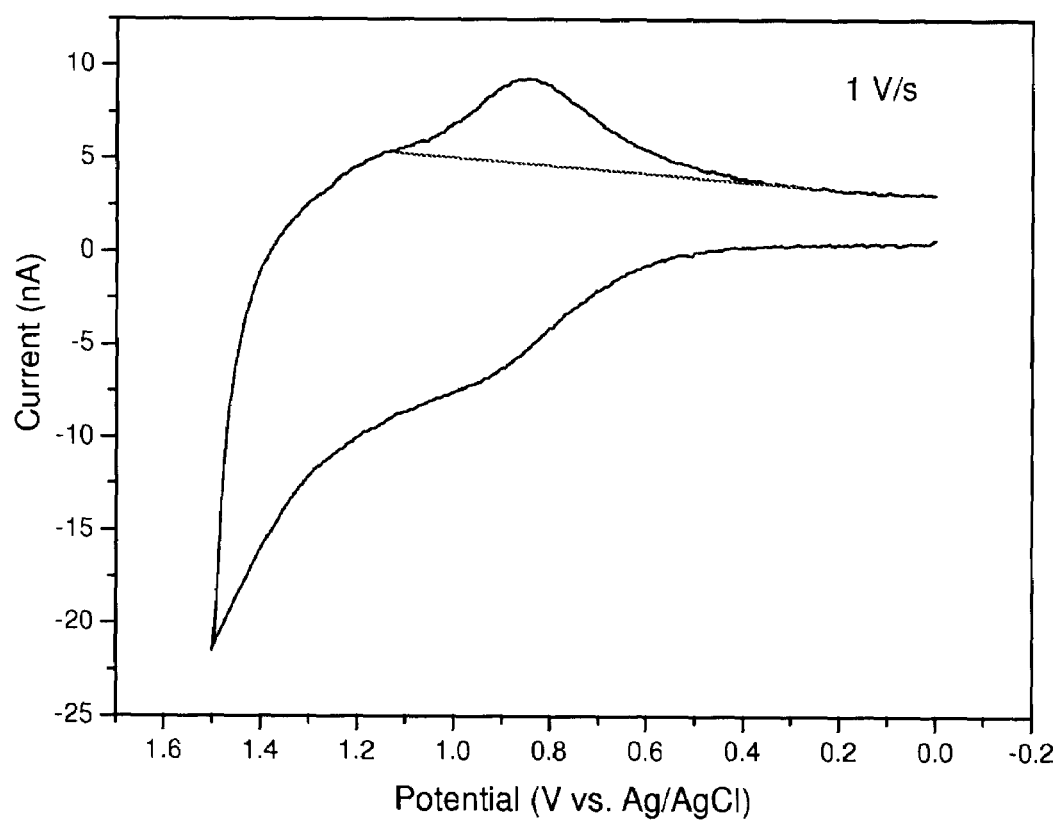
Figure 8J:
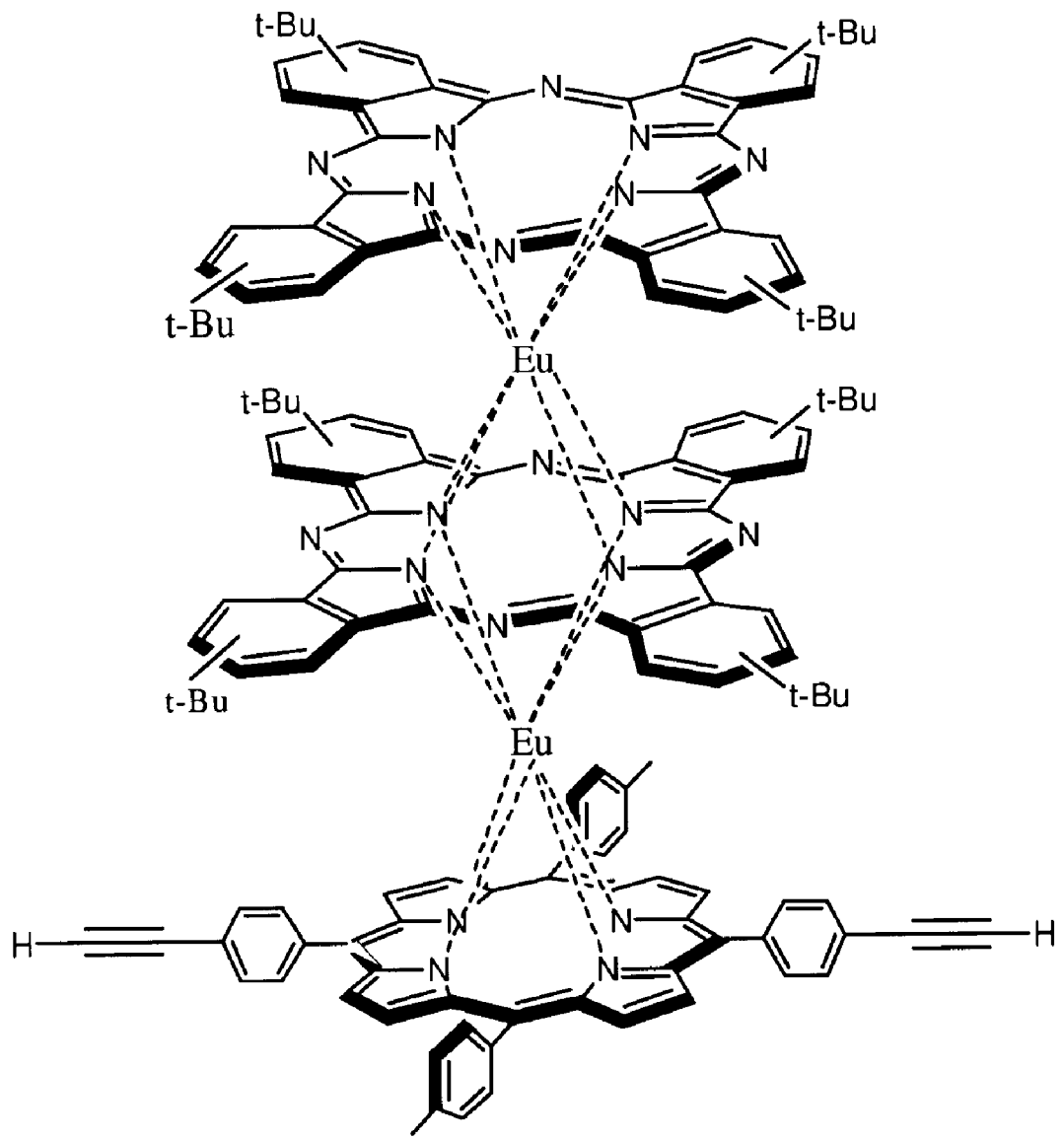
Figure 8J:
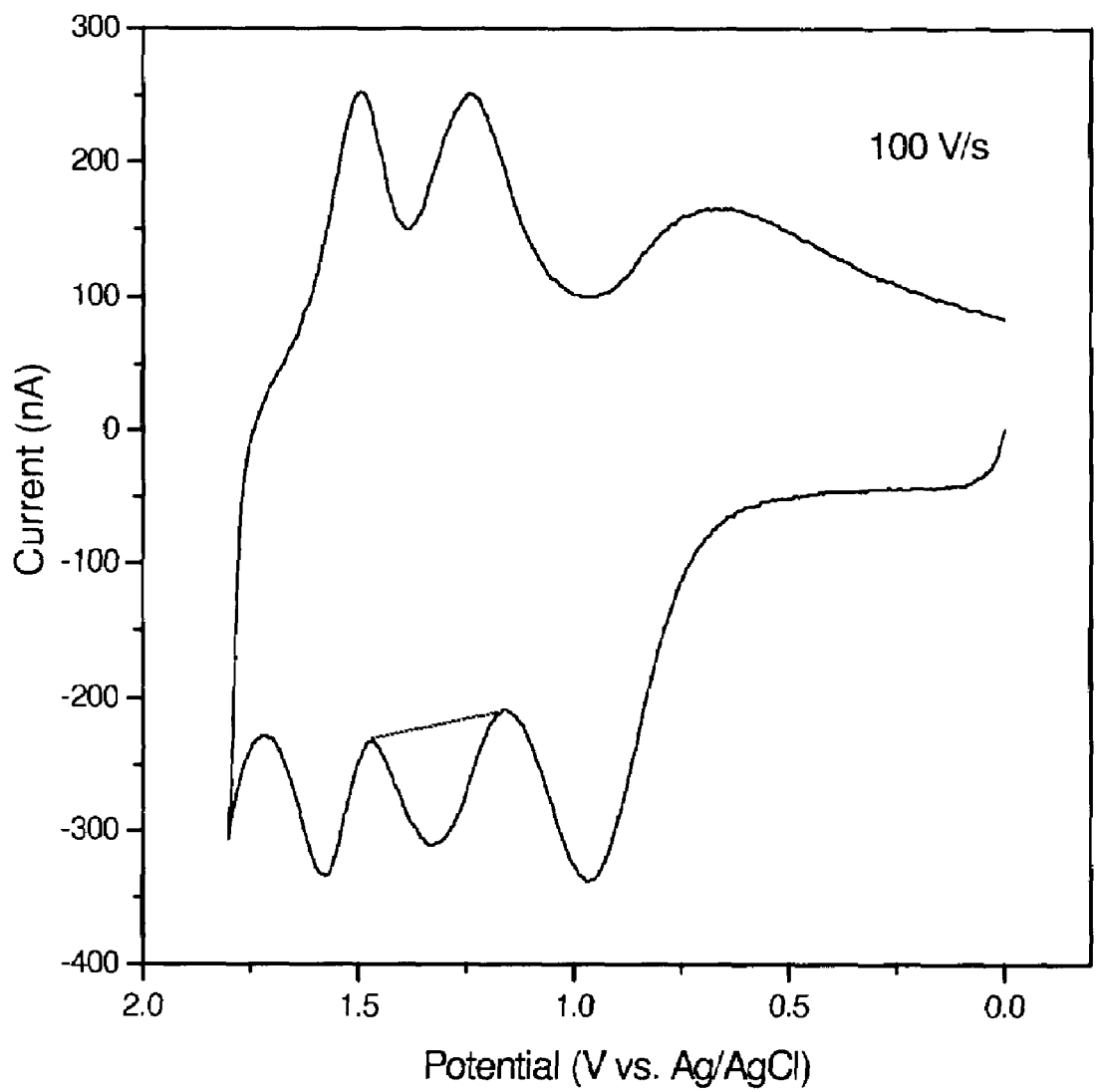
Figure 8K:
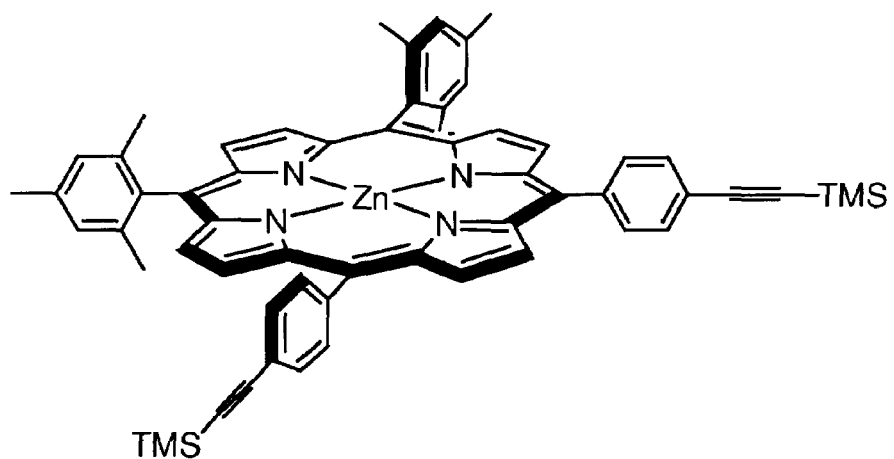
Figure 8K:
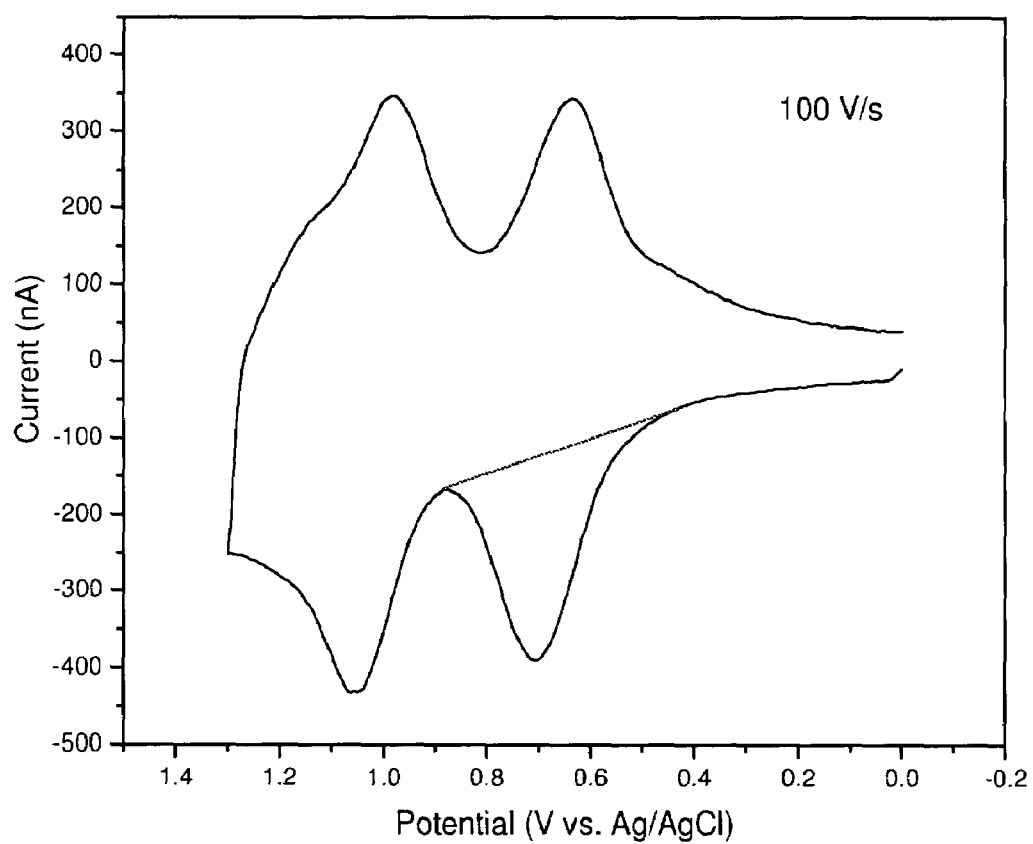
Figure 8L:
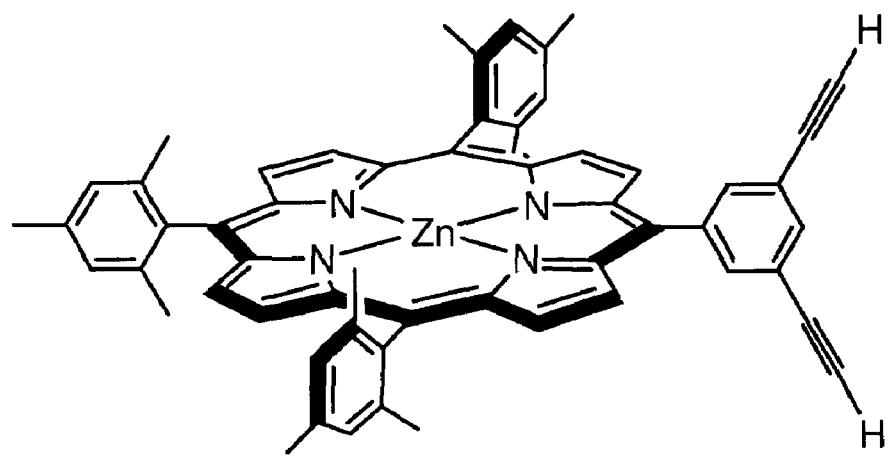
Figure 8L:
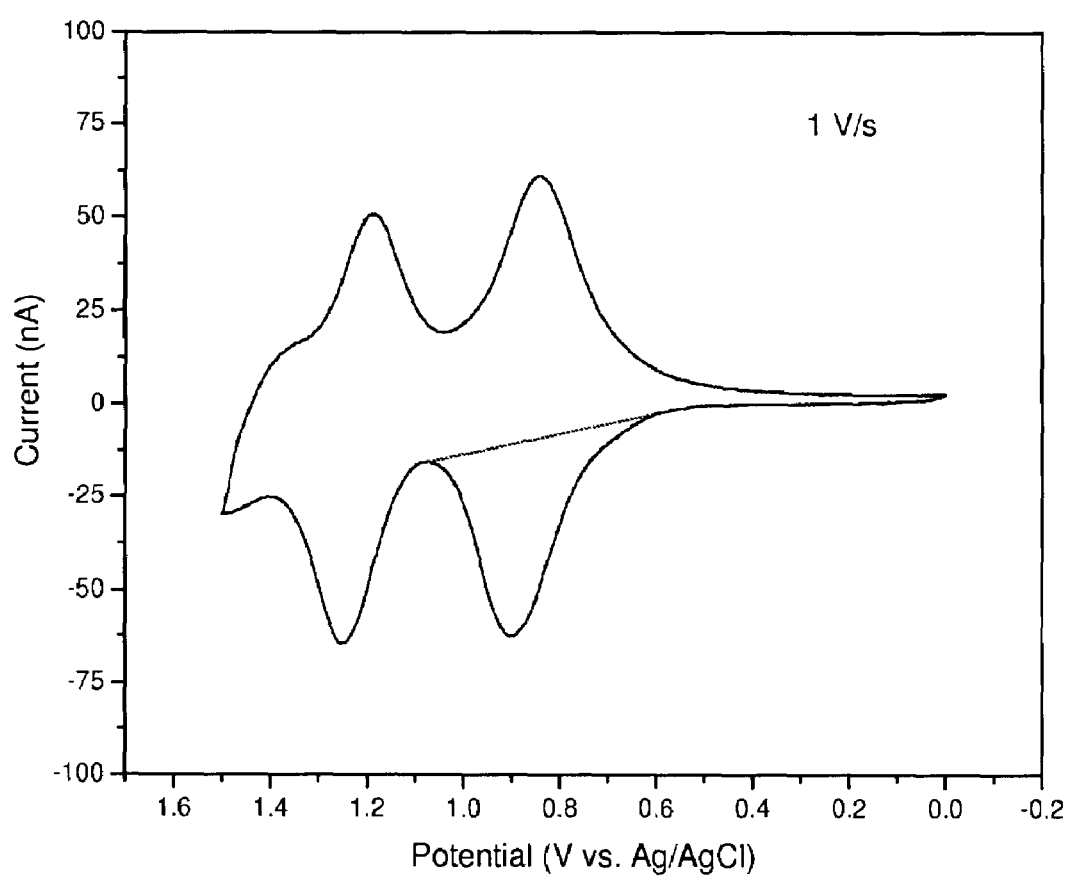
Figure 8M:
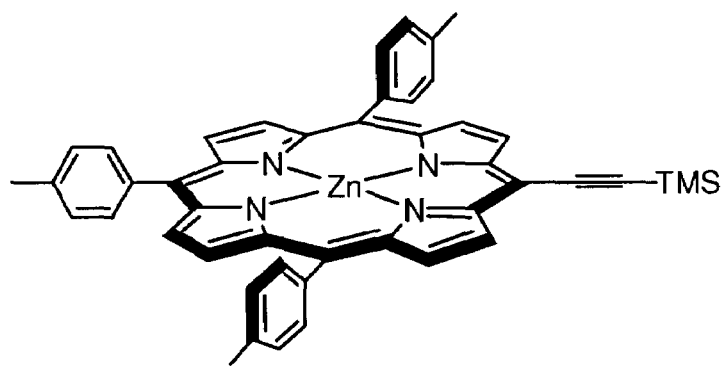
Figure 8M:
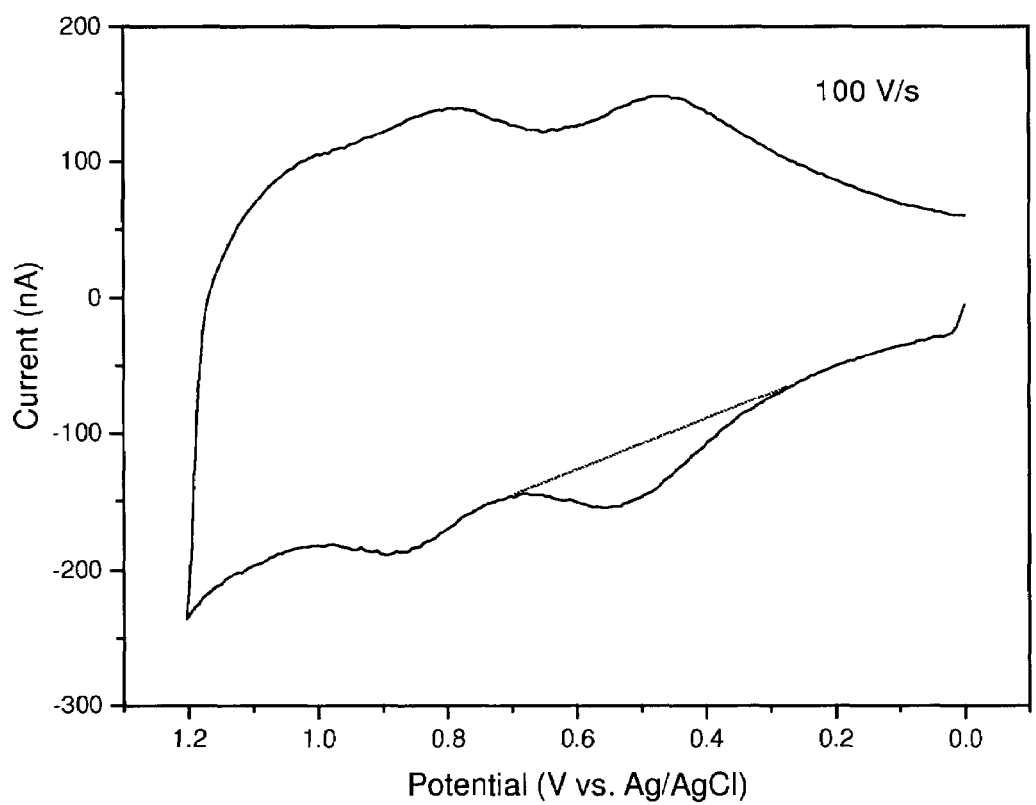
Figure 8N:
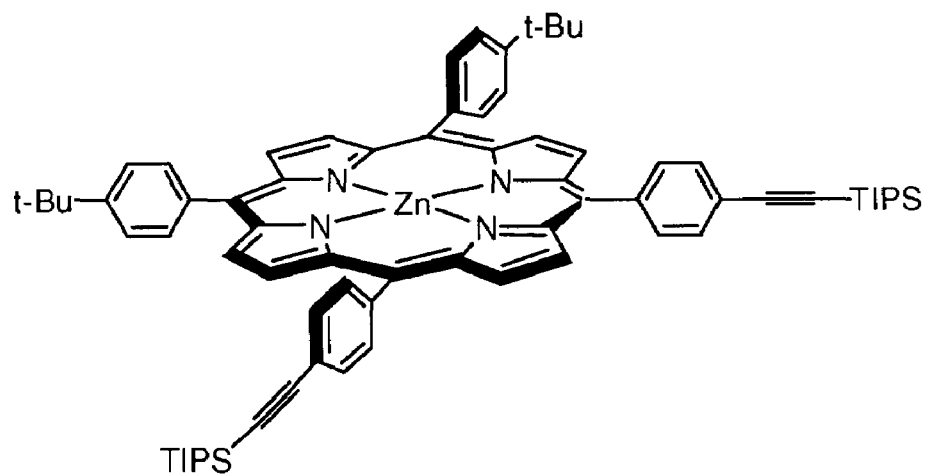
Figure 8N:
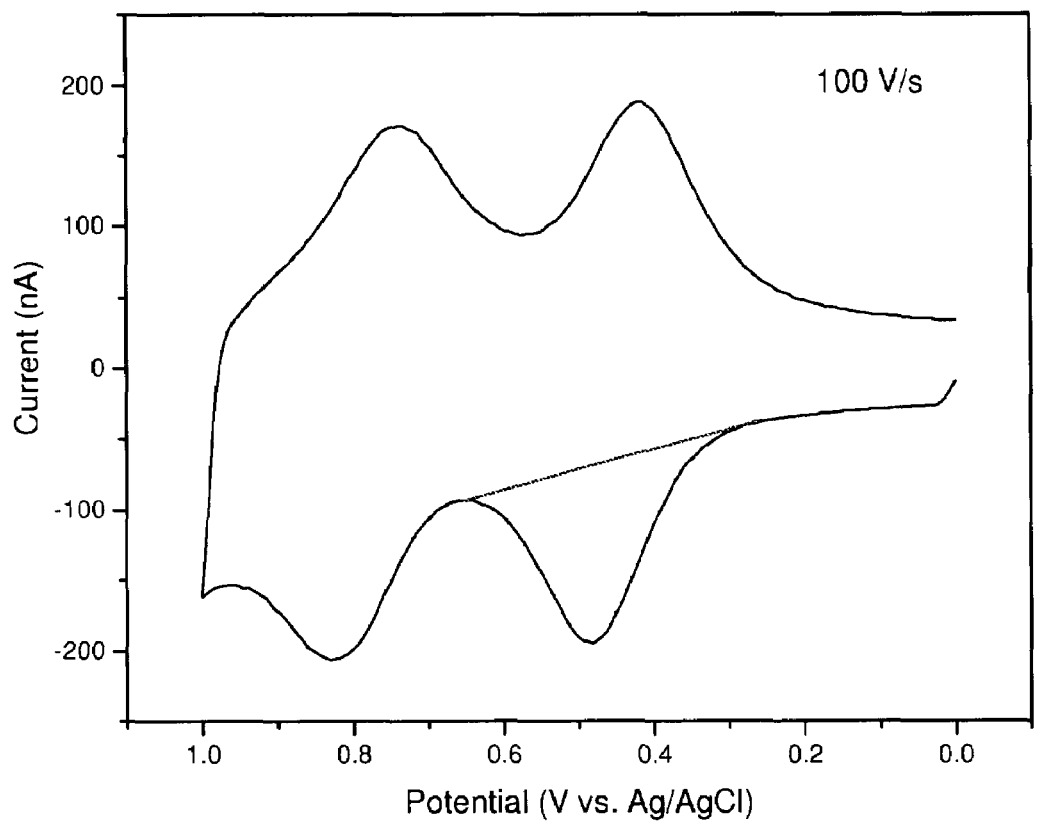
Figure 8O:
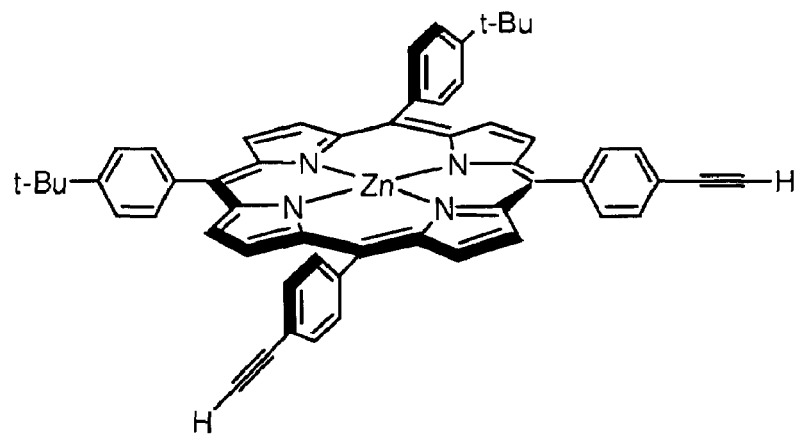
Figure 8O:
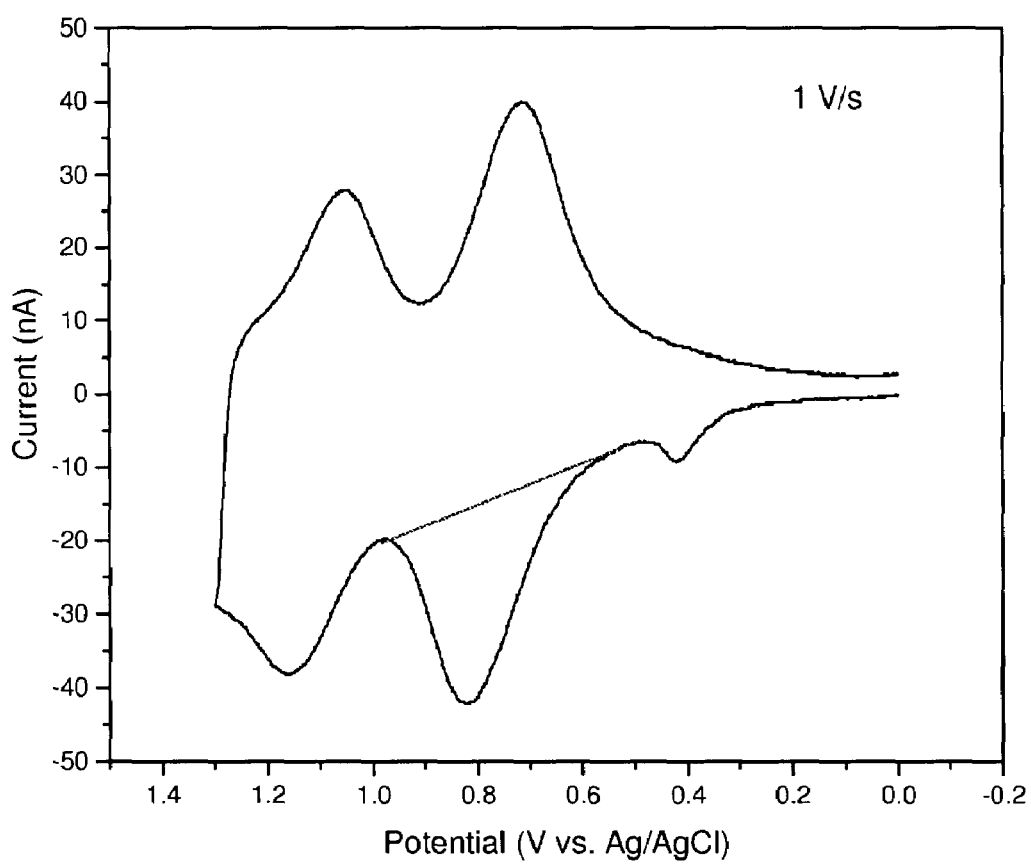
Figure 8P:
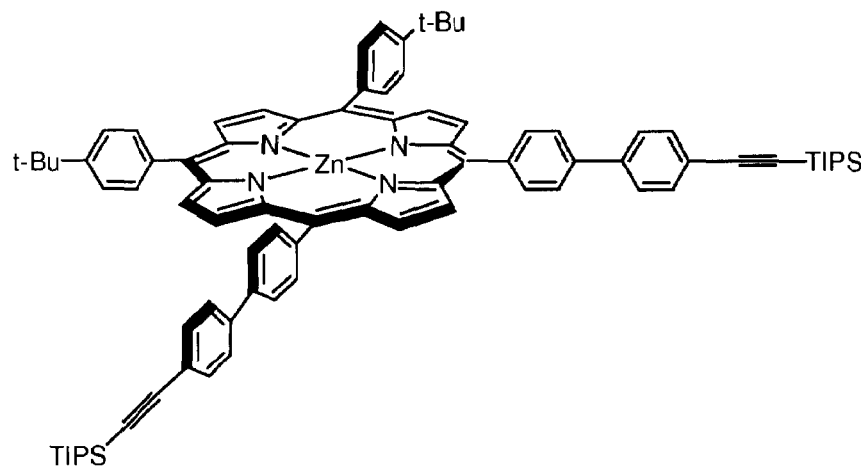
Figure 8P:
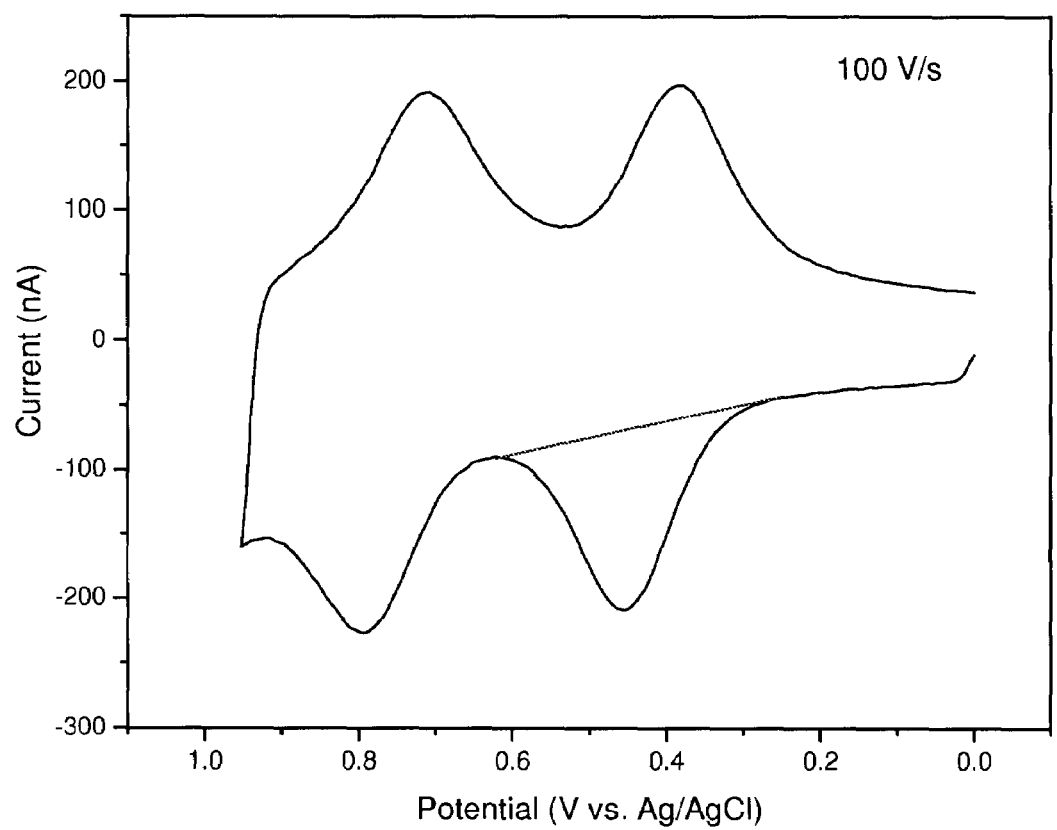
Figure 8Q:
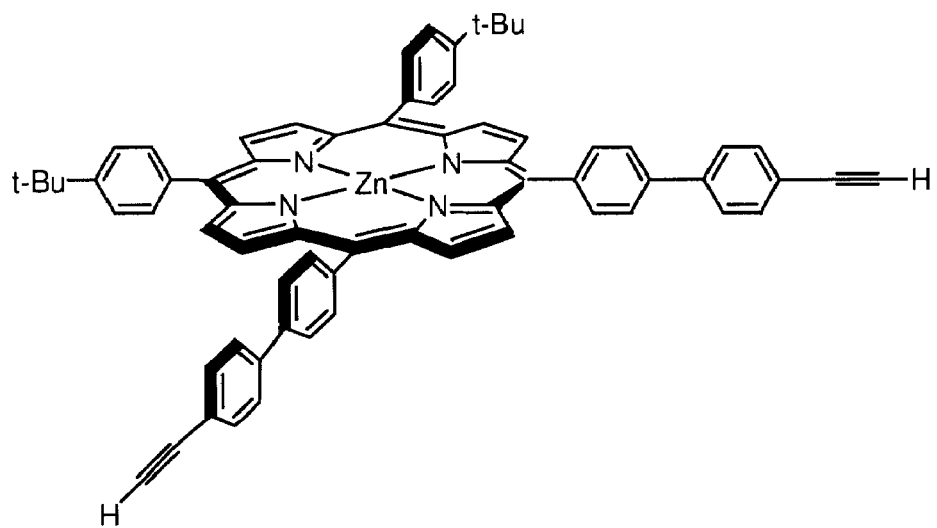
Figure 8Q:
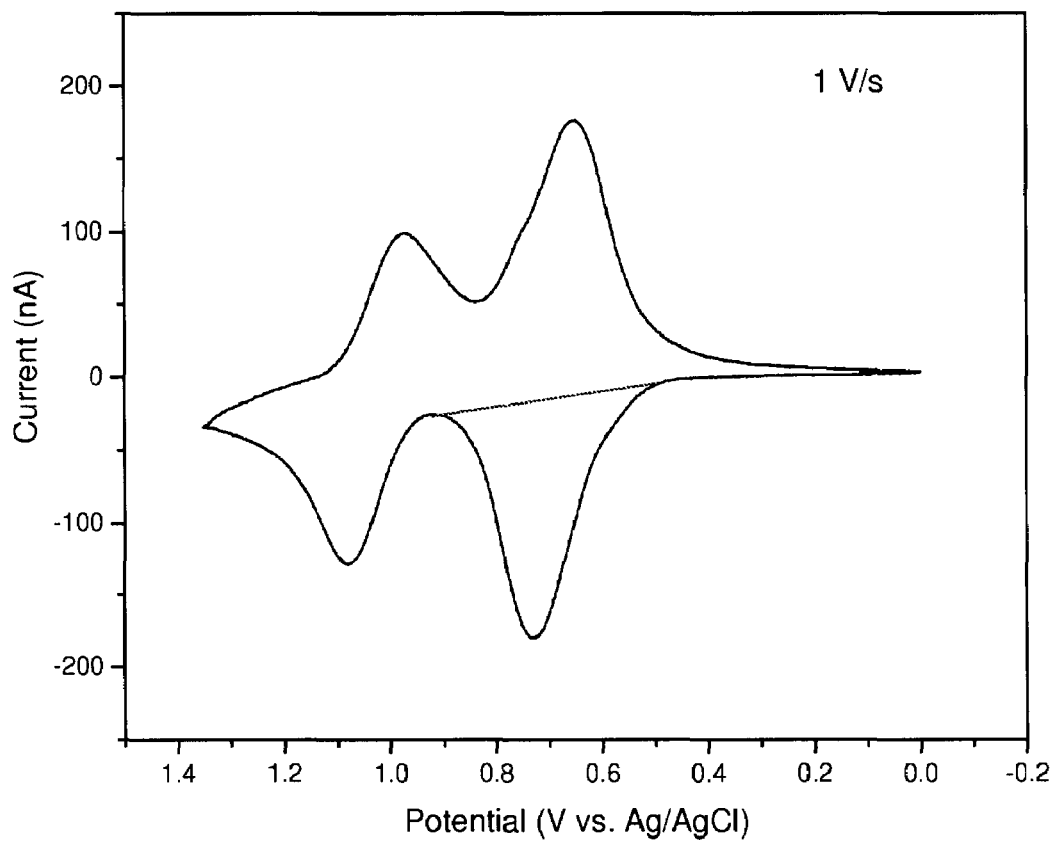

Certain particularly preferred redox-active molecules derivatized with ethyne reactive groups are illustrated in FIG. 4 and FIGS. 8A-8Q.

The suitability of particular redox-active molecules for use in the methods of this invention can readily be determined. The molecule(s) of interest are simply polymerized and coupled to a surface (e.g., a hydrogen passivated surface) according to the methods of this invention. Then sinusoidal voltammetry can be performed (e.g., as described herein or in U.S. Pat. Nos. 6,272,038, 6,212,093, and 6,208,553, PCT Publication WO 01/03126, or by (Roth et al. (2000) *Vac. Sci. Technol. B* 18: 2359-2364; Roth et al. (2003) *J. Am. Chem. Soc.* 125: 505-517) to evaluate 1) whether or not the molecule(s) coupled to the surface, 2) the degree of coverage (coupling); 3) whether or not the molecule(s) are degraded during the coupling procedure, and 4) the stability of the molecule(s) to multiple read/write operations.

It is also noted that where certain redox-active molecules decompose at particular sites at high temperature (e.g., 200° C. to 400° C.) the "reactive" site can often be derivatized with a stable protecting group. The molecule can be coupled to the surface according to the methods of this invention and the protecting group can then be chemically removed from the organic molecule.

The redox-active molecule can be provided in dried form, in a solvent, dispersion, emulsion, paste, gel, or the like. Preferred solvents, pastes, gels, emulsions, dispersions, etc., are solvents that can be applied to the Group II, II, IV, V, and/or VI material(s), and/or transition metals and/or oxides or nitrides thereof without substantially degrading that substrate and that solubilize or suspend, but do not degrade the redox-active molecule(s) that are to be coupled to the substrate. In certain embodiments, preferred solvents include high boiling point solvents (e.g., solvents with an initial boiling point greater than about 130° C., preferably greater than about 150° C., more preferably greater than about 180° C.). Such solvents include, but are not limited to benzonitrile, dimethylformamide, xylene, ortho-dichlorobenzene, and the like.

IV. Surface Attachment Groups Linker Selection and Optimizing Memory Architecture.

In certain embodiments, the redox-active polymers are attached to the substrate by a linker, preferably by an electrically conductive linker and/or are attached to each other (in the polymer) by one or more linkers. In order to achieve fast writing and/or erasing at low voltages and a small cell size, in memory devices made using the methods of this invention, the scaling of the linkers (e.g., $L^1$) can be optimized.

Optimum linker size can be calculated theoretically (see, e.g., U.S. Ser. No. 60/473,782, filed on May 27, 2003). Alternatively linkers can be evaluated empirically simply by coupling the redox-active polymer to a surface, e.g. as described herein, and performing voltammetry to evaluate the electrochemical properties of the attached polymer.

In certain embodiments, the redox-active polymer is coupled to the surface through a linker (L) and an attachment group (Z). Z may be a protected or unprotected reactive site or group on the linker. Such groups include, but are not limited to a carboxylic acid, an alcohol, a thiol, a selenol, a tellurol, a phosphonic acid, a phosphonothioate, an amine, a nitrile, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl, bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, and 2-bromoethyl. It is understood that attachment to the electrode can be accompanied by loss of a proton (or protecting group) on the reactive site Z. Z-L can be attached to a charge-storage molecule (Z-L-CSM-ethyne) or can be used directly for polymerization (Z-L-ethyne).

In certain preferred embodiments, the attachment group comprises an aryl or an alkyl group. Certain preferred aryl groups include a functional group such as bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. Certain preferred alkyls include a functional group such as bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl.

In certain embodiments the attachment groups include, but are not limited to alcohols, thiols, S-acetylthiols, bromomethyls, allyls, iodoaryls, carboxaldehydes, ethynes, and the like. In certain embodiments, the attachment groups include, but are not limited to 4-(hydroxymethyl)phenyl, 4-(S-acetylthiomethyl)phenyl, 4-(Se-acetylselenomethyl)phenyl, 4-(mercaptomethyl)phenyl, 4-(hydroselenomethyl)phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 4-[2-(4-(hydroxymethyl)phenyl)ethynyl]phenyl, 4-(ethynyl)biphen-4'-yl, 4-[2-(triisopropylsilyl)ethynyl]biphen-4'-yl, 3,5-diethynylphenyl, 2-bromoethyl, and the like. These attachment groups are meant to be illustrative and not limiting.

Examples of suitable linkers and attachment groups (L—Z—) include, but are not limited to 4-carboxyphenyl, carboxymethyl, 2-carboxyethyl, 3-carboxypropyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl)phenyl; (b) 4-hydroxyphenyl, hydroxymethyl, 2-hydroxyethyl, 3-hydroxypropyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl; (c) 4-mercaptophenyl, mercaptomethyl, 2-mercaptoethyl, 3-mercaptopropyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl; (d) 4-selenylphenyl, selenylmethyl, 2-selenylethyl, 3-selenylpropyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl)phenyl; (e) 4-tellurylphenyl, tellurylmethyl, 2-tellurylethyl, 3-tellurylpropyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl; (f) 4-(dihydroxyphosphoryl)phenyl, (dihydroxyphosphoryl)methyl, 2-(dihydroxyphosphoryl)ethyl, 3-(dihydroxyphosphoryl)propyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; (g) 4-(hydroxy(mercapto)phosphoryl)phenyl, (hydroxy(mercapto)phosphoryl)methyl, 2-(hydroxy(mercapto)phosphoryl)ethyl, 3-(hydroxy(mercapto)phosphoryl)propyl, 2-[4-(hydroxy(mercapto)phosphoryl)phenyl]ethynyl, 4-[2-[4-(hydroxy(mercapto)phosphoryl)phenyl]ethynyl]phenyl, 4-[(hydroxy(mercapto)phosphoryl)methyl]phenyl, 4-[2-(hydroxy(mercapto)phosphoryl)ethyl]phenyl, 4-[2-[4-(hydroxy(mercapto)phosphoryl)methylphenyl]ethynyl]phenyl; (h) 4-cyanophenyl, cyanomethyl, 2-cyanoethyl, 3-cyanopropyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl]phenyl; 4-cyanobiphenyl, (i) 4-aminophenyl, aminomethyl, 2-aminoethyl, 3-aminopropyl, 2-(4-aminophenyl)ethynyl, 4-[2-(4-aminophenyl)ethynyl]phenyl, 4-aminobiphenyl, and the like.

Additional surface attachment groups include, but are not limited to: 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, 2-bromoethyl, and the like.

In addition to the monodentate linker-surface attachment groups described above, multidentate linkers can be employed (see, e.g., [Nikitin (2003) *Chem. Commun.*, 282-283; Hu and Mattern (2000) *J. Org. Chem.*, 65, 2277-2281; Yao and Tour (1999) *Org. Chem.*, 64: 1968-1971; Fox et al. (1998) *Langmuir*, 14, 816-820; Galoppini and Guo (2001) *Am. Chem. Soc.*, 123: 4342-4343; Deng et al. (2002) *Org. Chem.*, 67: 5279-5283; Hecto et al. (2001) *Surface Science*, 494, 1-20; Whitesell and Chang (1993) *Science*, 261, 73-76; Galoppini et al. (2002) *J. Am. Chem. Soc.*, 67: 7801-7811; Siiman et al. *Bioconjugate Chem.*, 11: 549-556).

Tripodal linkers bearing thiol, carboxylic acid, alcohol, or phosphonic acid units are particularly attractive for firmly anchoring a molecular device in an upright configuration on a planar surface. Specific examples of such linkers are built around the triphenylmethane or tetraphenylmethane unit, including, but are not limited to: 1,1,1-tris[4-(S-acetylthiomethyl)phenyl]methyl, 4-{1,1,1-tris[4-(S-acetylthiomethyl)phenyl]methyl}phenyl, 1,1,1-tris[4-(dihydroxyphosphoryl)phenyl]methyl, 4-{1,1,1-tris[4-(dihydroxyphosphoryl)phenyl]methyl}phenyl, 1,1,1-tris[4-(dihydroxyphosphorylmethyl)phenyl]methyl, 4-{1,1,1-tris[4-(dihydroxyphosphorylmethyl)phenyl]methyl}phenyl, and the like.

The suitability of other attachment groups can readily be evaluated. A redox-active polymer bearing the attachment group(s) of interest (directly or on a linker) is coupled to a substrate (e.g., hydrogen-passivated silicon) according to the methods described herein. The efficacy of attachment can then be evaluated electrochemically, e.g., using sinusoidal voltammetry as described above.

V. Patterning the Organic Molecule(s) on the Substrate.

In certain embodiments, the methods of this invention are performed to form redox-active polymers attached to form a uniform film across the surface of the substrate. In other embodiments, the redox-active polymers are formed at one or more discrete locations on the surface. In certain embodiments, different redox-active molecules/polymers are formed at different locations on the surface.

The location at which the redox-active polymers are formed can be accomplished by any of a number of means. For example, in certain embodiments, the solution(s) comprising the organic molecule(s) can be selectively deposited at particular locations on the surface. In certain other embodiments, the solution can be uniformly deposited on the surface and selective domains can be heated. In certain embodiments, the organic molecules can be coupled to the entire surface and then selectively etched away from certain areas.

The most common approach to selectively contacting the surface with the redox-active molecule(s) involves masking the areas of the surface that are to be free of the redox-active polymers so that the solution or gas phase comprising the molecule(s) cannot come in contact with those areas. This is readily accomplished by coating the substrate with a masking material (e.g., a polymer resist) and selectively etching the resist off of areas that are to be coupled. Alternatively a photoactivatible resist can be applied to the surface and selectively activated (e.g., via UV light) in areas that are to be protected. Such "photolithographic" methods are well known in the semiconductor industry (see e.g., Van Zant (2000) *Microchip Fabrication: A Practical Guide to Semiconductor Processing*; Nishi and Doering (2000) *Handbook of Semiconductor Manufacturing Technology*; Xiao (2000) *Introduction to Semiconductor Manufacturing Technology*; Campbell (1996) *The Science and Engineering of Microelectronic Fabrication* (*Oxford Series in Electrical Engineering*), Oxford University Press, and the like). In addition, the resist can be patterned on the surface simply by contact printing the resist onto the surface.

In other approaches, the surface is uniformly contacted with the molecules. The redox-active polymers can then be selectively etched off the surface in areas that are to be molecule free. Etching methods are well know to those of skill in the art and include, but are not limited to plasma etching, laser etching, acid etching, and the like.

Other approaches involve contact printing of the reagents, e.g., using a contact print head shaped to selectively deposit the reagent(s) in regions that are to be coupled, use of an inkjet apparatus (see e.g., U.S. Pat. No. 6,221,653) to selectively deposit reagents in particular areas, use of dams to selectively confine reagents to particular regions, and the like.

In certain preferred embodiments, the attachment/polymerization reaction is repeated several times. After the reaction(s) are complete, uncoupled organic molecules are washed off of the surface, e.g., using standard wash steps (e.g., benzonitrile wash followed by sonication in dry methylene chloride).

The foregoing methods are intended to be illustrative. In view of the teachings provided herein, other approaches will be evident to those of skill in the semiconductor fabrication arts.

VI. Industrial Scale-Up.

Figure 5:
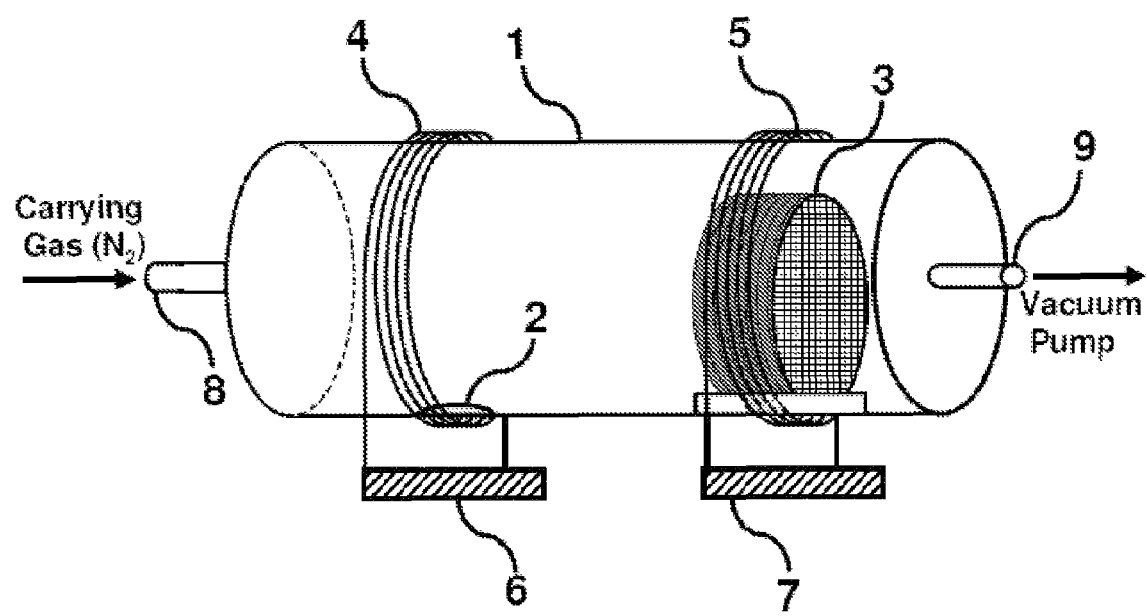
FIG. 5 illustrates a two-zone furnace for gas phase molecular attachment.

The methods of this invention are readily scaled up for use in commercial manufacturing operations. One such scaled-up approach is illustrated in FIG. 5. This figure illustrates a two-zone furnace 1 for gas phase molecular attachment. In this device, the molecule powder 2 is kept in one zone and the wafers 3 are kept in a different zone. Each zone can be individually heated (e.g. by a heater(s) 4, 5 that can be independently regulated by a single heater control or by separate heater controls (6 and 7 in the illustration). Each zone can be independently heated to the required temperature. One can control the molecule vapor pressure by changing the temperature. This system also allows the use of a carrier gas (e.g. Ar, $N_2$, etc.), fed through a gas inlet 8, through the oven to a gas outlet 9, which can be used to transport the molecule vapors to the wafers in other zone. This furnace can also be operated at low pressures (sub-atmospheric) by evacuating the system with a pump at the outlet of carrier gas. The low pressure process allows the molecule vapor pressure to be controlled very precisely. Also, it reduces the amount of impurities compared to the atmospheric process.

Figure 6:
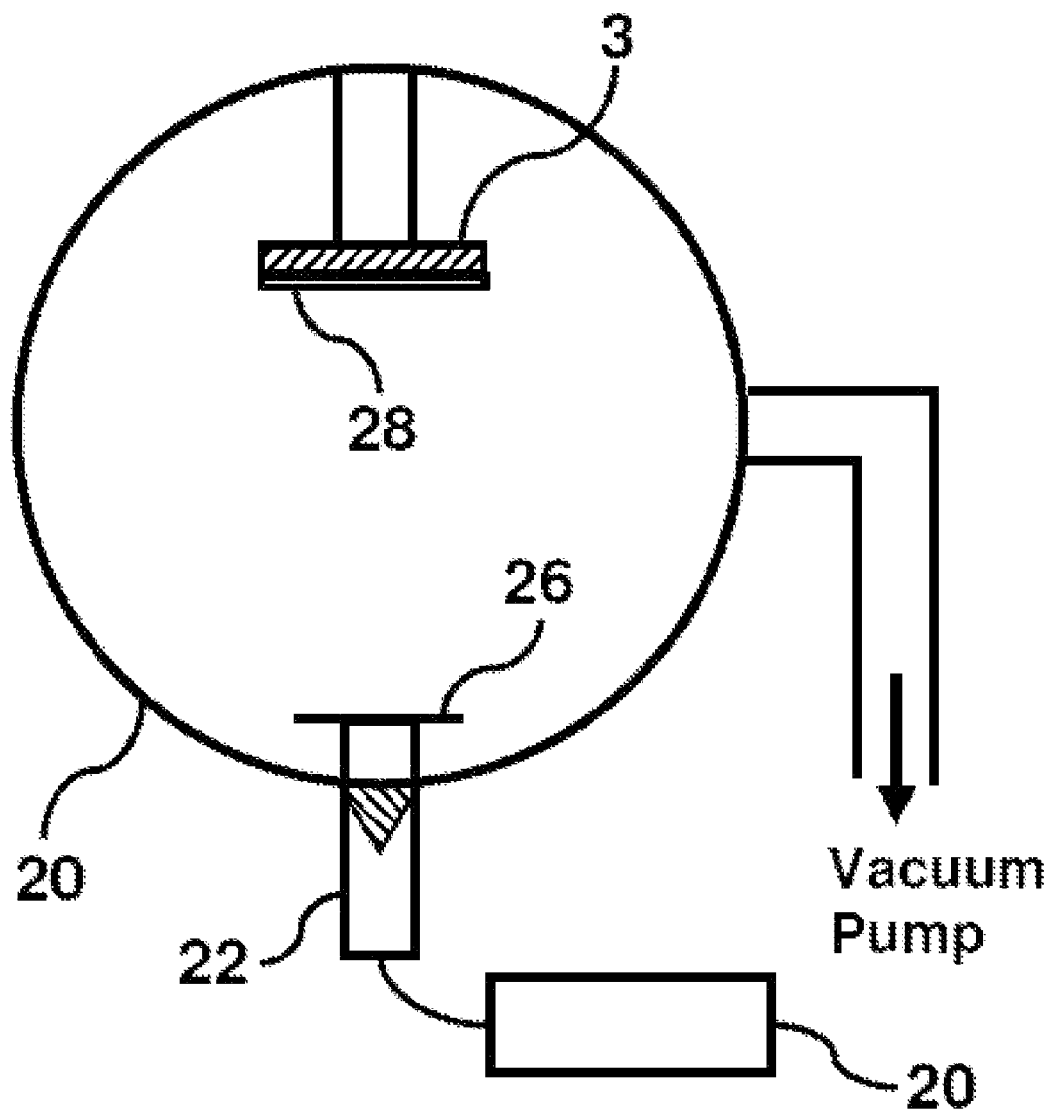
FIG. 6 illustrates an epitaxy system utilizing a K-cell for attachment of organic molecules to a substrate.

Another equipment configuration, illustrated FIG. 6, is suitable for high vacuum operation of the gas phase molecular attachment method. In this approach, the substrate 3 is placed in a vacuum furnace chamber 20. The molecule(s) that are to be attached are kept in an effusion cell (e.g. a knudson-cell (K-cell), for example the Low Temperature Effusion Cell by Specs) 22 which is controlled by an effusion cell controller 24. By opening and closing the shutter 26 on the K-cell, one can control the amount of molecules that can reach the substrate surface and form an attached monolayer 28.

These methods are meant to be illustrative and not limiting. Using the teachings provided herein, one of skill in the art can devise numerous approaches for heating and contacting the molecules described herein with a surface. Devices and methods for heating and/or volatilizing the heat-resistant molecules or mixtures of such molecules and patterning or uniformly depositing them on a surface at elevated temperature are commercially available and well known to those of skill in the art. Such methods include, but are not limited to molecular beam epitaxy (MBE) (equipment available for example, from SPECS Scientific Instruments, Inc., Florida), chemical vapor deposition (CVD) (equipment available, for example, from CVD Equipment Corp.), Liquid Phase Epitaxial deposition (LPE) (equipment available, for example, from CVD Equipment Corp., Ronkonkoma, N.Y.), and the like.

VII. Uses of Redox-Active Polymers Coupled to a Substrate.

The methods of this invention can be used to form redox-active polymers covalently attached to a Group II, III, IV, V, or VI material surface, preferably to a Group III, IV, or V surface and/or to a transition metal (or metal oxide or nitride) surface.

The attached redox-active polymers can be used to fabricate a wide variety of hybrid components and/or devices (e.g. field effect transistors, sensors, memory elements, etc.). In certain embodiments, the methods are used to assemble hybrid memory devices where information is stored in a redox-active information storage molecule.

In "molecular memory" redox-active molecules (molecules having one or more non-zero redox states) coupled to the transition metals and/or Group II, III, IV, V, or VI materials described herein are used to store bits (e.g., each redox state can represent a bit). The redox-active molecule attached to the substrate material (e.g., silicon, germanium, etc.) forms a storage cell capable of storing one or more bits in various oxidation states. In certain embodiments, the storage cell is characterized by a fixed electrode electrically coupled to a "storage medium" comprising one or more redox-active molecules and having a multiplicity of different and distinguishable oxidation states. Data is stored in the (preferably non-neutral) oxidation states by the addition or withdrawal of one or more electrons from said storage medium via the electrically coupled electrode. The oxidation state of the redox-active molecule(s) can be set and/or read using electrochemical methods (e.g., cyclic voltammetry), e.g., as described in U.S. Pat. Nos. 6,272,038, 6,212,093, and 6,208,553 and PCT Publication WO 01/03126.

Because transition metals and group II, III, IV, V, and VI materials, in particular group IV materials (e.g., silicon, germanium, etc.), are commonly used in electronic chip fabrication, the methods provided herein readily lend themselves to the fabrication of molecular memory chips compatible with existing processing/fabrication technologies. In addition, details on the construction and use of storage cells comprising redox-active molecules can be found, in U.S. Pat. Nos. 6,272, 038, 6,212,093, and 6,208,553 and PCT Publication WO 01/03126.

VIII. Use of the Storage Device in Computer Systems.

Figure 7A:
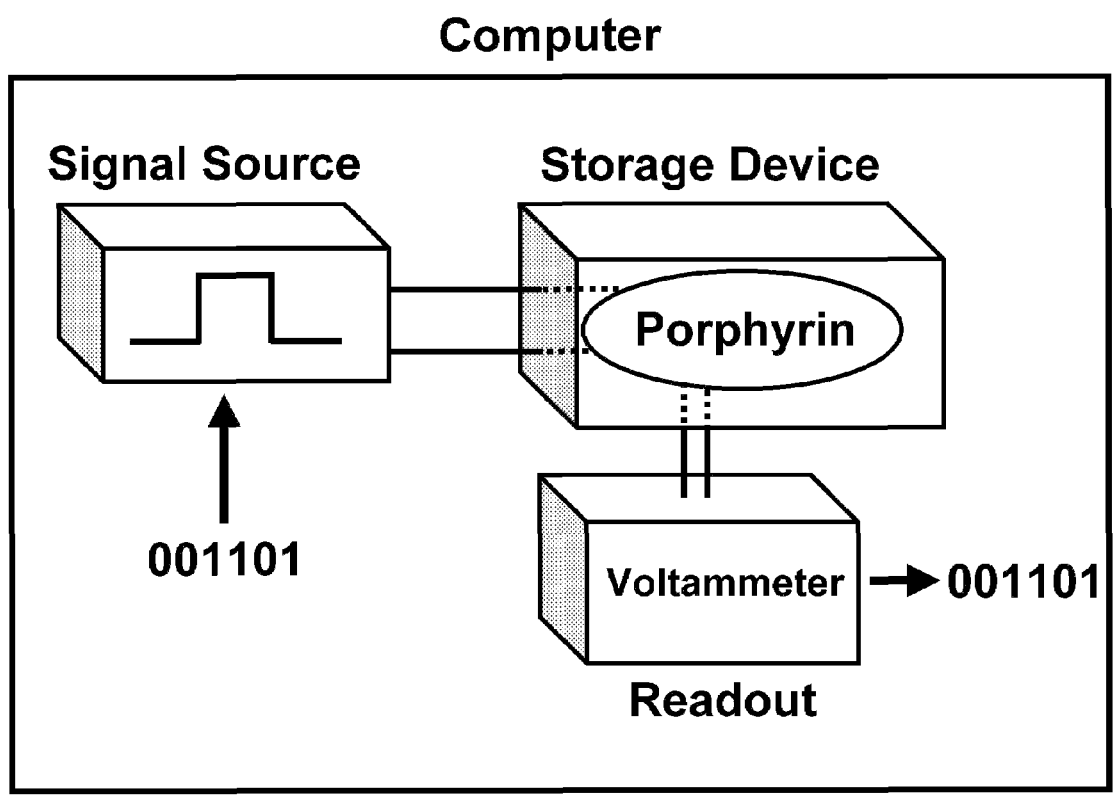
FIGS. 7A and 7B illustrate a computer system embodying the memory devices described herein. Typically the memory device will be fabricated as a sealed "chip". Ancillary circuitry on the chip and/or in the computer permits writing bits into the memory and retrieving the written information as desired.

The use of the storage devices fabricated according to the methods of this invention in computer systems is contemplated. One such computer system is illustrated in FIG. 7A. The computer comprises a signal source (e.g. I/O device or CPU), a storage device of this invention and appropriate circuitry (e.g. voltammetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the I/O circuitry and the information is passed off to other elements (e.g. CPU) in the computer.

Figure 7B:
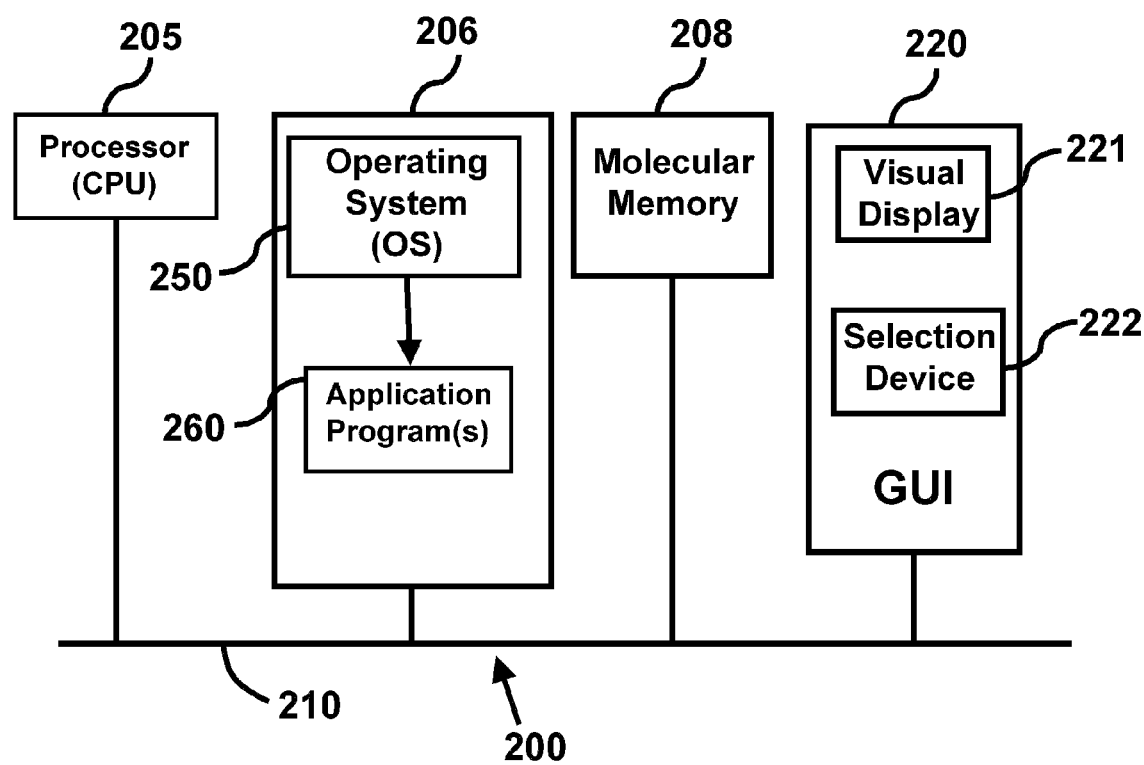

FIG. 7B illustrates the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the elements shown in FIG. 7A. System 200 can further include additional hardware components (not shown).

System 200 can be, for example, a personal computer or workstation. Processor 205 can be, for example, a microprocessor, such as the 80386, 80486 or Pentium™ microprocessor, made by Intel Corp. (Santa Clara, Calif.). Memory 206 can include, for example, random-access memory (RAM), read-only memory (ROM), virtual memory, molecular memory (FIG. 11) or any other working storage medium or media accessible, by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 150 can be, for example, the Microsoft® Windows™ 95 operating system for IBM PC and compatible computers having or emulating Intel 80386, 80486, or Pentium™ processors. Alternatively, the operating system can be specialized for operation utilizing molecular memory elements. Application program 160 is any application compatible with the operating system and system 200 architecture. Persons of skill in the art will appreciate that a wide range of hardware and software configurations can support the system and method of the present invention in various specific embodiments.

EXAMPLES

The following examples are offered to illustrate, but not to limit the claimed invention.

Example 1

Cyclic Voltammetry and Coverage Summary of Redox-Active Molecules Containing Ethynyl Groups Porphyrins bearing two (or more) ethynyl groups were made to polymerize under the conditions that we typically employ for forming monolayers on Si (or other) surfaces. The porphyrins were dissolved in a small quantity of organic solvent. Then a small drop of the solvent containing the molecules was deposited on a silicon substrate. The substrate was baked (e.g., at 200° C. to 400° C.) under an inert (argon) atmosphere. The porphyrins formed porphyrin polymers covalently linked to the silicon surface. The polymers were electrochemically robust and exhibit charge-retention times that are comparable (or longer) than those of monolayers of the same molecules.

Figure 2:
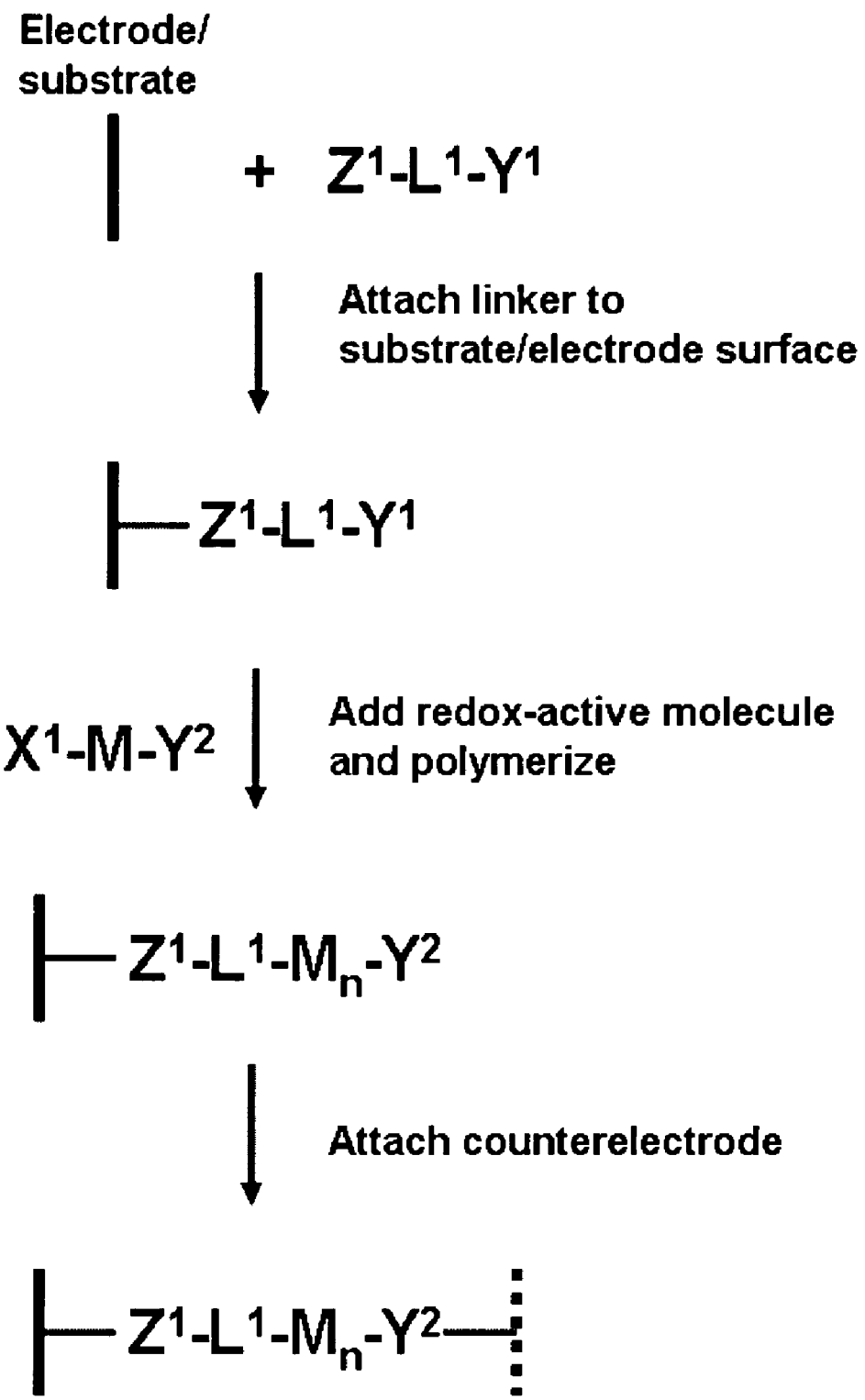
FIG. 2 illustrates a "multi-step" method of polymerization and attachment of redox-active molecules to a substrate.

FIG. 1 shows the series of molecules that were investigated for polymerization. The polymer can be readily detected electrochemically because the surface coverage is dramatically higher than that exhibited by a monolayer. In particular, porphyrin monolayers on Si do not exceed a surface coverage of $\sim 10^{-10}$ mol cm$^{-2}$. This behavior is shown by molecule No. 184, which contains a single ethynyl group. In contrast, molecules 192 and 197, which contain two ethynyl groups in a cis- or trans-configuration, exhibit surface coverages that are more than 50-fold larger. On the other hand, when more than two ethynyl groups are present, polymerization occurs but the voltammetric response is poorer (molecules No. 199 and 204). The poor voltammetric response is likely due to extensive cross-linking of the molecules that are growing off the surface. We anticipate that the extent of cross-linking can be controlled by molecular design and adjustment of the details of the preparation procedures.

Note that porphyrins bearing a suitable pattern of free ethynes (RCCH) afford polymerization while those with capped ethynes do not. The difference in reactivity is evidenced by comparison of molecules No. 217 (free ethynes; film) and No. 216 (TIPS capped ethynes; SAM); and molecules No. 219 (free ethynes; film) and No. 218 (TMS capped ethynes; SAM).

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of patterning redox-active polymers on a surface to form surface-bound redox-active polymers, said method comprising:
    providing redox-active molecules bearing at least a first reactive site or group and a second reactive site or group, wherein said first reactive site or group is a species reactive with said second reactive site or group and said first reactive site or group and said second reactive site or group are the same species; and
    contacting said surface with said redox-active molecules, where said contacting is under conditions that result in attachment of said redox-active molecules to said surface via said first reactive site or group, and attachment of redox-active molecules directly to each other via a reaction between the first reactive site or group on one redox-active molecule and the second reactive site or group on the attached redox-active molecule, thereby forming a polymer attached to said surface where said polymers comprise at least two of said redox-active molecules.

2. The method of claim 1, wherein said first reactive site or group and/or said second reactive site or group is attached to said redox-active molecule by a linker.

3. The method of claim 1, wherein said first reactive site or group is an ethynyl group.

4. The method of claim 3, wherein said second reactive site or group is an ethynyl group.

5. The method of any of claim 3 or 4, wherein said ethynyl group is an ethynyl group selected from the group consisting of ethynyl, 4-ethynylphenyl, 3-ethynylphenyl, 4-ethynylbiphenyl, 3-ethynylphenyl, 4-ethynylterphenyl, and 3-ethynylterphenyl.

6. The method of claim 1, wherein said redox-active molecule is selected from the group consisting of a porphyrinic macrocycle, a porphyrin, a sandwich coordination compound of porphyrinic macrocycles, and a metallocene.

7. The method of claim 1, wherein said redox-active molecule is selected from the group consisting of a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide.

8. The method of claim 1, wherein said redox-active molecule is a porphyrin comprising a substituent selected from the group consisting of: aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

9. The method of claim 1, wherein said redox-active molecule is a porphyrin comprising a substituent selected from the group consisting of: 4-methylphenyl, 4-t-butylphenyl, 4-trifluoromethylphenyl, pentyl, and H (no substituent).

10. The method of claim 1, wherein said redox-active molecule is a phthalocyanine comprising a substituent selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

11. The method of claim 1, wherein said redox-active molecule is a phthalocyanine comprising a substituent selected from the group consisting of methyl, t-butyl, butoxy, fluoro, and H (no substituent).

12. The method of claim 1, wherein said redox-active molecule is selected from the group consisting of:
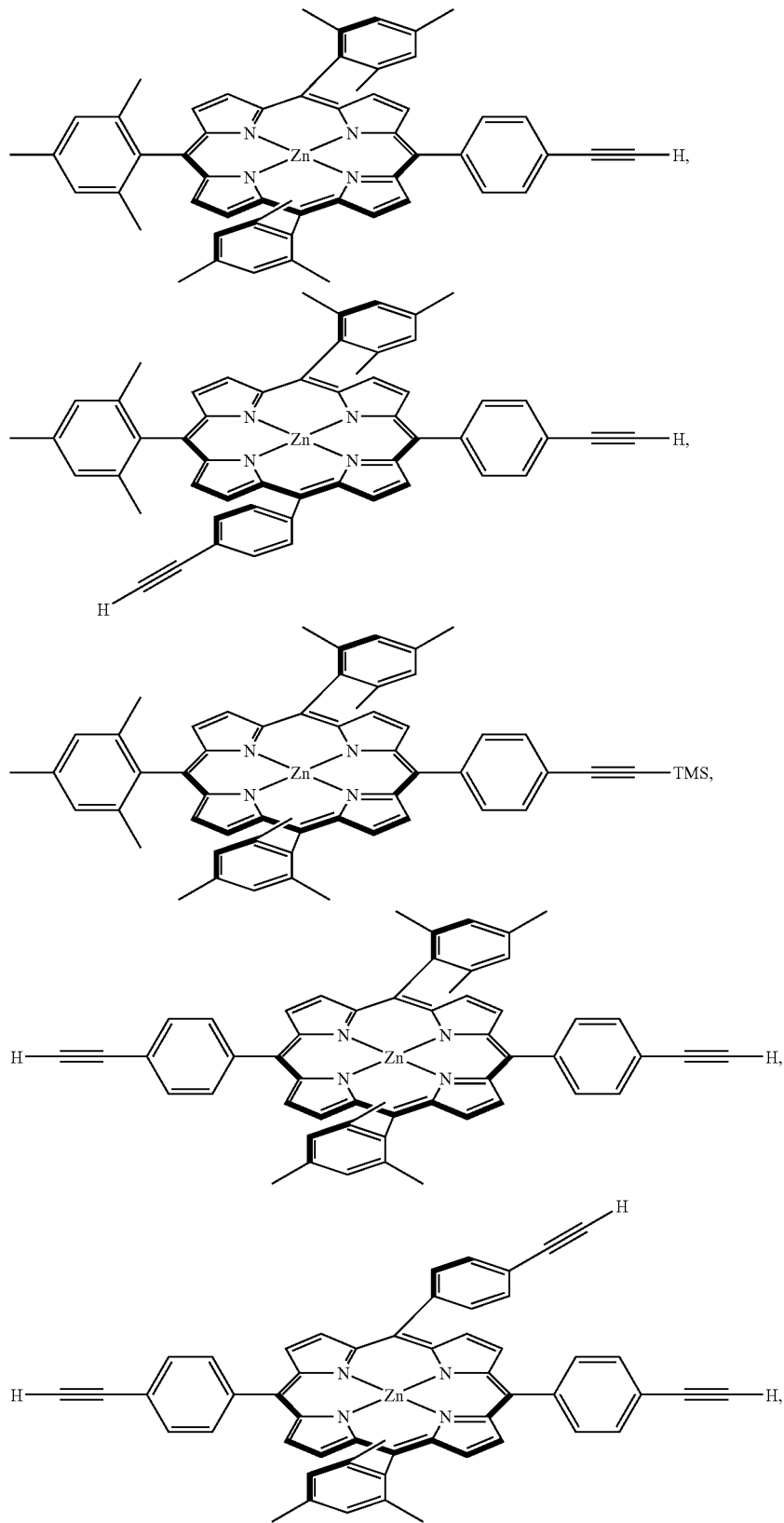

-continued
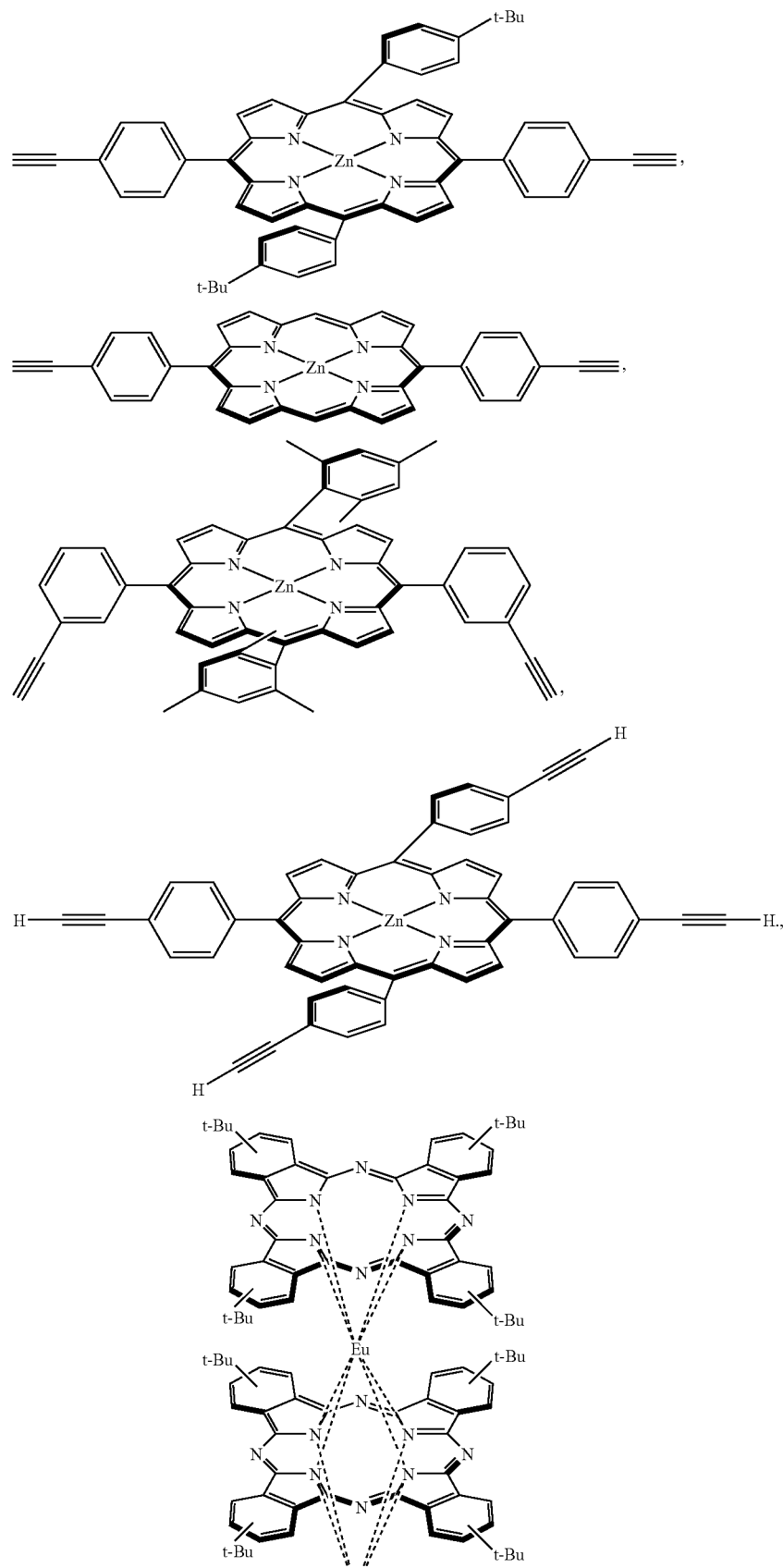

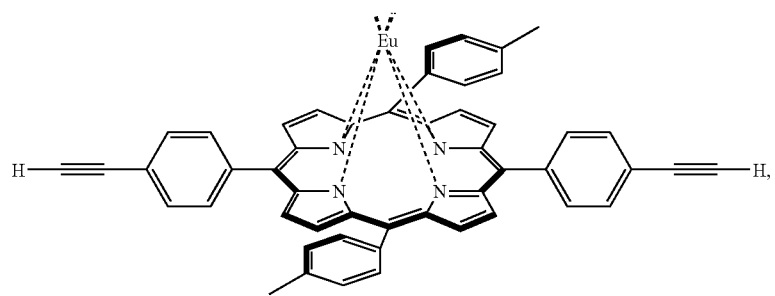
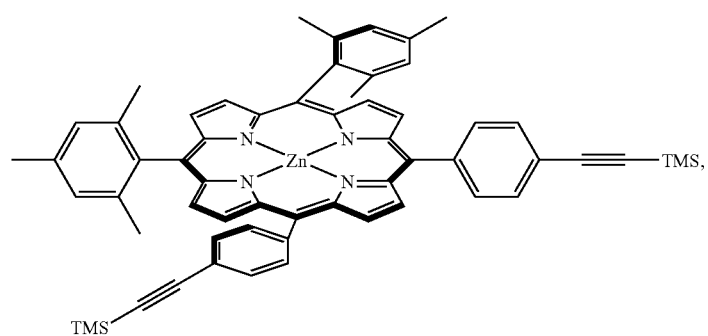
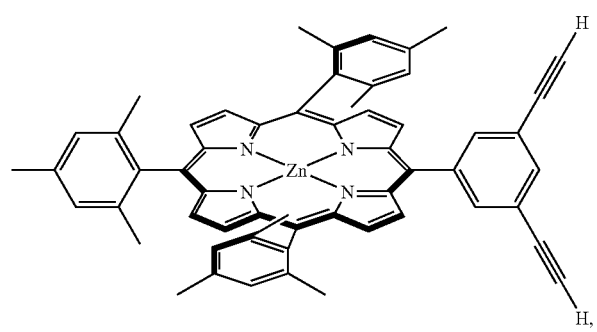
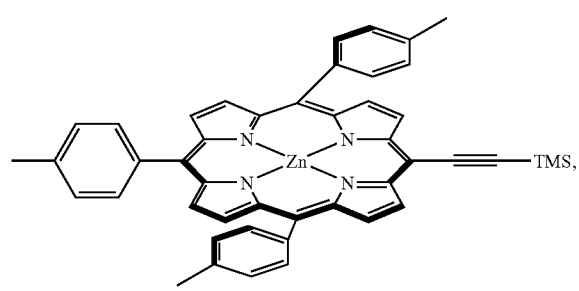
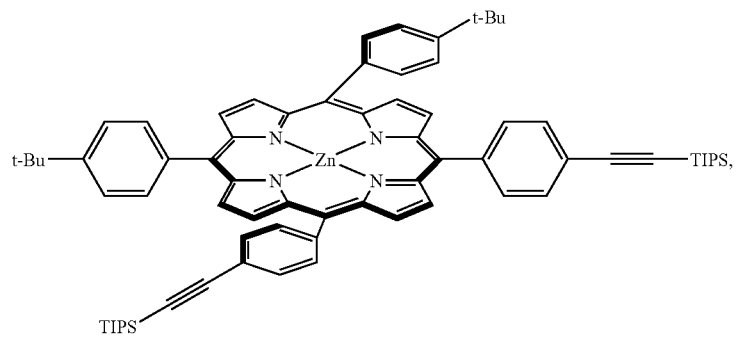

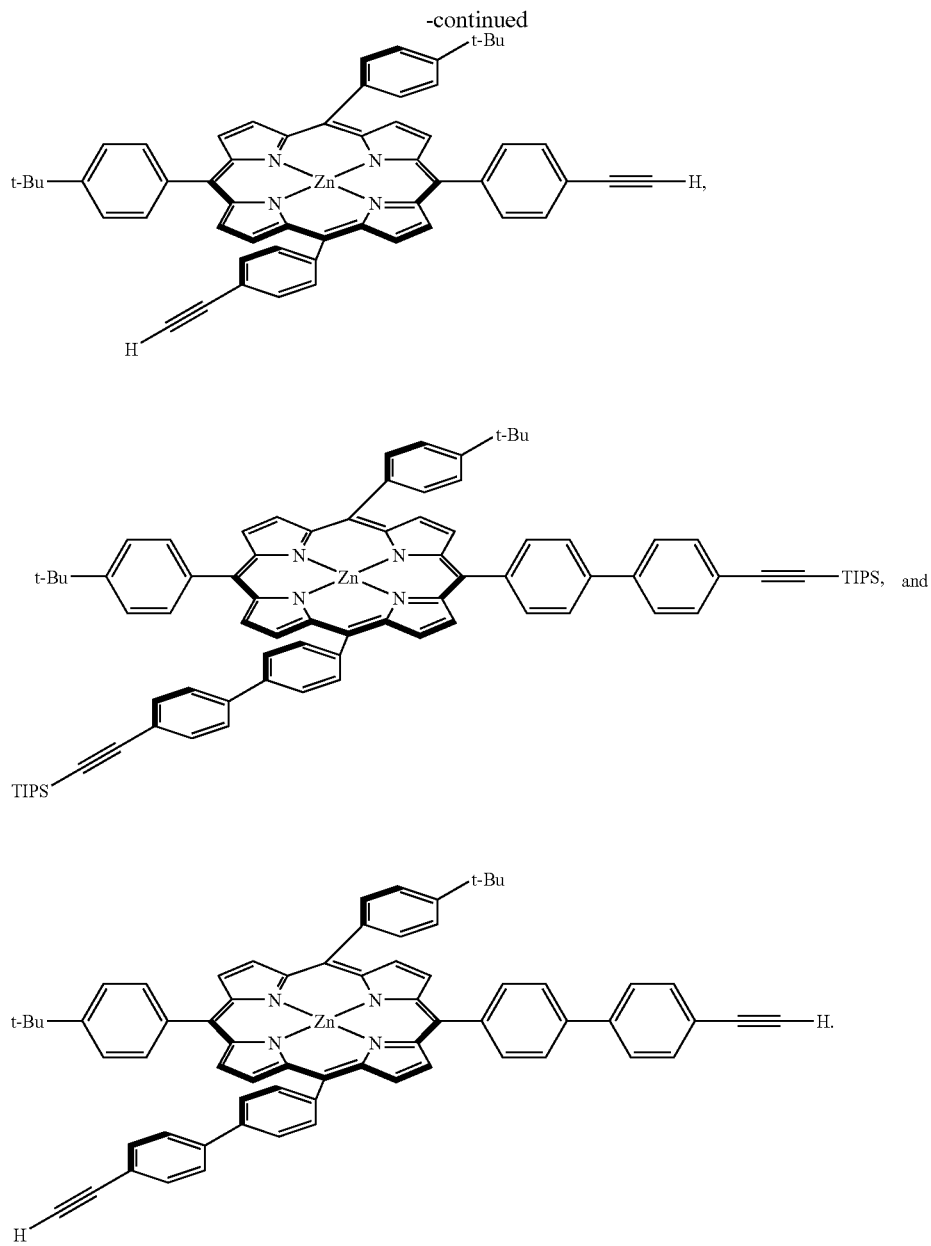

13. The method of claim 1, wherein said contacting comprises contacting said surface with a linker having the formula

Y$^1$—L$^1$—Z$^1$ wherein

Z$^1$ is a surface attachment group;

L$^1$ is a covalent bond or a linker; and

Y$^1$ is a protected or unprotected reactive site or group;

whereby said linker attaches to said surface; and contacting the attached linker with said redox-active molecules whereby the redox-active molecules couple to each other via said first and/or said second reactive site or group and the redox-active molecules couple to the linker through Y$^1$ and said first and/or said second reactive site or group thereby forming a polymer attached to said linker where said polymer comprises at least two of said redox-active molecules.

14. The method of claim 13, wherein Z$^1$ is a protected or unprotected reactive site or group selected from the group consisting of a carboxylic acid, an alcohol, a thiol, a selenol, a tellurol, a phosphonic acid, a phosphonothioate, an amine, a nitrile, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl, bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, and 2-bromoethyl.

15. The method of claim 13, wherein —L$^1$—Z$^1$— is selected from the group consisting of 4-carboxyphenyl, carboxymethyl, 2-carboxyethyl, 3-carboxypropyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl)phenyl; 4-hydroxyphenyl, hydroxymethyl, 2-hydroxyethyl, 3-hydroxypropyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl; 4-mercaptophenyl, mercaptomethyl, 2-mercaptoethyl, 3-mercaptopropyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl) ethynyl)phenyl; 4-selenylphenyl, selenylmethyl, 2-selenylethyl, 3-selenylpropyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl)phenyl; 4-tellurylphenyl, tellurylmethyl, 2-tellurylethyl, 3-tellurylpropyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl; 4-(dihydroxyphosphoryl)phenyl, (dihydroxyphosphoryl)methyl, 2-(dihydroxyphosphoryl)ethyl, 3-(dihydroxyphosphoryl)propyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl) ethyl]phenyl, 4-[2-[4-(dihydroxyphosphoryl)methylphenyl] ethynyl]phenyl; 4-(hydroxy(mercapto)phosphoryl)phenyl, (hydroxy(mercapto)phosphoryl)methyl, 2-(hydroxy(mercapto)phosphoryl)ethyl, 3-(hydroxy(mercapto)phosphoryl) propyl, 2-[4-(hydroxy(mercapto)phosphoryl)phenyl]ethynyl, 4-[2-[4-(hydroxy(mercapto)phosphoryl)phenyl] ethynyl]phenyl, 4-[(hydroxy(mercapto)phosphoryl)methyl] phenyl, 4-[2-(hydroxy(mercapto)phosphoryl)ethyl]phenyl, 4-[2-[4-(hydroxy(mercapto)phosphoryl)methylphenyl]ethynyl]phenyl; 4-cyanophenyl, cyanomethyl, 2-cyanoethyl, 3-cyanopropyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl; 4-cyanobiphenyl, 4-aminophenyl, aminomethyl, 2-aminoethyl, 3-aminopropyl, 2-(4-aminophenyl)ethynyl, 4-[2-(4-aminophenyl)ethynyl]phenyl, and 4-aminobiphenyl.

16. The method of claim 13, wherein L is selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4"-terphenyl.

17. The method of claim 13, wherein said method further comprises attaching a counterelectrode to said polymer.

18. The method of claim 17, wherein said counterelectrode is attached directly to said polymer.

19. The method of claim 17, wherein said counterelectrode is attached to said polymer through a linker.

20. The method of claim 13, wherein said redox-active molecules further comprise redox-active molecules having only one available reactive group or site.

21. The method of claim 20, wherein said redox-active molecules having only one available reactive group or site comprise a second reactive group or site that is blocked.

22. The method of claim 1, wherein said surface comprises a material selected from the group consisting of a Group III element, a Group IV element, a Group V element, a doped Group III element, a doped Group IV element, a doped Group V element, a transition metal, a transition metal oxide, and a transition metal nitride.

23. The method of claim 22, wherein said surface comprises a material selected from the group consisting of silicon, germanium, doped silicon, and doped germanium.

24. The method of claim 22, wherein said surface is a hydrogen passivated surface.

25. A method of patterning redox-active polymers on a surface to form surface-bound redox-active polymers, said method comprising:
providing a surface having attached thereto a linker bearing a reactive site or group and/or a redox-active molecule bearing a reactive site or group;
providing redox-active molecules bearing at least a first reactive site or group and a second reactive site or group, wherein said first reactive site or group is a species reactive with said second reactive site or group, and said first reactive site or group and said second reactive site or group are the same species; and
contacting said surface with said redox-active molecules, where said contacting is under conditions that result in the attachment of redox-active molecules to the linker via the first reactive site, and attachment of redox active molecules directly to each other via a reaction between the first reactive site or group on one redox-active molecule and the second reactive site or group on the attached redox-active molecule, thereby forming polymers attached to said surface where said polymers comprise at least two of said redox-active molecules.

26. The method of claim 25, wherein said first reactive site or group and/or said second reactive site or group is attached to said redox-active molecule by a linker.

27. The method of claim 25, wherein said first reactive site or group is an ethynyl group.

28. The method of claim 27, wherein said second reactive site or group is an ethynyl group.

29. The method of any of claim 27 or 28, wherein said ethynyl group is an ethynyl group selected from the group consisting of ethynyl, 4-ethynylphenyl, 3-ethynylphenyl, 4-ethynylbiphenyl, 3-ethynylphenyl, 4-ethynylterphenyl, and 3-ethynylterbiphenyl.

30. The method of claim 25, wherein said redox-active molecule is selected from the group consisting of a porphyrinic macrocycle, a porphyrin, a sandwich coordination compound of porphyrinic macrocycles, and a metallocene.

31. The method of claim 25, wherein said redox-active molecule is selected from the group consisting of a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide.

32. The method of claim 25, wherein said redox-active molecule is a porphyrin comprising a substituent selected from the group consisting of: aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

33. The method of claim 25, wherein said redox-active molecule is a porphyrin comprising a substituent selected from the group consisting of: 4-methylphenyl, 4-t-butylphenyl, 4-trifluoromethylphenyl, pentyl, and H (no substituent).

34. The method of claim 25, wherein said redox-active molecule is a phthalocyanine comprising a substituent selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

35. The method of claim 25, wherein said redox-active molecule is a phthalocyanine comprising a substituent selected from the group consisting of methyl, t-butyl, butoxy, fluoro, and H (no substituent).

36. The method of claim 25, wherein said redox-active molecule is a molecule selected from the group consisting of:

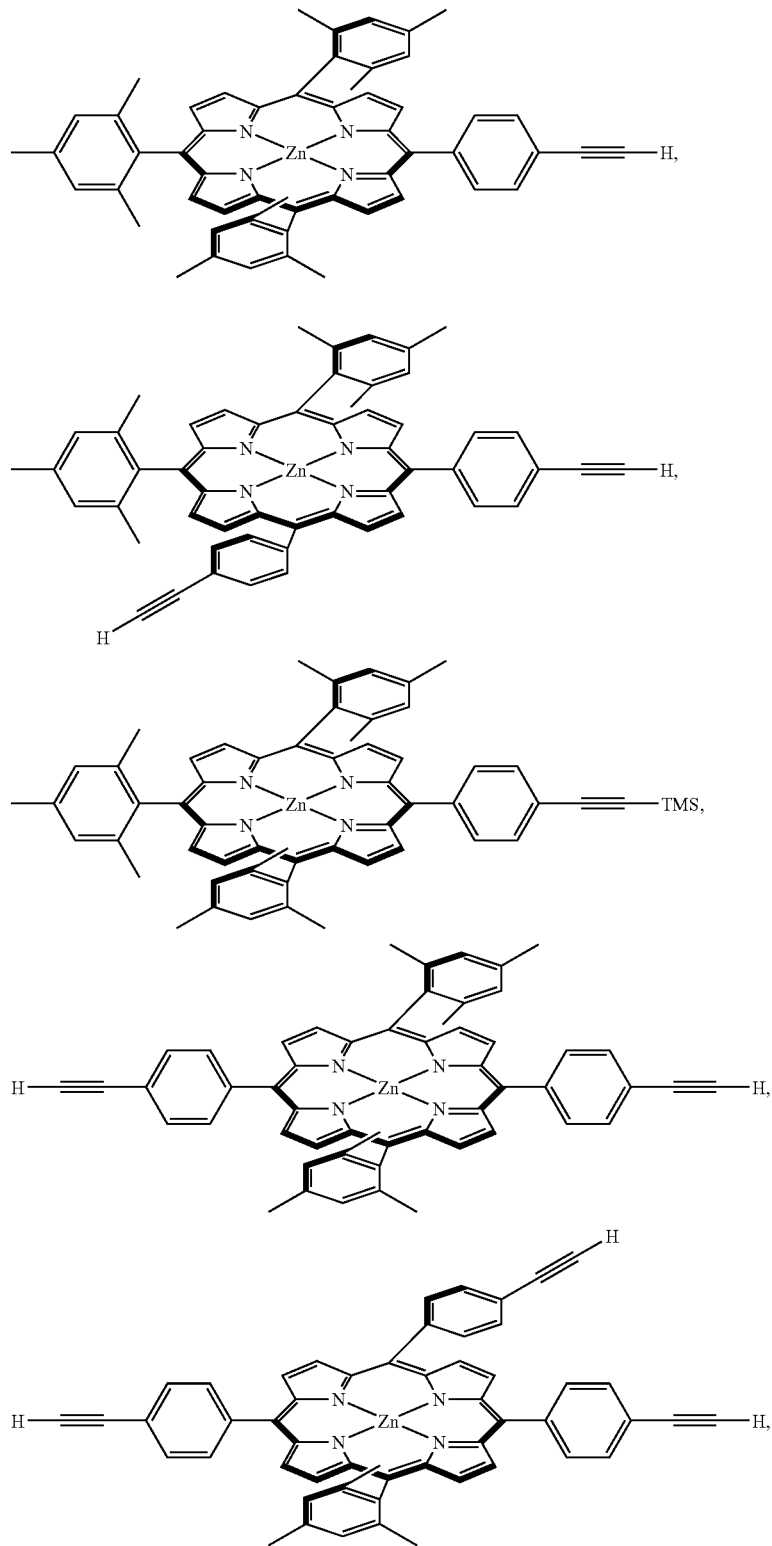

-continued
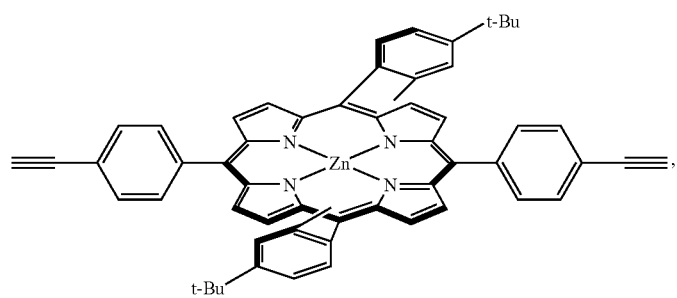
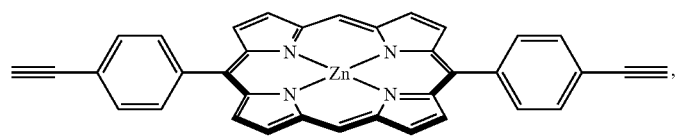
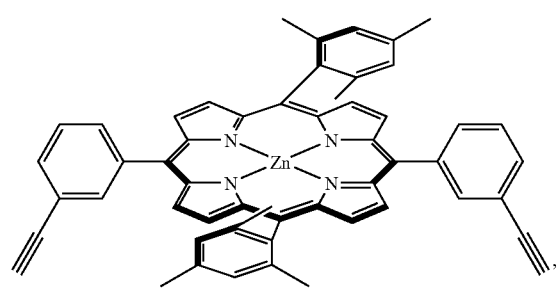
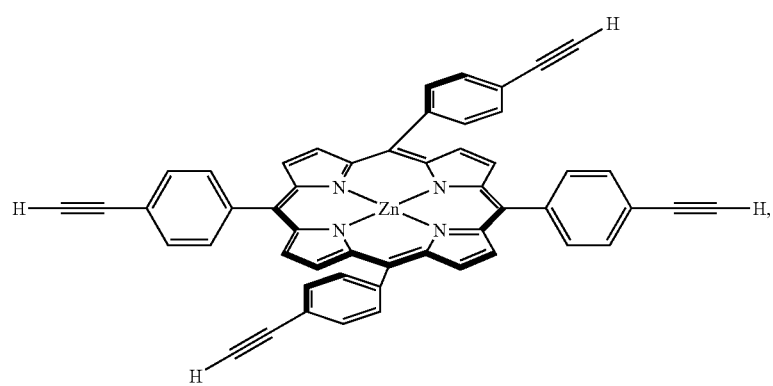
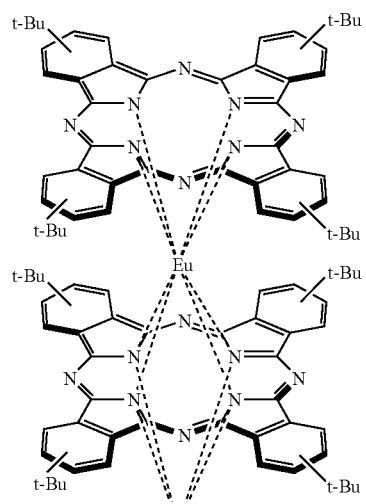

-continued
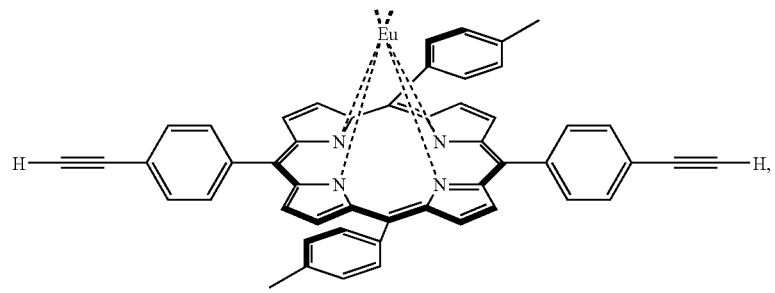
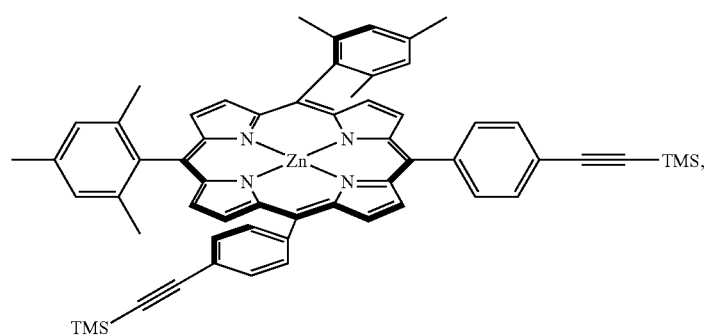
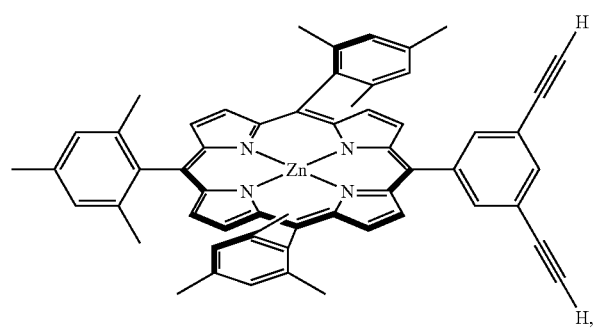
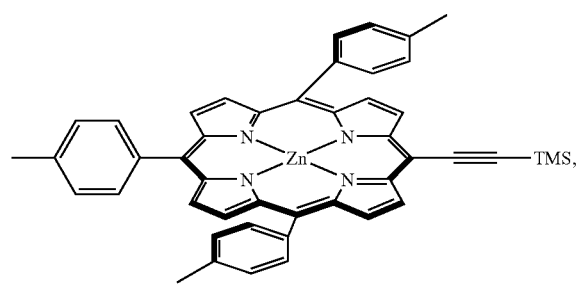
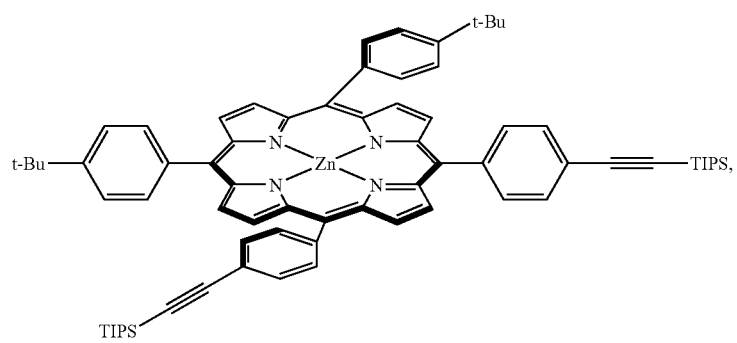

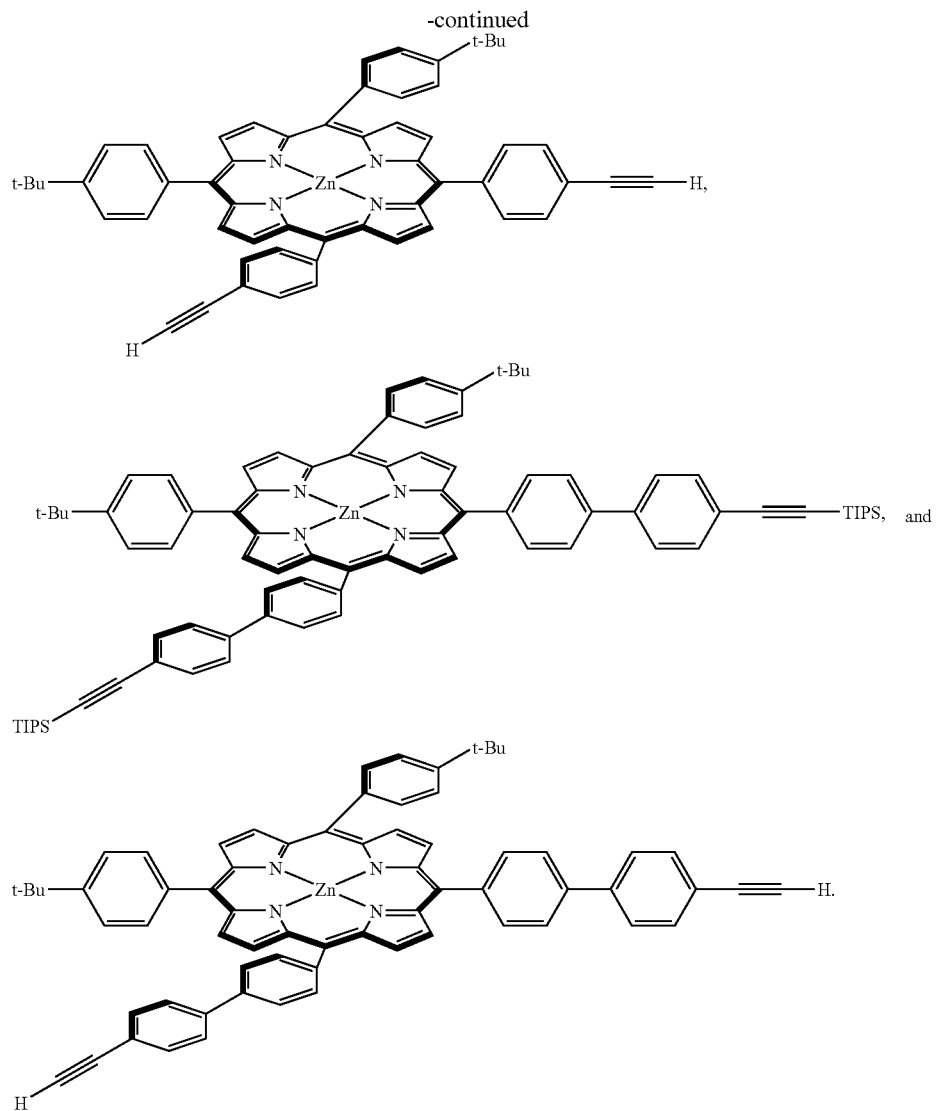

37. The method of claim 25, wherein said providing comprises providing a surface having attached thereto a linker whereby said surface and linker have the formula $$S-Z^1-L^1-Y^1$$

wherein
S is the surface;
$Z^1$ is a surface attachment group;
$L^1$ is a covalent bond or a linker; and
$Y^1$ is a protected or unprotected reactive site or group.

38. The method of claim 37, wherein $Y^1$ is a protected reactive site our group and said method further comprises deprotecting $Y^1$.

39. The method of claim 37, wherein $Z^1$, before coupling to said surface, is a protected or unprotected reactive site or group selected from the group consisting of a carboxylic acid, an alcohol, a thiol, a selenol, a tellurol, a phosphonic acid, a phosphonothioate, an amine, a nitrile, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl, bromo, iodo, formyl, bromomethyl, chloromethyl, ethynyl, vinyl, allyl, 4-(ethynyl)biphen-4'-yl, 4-[2-(triisopropylsilyl) ethynyl]biphen-4'-yl, 3,5-diethynylphenyl, and 2-bromoethyl.

40. The method of claim 37, wherein $Z^1-L^1$, before coupling to said surface, is selected from the group consisting of 4-carboxyphenyl, carboxymethyl, 2-carboxyethyl, 3-carboxypropyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl) phenyl; 4-hydroxyphenyl, hydroxymethyl, 2-hydroxyethyl, 3-hydroxypropyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl; 4-mercaptophenyl, mercaptomethyl, 2-mercaptoethyl, 3-mercaptopropyl, 2-(4-mercaptophenyl)ethynyl, 4-(2-(4-mercaptophenyl)ethynyl) phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl; 4-selenylphenyl, selenylmethyl, 2-selenylethyl, 3-selenylpropyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl)phenyl; 4-tellurylphenyl, tellurylmethyl, 2-tellurylethyl, 3-tellurylpropyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl;

4-(dihydroxyphosphoryl)phenyl, (dihydroxyphosphoryl)methyl, 2-(dihydroxyphosphoryl)ethyl, 3-(dihydroxyphosphoryl)propyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, (hydroxy(mercapto)phosphoryl)methyl, 2-(hydroxy(mercapto)phosphoryl)ethyl, 3-(hydroxy(mercapto)phosphoryl)propyl, 2-[4-(hydroxy(mercapto)phosphoryl)phenyl]ethynyl, 4-[2-[4-(hydroxy(mercapto)phosphoryl)phenyl]ethynyl]phenyl, 4-[(hydroxy(mercapto)phosphoryl)methyl]phenyl, 4-[2-(hydroxy(mercapto)phosphoryl)ethyl]phenyl, 4-[2-[4-(hydroxy(mercapto)phosphoryl)methylphenyl]ethynyl]phenyl; 4-cyanophenyl, cyanomethyl, 2-cyanoethyl, 3-cyanopropyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl]phenyl; 4-cyanobiphenyl, 4-aminophenyl, aminomethyl, 2-aminoethyl, 3-aminopropyl, 2-(4-aminophenyl)ethynyl, 4-[2-(4-aminophenyl)ethynyl]phenyl, and 4-aminobiphenyl.

41. The method of claim 37, wherein $L^1$ is selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4"-terphenyl.

42. The method of claim 25, wherein said method further comprises attaching a counterelectrode to said polymer.

43. The method of claim 42, wherein said counterelectrode is attached directly to said polymer.

44. The method of claim 42, wherein said counterelectrode is attached to said polymer through a linker.

45. The method of claim 25, wherein said redox-active molecules further comprise redox-active molecules having only one available reactive group or site.

46. The method of claim 45, wherein said redox-active molecules having only one available reactive group or site comprise a second reactive group or site that is blocked.

* * * * *